US009997622B2

(12) United States Patent
Matsuura

(10) Patent No.: US 9,997,622 B2
(45) Date of Patent: *Jun. 12, 2018

(54) IE TYPE TRENCH GATE IGBT

(71) Applicant: RENESAS ELECTRONICS CORPORATION, Tokyo (JP)

(72) Inventor: Hitoshi Matsuura, Kawasaki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/429,286

(22) Filed: Feb. 10, 2017

(65) Prior Publication Data

US 2017/0154985 A1    Jun. 1, 2017

Related U.S. Application Data

(63) Continuation of application No. 14/705,035, filed on May 6, 2015, now Pat. No. 9,653,587, which is a (Continued)

(30) Foreign Application Priority Data

Jan. 5, 2012   (JP) .................... 2012-000577

(51) Int. Cl.
*H01L 29/66* (2006.01)
*H01L 29/739* (2006.01)
(Continued)

(52) U.S. Cl.
CPC ...... *H01L 29/7397* (2013.01); *H01L 29/0619* (2013.01); *H01L 29/0696* (2013.01); (Continued)

(58) Field of Classification Search
CPC .................................................. H01L 29/7397
(Continued)

(56) References Cited

U.S. PATENT DOCUMENTS 6,180,966 B1    1/2001   Kohno et al.
6,399,998 B1    6/2002   Chang
(Continued)

FOREIGN PATENT DOCUMENTS

EP    1 032 047 A2    8/2000
EP    1793423 A2      6/2007
(Continued)

OTHER PUBLICATIONS

Japanese Office Action received in corresponding Japanese Application No. 2016-140135 dated Mar. 16, 2017.
(Continued)

*Primary Examiner* — Igwe U Anya
(74) *Attorney, Agent, or Firm* — Mattingly & Malur, PC

(57) ABSTRACT

In a method of further enhancing the performance of a narrow active cell IE type trench gate IGBT having the width of active cells narrower than that of inactive cells, it is effective to shrink the cells so that the IE effects are enhanced. However, when the cells are shrunk simply, the switching speed is reduced due to increased gate capacitance. A cell formation area of the IE type trench gate IGBT is basically composed of first linear unit cell areas having linear active cell areas, second linear unit cell areas having linear hole collector areas and linear inactive cell areas disposed therebetween.

7 Claims, 38 Drawing Sheets

Related U.S. Application Data continuation of application No. 13/733,211, filed on Jan. 3, 2013, now Pat. No. 9,041,050.

(51) Int. Cl.
  *H01L 29/06* (2006.01)
  *H01L 29/40* (2006.01)
  *H01L 29/08* (2006.01)
  *H01L 29/10* (2006.01)
  *H01L 29/417* (2006.01)
  *H01L 29/423* (2006.01)

(52) U.S. Cl.
  CPC ...... *H01L 29/0804* (2013.01); *H01L 29/0821* (2013.01); *H01L 29/0865* (2013.01); *H01L 29/0882* (2013.01); *H01L 29/1095* (2013.01); *H01L 29/404* (2013.01); *H01L 29/407* (2013.01); *H01L 29/41708* (2013.01); *H01L 29/4236* (2013.01); *H01L 29/66348* (2013.01); *H01L 29/7395* (2013.01); *H01L 2924/0002* (2013.01)

(58) Field of Classification Search
  USPC .......................................................... 257/139
  See application file for complete search history.

(56) References Cited

U.S. PATENT DOCUMENTS

| | | | |
|---|---|---|---|
| 7,211,861 B2 | 5/2007 | Teramae et al. | |
| 8,633,510 B2 | 1/2014 | Matsuura et al. | |
| 9,041,050 B2* | 5/2015 | Matsuura | H01L 29/66348 257/139 |
| 2004/0084722 A1* | 5/2004 | Yamaguchi | H01L 29/0696 257/330 |
| 2005/0062105 A1 | 3/2005 | Nakamura et al. | |
| 2008/0283867 A1 | 11/2008 | Mori et al. | |
| 2009/0189181 A1 | 7/2009 | Koyama et al. | |
| 2009/0283797 A1 | 11/2009 | Takahashi et al. | |
| 2009/0315070 A1 | 12/2009 | Yoshikawa | |
| 2010/0156506 A1 | 6/2010 | Tsuzuki et al. | |
| 2011/0018029 A1 | 1/2011 | Pfirsch et al. | |
| 2011/0193132 A1* | 8/2011 | Kouno | H01L 29/0619 257/139 |
| 2012/0292662 A1* | 11/2012 | Matsuura | H01L 29/66348 257/139 |
| 2012/0313139 A1 | 12/2012 | Matsuura | |
| 2012/0326207 A1 | 12/2012 | Yoshimochi | |
| 2013/0037853 A1 | 2/2013 | Onozawa | |
| 2013/0256744 A1 | 10/2013 | Tang et al. | |
| 2013/0317158 A1 | 11/2013 | De Campo | |
| 2014/0159107 A1 | 6/2014 | Kurata | |

FOREIGN PATENT DOCUMENTS

| | | |
|---|---|---|
| JP | 10-326897 A | 12/1998 |
| JP | 11-345969 A | 12/1999 |
| JP | 2002-16252 A | 1/2002 |
| JP | 2004-153112 A | 5/2004 |
| JP | 2005-32941 A | 2/2005 |
| JP | 2005-294649 A | 10/2005 |
| JP | 2007-150121 A | 6/2007 |
| JP | 2007-194660 A | 8/2007 |
| JP | 2008-288386 A | 11/2008 |
| JP | 2011-82585 A | 4/2011 |
| WO | 02/061845 A1 | 8/2002 |

OTHER PUBLICATIONS

European Search Report received in European Application No. 13150257 dated Jun. 2, 2014.
Japanese Office Action received in corresponding Japanese Application No. 2012-000577 dated Sep. 10, 2015.
Japanese Office Action received in corresponding Japanese Application No. 2016-140135 dated Aug. 17, 2017.

* cited by examiner

US 9,997,622 B2

IE TYPE TRENCH GATE IGBT

INCORPORATION BY REFERENCE

The present application is a continuation application of U.S. application Ser. No. 14/705,035, filed May 6, 2015, which is a continuation application of U.S. application Ser. No. 13/733,211, filed Jan. 3, 2013, now U.S. Pat. No. 9,041,950 and claims priority from Japanese application JP2012-000577 filed on Jan. 5, 2012, the contents of which are hereby incorporated by reference into this application.

BACKGROUND OF THE INVENTION

The present invention relates to the technique effective in application to the device structure technique in a power semiconductor device (or semiconductor integrated circuit device) such as an IE (Injection Enhancement) type trench gate IGBT (Insulated Gate Bipolar Transistor) having an active cell and an inactive cell coexisting in the direction orthogonal to a trench gate.

JP-A-11-345969 discloses the technique that active cell areas and dummy cell areas are alternately disposed even in the direction of the trench gate in the IE type trench gate IGBT.

JP-A-10-326897 or U.S. Pat. No. 6,180,966 corresponding thereto discloses the technique that the surface directions of trench side walls of main cells and current detection cells are made identical to thereby make the characteristics of both cells identical in the trench gate IGBT.

JP-A-2007-194660 discloses the technique that the ratio of widths of active cells and floating cells in a main area and a current detection area is adjusted to thereby make the saturation current characteristics in both areas identical in the IE type trench gate IGBT.

SUMMARY OF THE INVENTION

As a method of further enhancing the performance of a narrow active cell IE type trench gate IGBT having the width of active cells narrower than that of inactive cells, it is effective to shrink the cells so that IE effects are enhanced. However, when the cells are shrunk simply, the switching speed is reduced due to increased gate capacity.

The present invention has been made in order to solve the above problem.

It is an object of the present invention to provide a power semiconductor device.

The above and other objects and novel features of the present invention will be apparent from the following description of the specification taken in connection with the accompanying drawings.

An outline of representative aspects of the present invention disclosed in the specification is described briefly as follows.

That is, according to an aspect of the present invention, a cell formation area of the IE type trench gate IGBT is basically composed of first linear unit cell areas having linear active cell areas, second linear unit cell areas having linear hole collector areas and linear inactive cell areas disposed between the first and second linear unit cell areas.

The effects attained by the representative aspect of the present invention disclosed in the specification are described briefly as follows.

That is, since the cell formation area of the IE type trench gate IGBT is basically composed of the first linear unit cell areas having the linear active cell areas, the second linear unit cell areas having the linear hole collector areas and the linear inactive cell areas disposed between the first and second linear unit cell areas, reduction of the switching speed caused by IE effects can be prevented.

Other objects, features and advantages of the invention will become apparent from the following description of the embodiments of the invention taken in conjunction with the accompanying drawings.

DESCRIPTION OF THE EMBODIMENTS

Figure 1:
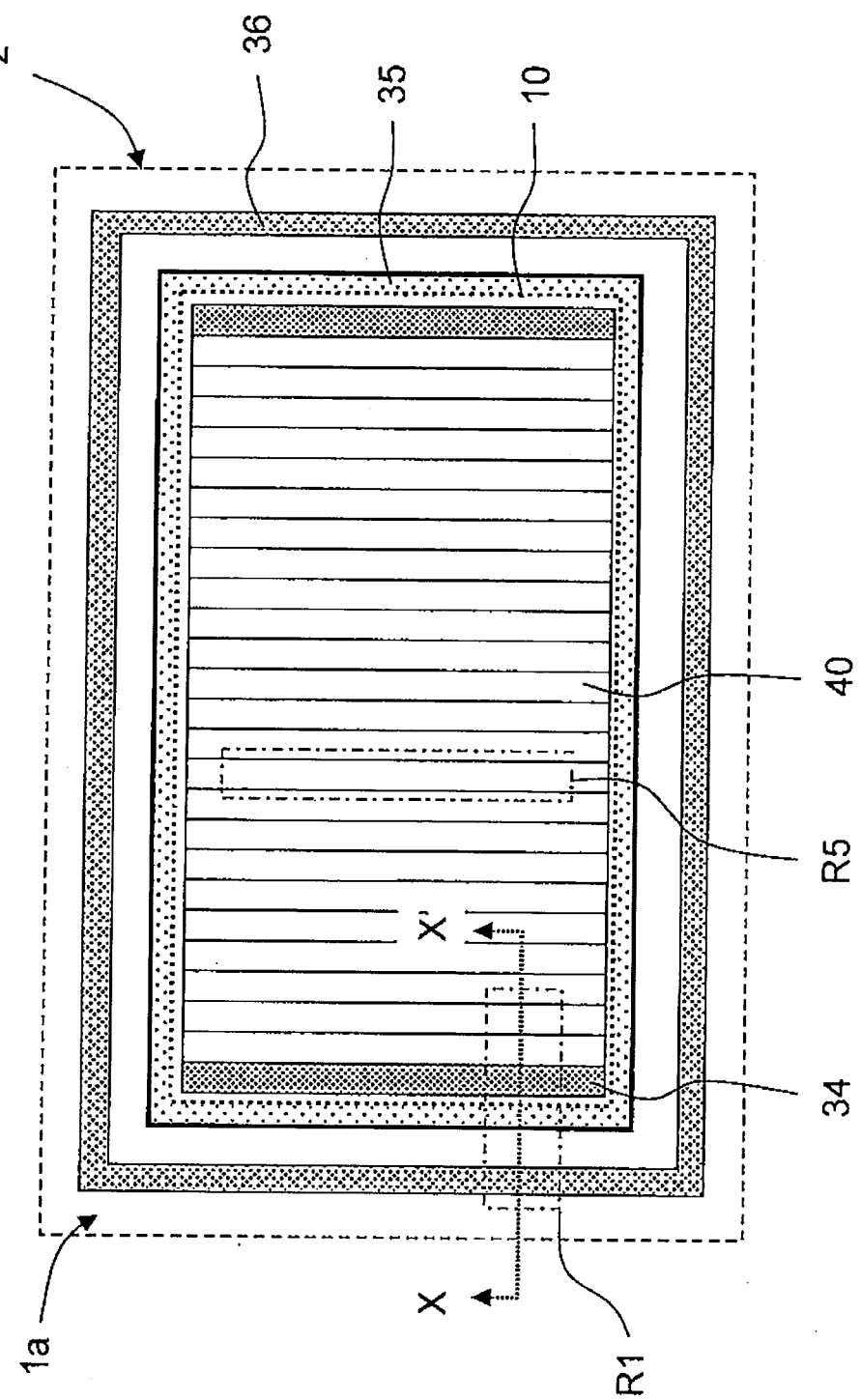
FIG. 1 is a top view schematically illustrating a layout of cell areas and the periphery thereof of an IE type trench gate IGBT device chip for the purpose of description of an outline according to an embodiment of the present invention.

[Outline of Embodiments]
First of all, an outline of representative embodiments of the present invention disclosed in the specification is described.
1. An IE type trench gate IGBT comprises: (a) a semiconductor substrate having first and second main surfaces; (b) a drift area disposed in the semiconductor substrate and having a first conductive type; (c) a cell formation area disposed on the first main surface; (d) a lot of linear unit cell areas disposed in the cell formation area and each having first and second linear unit cell areas; (e) a metal gate electrode disposed on the first main surface; and (f) a metal emitter electrode disposed on the first main surface; and the first linear unit cell areas each include; (x1) a linear active cell area disposed from the first main surface over an inner part of the drift area; (x2) first and second linear trench gate electrodes connected electrically to the metal gate electrode and disposed in first and second trenches in the first main surface, respectively, so as to hold the linear active cell area between the first and second linear trench gate electrodes from both sides; (x3) a body area disposed in a surface area on the side of the first main surface of the drift area and having a second conductive type opposite to the first conductive type; (x4) linear inactive cell areas disposed adjacently to both sides of the linear active cell area so as to hold the linear active cell area between the linear inactive cell areas from both sides while defining the first and second linear trench gate electrodes as boundaries; (x5) a floating area disposed in substantially all surface area on the side of the first main surface in the linear inactive cell area deeper than the body area and having the same conductive type as that of the body area; and (x6) an emitter area of the first conductive type disposed in the surface area on the side of the first main surface of the body area; the second linear unit cell areas each including (y1) a linear hole collector cell area disposed from the first main surface over the inner part of the drift area; (y2) third and fourth linear trench gate electrodes connected electrically to the metal emitter electrode and disposed in third and fourth trenches in the first main surface, respectively, so as to hold the linear hole collector cell area between the third and fourth linear trench gate electrodes from both sides; (y3) the body area disposed in the surface area on the side of the first main surface of the drift area; (y4) the linear inactive cell areas disposed adjacently to both sides of the linear hole collector cell area so as to hold the linear hole collector cell area between the third and fourth linear trench gate electrodes from both sides while defining the third and fourth linear trench gate electrodes as boundaries; and (y5) the floating area disposed in substantially all surface area on the side of the first main surface in the linear inactive cell area deeper than the body area and having the same conductive type as that of the body area.
2. In a fabrication method of the semiconductor device described in the item 1, the width of the linear active cell area is narrower than that of the linear inactive cell area.
3. In the fabrication method of the semiconductor device described in the item 1 or 2, the depth of the floating area is deeper than a lower end of the first and second trenches.
4. In the fabrication method of the semiconductor device described in any one of the items 1 to 3, the emitter area is not disposed in the linear hole collector cell area.
5. In the fabrication method of the semiconductor device described in any one of the items 1 to 4, the width of the linear active cell area is substantially equal to that of the linear hole collector cell area.
6. In the fabrication method of the semiconductor device described in any one of the items 1 to 5, the linear active cell area includes (x1a) active sections divided in its longitudinal direction and (x1b) inactive sections having no emitter area divided in its longitudinal direction.
7. In the fabrication method of the semiconductor device described in any one of the items 1 to 6, emitter connection parts of the third and fourth linear trench gate electrodes are substantially intersected with contact grooves being in contact with the emitter connection parts at right angles.
8. In the fabrication method of the semiconductor device described in any one of the items 1 to 6, the contact grooves being in contact with the emitter connection parts of the third and fourth linear trench gate electrodes are contained in the emitter connection parts in a plane.
9. In the fabrication method of the semiconductor device described in any one of the items 1 to 4 and 6 to 8, the width of the linear active cell area is narrower than that of the linear hole collector cell area.
10. In the fabrication method of the semiconductor device described in any one of the items 1 to 9, the first linear unit cell areas each further include (x7) a first hole barrier area disposed in the drift area under the body area in the linear active cell area and having the first conductive type having the impurity concentration higher than that of the drift area and lower than that of the emitter area and the second linear unit cell areas each further include (y6) a second hole barrier area disposed in the drift area under the body area in the linear hole collector cell area and having the first conductive type having the impurity concentration higher than that of the drift area and lower than that of the emitter area.
11. An IE type trench gate IGBT comprises: (a) a semiconductor substrate having first and second main surfaces; (b) a drift area disposed in the semiconductor substrate and having a first conductive type; (c) a cell formation area disposed on the first main surface; (d) a lot of linear unit cell areas disposed in the cell formation area; (e) a metal gate electrode disposed on the first main surface; and (f) a metal emitter electrode disposed on the first main surface; and the linear unit cell areas each include: (d1) a linear hybrid cell area disposed from the first main surface over an inner part of the drift area; (d2) first and second linear trench gate electrodes connected electrically to the metal emitter electrode and disposed in first and second trenches in the first main surface, respectively, so as to hold the linear hybrid cell area between the first and second linear trench gate electrodes from both sides; (d3) a body area disposed in the surface area on the side of the first main surface of the drift area and having a second conductive type opposite to the first conductive type; (d4) linear inactive cell areas disposed adjacently to both sides of the linear active cell area so as to hold the linear active cell area between the first and second linear trench gate electrodes from both sides while defining the first and second linear trench gate electrodes as boundaries; (d5) a floating area disposed in substantially all surface area on the side of the first main surface in the linear inactive cell area deeper than the body area and having the same conductive type as that of the body area; (d6) first and second linear hybrid sub-cell areas disposed in the linear hybrid cell area and being substantially symmetrical with each other; (d7) a third linear trench gate electrode connected electrically to the metal gate electrode and disposed in a third trench forming a boundary between the first and second linear hybrid sub-cell areas; and (d8) an emitter area of the first conductive type disposed in the surface area on the side of the first main surface of the body area so as to approach the third trench in both of the first and second linear hybrid sub-sell areas.
12. In a fabrication method of the semiconductor described in the item 11, the width of the linear inactive cell area is wider than that of the first and second linear hybrid sub-cell areas.
13. In the fabrication method of the semiconductor device described in the item 11 or 12, the depth of the floating area is deeper than a lower end of the first and second trenches.
14. In the fabrication method of the semiconductor device described in any one of the items 11 to 13, the emitter area is not disposed on the side near to the first and second trenches in the first and second linear hybrid sub-cell areas.
15. In the fabrication method of the semiconductor device described in any one of the items 11 to 14, the widths of the first and second linear hybrid sub-cell areas are substantially equal to each other.
16. In the fabrication method of the semiconductor device described in any one of the items 11 to 15, the first and second linear hybrid sub-cell areas include (d1a) active sections divided in its longitudinal direction and (d1b) inactive sections having no emitter area divided in its longitudinal direction.

17. In the fabrication method of the semiconductor device described in any one of the items 11 to 16, the contact grooves being in contact with the emitter connection parts of the first and second linear trench gate electrodes are contained in the emitter connection parts in a plane.

18. In the fabrication method of the semiconductor device described in any one of the items 11 to 16, the first and second linear trench gate electrodes each include (d2a) a hole barrier area disposed in the drift area under the body area and having the first conductive type of the impurity concentration higher than that of the drift area and lower than that of the emitter area.

19. An IE type trench gate IGBT comprises: (a) a semiconductor substrate having first and second main surfaces; (b) a drift area disposed in the semiconductor substrate and having a first conductive type; (c) a cell formation area disposed on the first main surface; (d) a lot of linear unit cell areas disposed in the cell formation area and each having first and second linear unit cell areas; (e) a metal gate electrode disposed on the first main surface; and (f) a metal emitter electrode disposed on the first main surface; and the first linear unit cell areas each include; (x1) a linear active cell area disposed from the first main surface over an inner part of the drift area; (x2) first and second linear trench gate electrodes connected electrically to the metal gate electrode and disposed in first and second trenches in the first main surface, respectively, so as to hold the linear active cell area between the first and second linear trench gate electrodes from both sides; (x3) a body area disposed in a surface area on the side of the first main surface of the drift area and having a second conductive type opposite to the first conductive type; (x4) linear inactive cell areas disposed adjacently to both sides of the linear active cell area so as to hold the linear active cell area between the linear inactive cell areas from both sides while defining the first and second linear trench gate electrodes as boundaries; (x5) a floating area disposed in substantially all surface area on the side of the first main surface in the linear inactive cell area deeper than the body area and having the same conductive type as that of the body area; (x6) an emitter area of the first conductive type disposed in the surface area on the side of the first main surface of the body area; (x7) an end trench disposed in the surface area on the side of the first main surface along an end of the linear inactive cell area; (x8) a gate wiring disposed in an outer peripheral part of the cell formation area along the end trench; and (x9) a second conductive type area extending from the surface area on the side of the first main surface under the gate wiring until the vicinity of the end trench and disposed deeper than the body area, the second conductive type area being electrically connected to the metal emitter electrode.

20. In a fabrication method of the semiconductor device described in the item 19, the second conductive type area is formed at the substantially same time as the floating area.

21. In the fabrication method of the semiconductor device described in the item 19 or 20, the second conductive type area is disposed deeper than the end trench.

[Explanation of Description Format, Fundamental Terms and Usage in Specification]

1. In the specification, an embodiment is sometimes described while dividing it into plural sections for convenience if necessary, although excepting where otherwise specified particularly, these are not mutually independent and individual and are parts of a single example such that one is partially detailed description of the other or modifications of part or the whole. Further, in principle, repeated description of the same part is omitted. Constituent elements in the embodiment are not essential excepting where otherwise specified particularly, the number of elements are limited theoretically and it is clearly wrong from the context.

Furthermore, in the specification, the term of "semiconductor device" means a transistor itself (active element) of every kind or semiconductor chip or the like (e.g. monocrystalline silicon substrate) on which resisters, condensers and the like are integrated around the transistor. As a representative of the transistor of every kind, MISFET (Metal Insulator Semiconductor Field Effect Transistor) represented by MOSFET (Metal Oxide Semiconductor Field Effect Transistor) can be exemplified. At this time, as a representative of the transistor of every kind, power MOSFET and IGBT (Insulated Gate Bipolar Transistor) can be exemplified. These are generally classified as power semiconductor device and the device contains bipolar power transistor, thyristor and power diode in addition to the power MOSFET and IGBT.

As a representative aspect of the power MOSFET, there is a double diffused vertical power MOSFET having a source electrode disposed on the surface and a drain electrode disposed on the back surface, although the double diffused vertical power MOSFET can be mainly classified into two kinds and the first is a planar gate type described mainly in embodiments and the second is trench gate type such as U-MOSFET.

The power MOSFET contains LD-MOSFET (Lateral-Diffused MOSFET's) in addition.

2. Similarly, in the description of embodiments, even if "X made of A" is described for material, composition and the like, it is not excluded that an element except A is one of main constituent elements excepting where otherwise specified particularly and it is wrong clearly from the context. For example, it means that "X contains A as a main component", for example. Even if "silicon material" or the like is described, for example, it is needless to say that it is not limited to pure silicon and it contains SiGe alloy, multi-alloy containing another silicon as a main component and material containing other additives or the like. Similarly, even if "silicon oxide layer", "silicon oxide insulation layer" or the like is described, it is needless to say that it contains not only relatively pure undoped silicon dioxide but also FSG (Fluorosilicate Glass), TEOS-based silicon oxide, SiOC (Silicon Oxicarbide) or carbon-doped silicon oxide or OSG (Organosilicate Glass), PSG (Phosphorus Silicate Glass), thermal oxide layer such as BPSG (Borophosphosilicate Glass), CVD oxide layer, SOG (Spin On Glass), coated silicon oxide such as nano-clustering silica (NCS), silica-system low-k insulation layer (porous-system insulation layer) made of material similar to the above materials in which holes are introduced, compound layer with another silicon insulation layer having the above material as main constituent element and the like.

Further, as silicon insulation layer used commonly in the semiconductor field in parallel with the silicon oxide insulation layer, there is a silicon nitride insulation layer. As material belonging to this system, there are SiN, SiCN, SiNH, SiCNH and the like. Here, the term of "silicon nitride" contains both of SiN and SiNH excepting where otherwise specified particularly. Similarly, the term of "SiCN" contains both of SiCN and SiCNH excepting where otherwise specified particularly.

3. Similarly, drawings, positions, attributes and the like are also exemplified suitably, although excepting where otherwise specified particularly and it is wrong clearly from the context, it is needless to say that the invention is not limited thereto strictly.

4. Moreover, even when specific numerical value or quantity is described, a numerical value or quantity larger than or smaller than the specific numerical value or quantity may be used excepting where otherwise specified particularly, the numerical value or quantity is limited to the specific numerical value or quantity theoretically and it is clearly wrong from the context.

5. The term of "wafer" usually means a monocrystalline silicon wafer on which a semiconductor device (semiconductor integrated circuit device and electronic device are also similar) is formed, although it is needless to say that it contains an epitaxial wafer, a compound wafer of insulation substrate such as SOI substrate and LCD glass substrate with semiconductor layer or the like.

6. Similarly to the above description about the power MOSFET, the IGBT is broadly divided into planar gate type and trench gate type generally. The trench gate type IGBT has a relatively low on-resistance, although in order to further promote conductivity modulation to reduce the on-resistance, "IE type trench gate IGBT" (or "active cell thinning-out type trench gate IGBT") utilizing IE (Injection Enhancement) effect has been developed. The IE type trench gate IGBT is structured so that holes are apt to be stored in the main surface side (emitter side) of device of the semiconductor substrate by disposing active cells connected to an emitter electrode actually and inactive cells having floating P-body area alternately or in the shape of comb.

In the specification, there are plural kinds of active cells. The first is an intrinsic active cell (concretely linear active cell area) having an $N^+$-emitter area actually and a trench gate electrode connected electrically to a metal gate electrode. The second is a pseudo-active cell (concretely linear hole collector cell area) having no $N^+$-emitter area and a trench gate electrode connected electrically to a metal emitter electrode. The third is a hybrid cell (concretely linear hybrid cell area) having an intrinsic active cell and a pseudo-active cell combined with each other.

7. In the specification, the IE type trench gate IGBT having the width of primary active cells narrower than that of primary inactive cells is named "narrow active cell IE type trench gate IGBT".

Further, the direction of crossing the trench gate is defined as "width direction of cell" and the direction (longitudinal direction) of extending the trench gate (linear gate part) orthogonally to the width direction of cell is defined as "longitudinal direction of cell".

In the specification, the "linear unit cell areas" (composed of the linear active cell areas and the linear inactive cell areas, for example) are mainly treated, although the linear unit cell areas are repeatedly arranged periodically in the inner area of the semiconductor chip to structure the "cell formation area".

A cell peripheral junction area is usually disposed around the cell area and further a floating field ring or field limiting ring is disposed around the cell peripheral junction area to thereby form an end structure. The floating field ring or field limiting ring means an impurity area or impurity area group disposed on the surface of the drift area (surface of device) separately from the P-type body area (P-type well area) and having the same conductivity type as the drift area and similar concentration (that is the concentration to the degree that complete depletion does not occur when a reverse-direction voltage is applied to the main junction), the impurity area or impurity area group surrounding the cell area in a single or multiplex manner in a ring shape.

Furthermore, field plates are sometimes disposed in the floating field rings. The field plates are conductor layer pattern connected to the floating field ring and means part which extends above the surface of the drift area (surface of device) through an insulation layer and surrounds the cell area in a ring shape.

Figure 5:
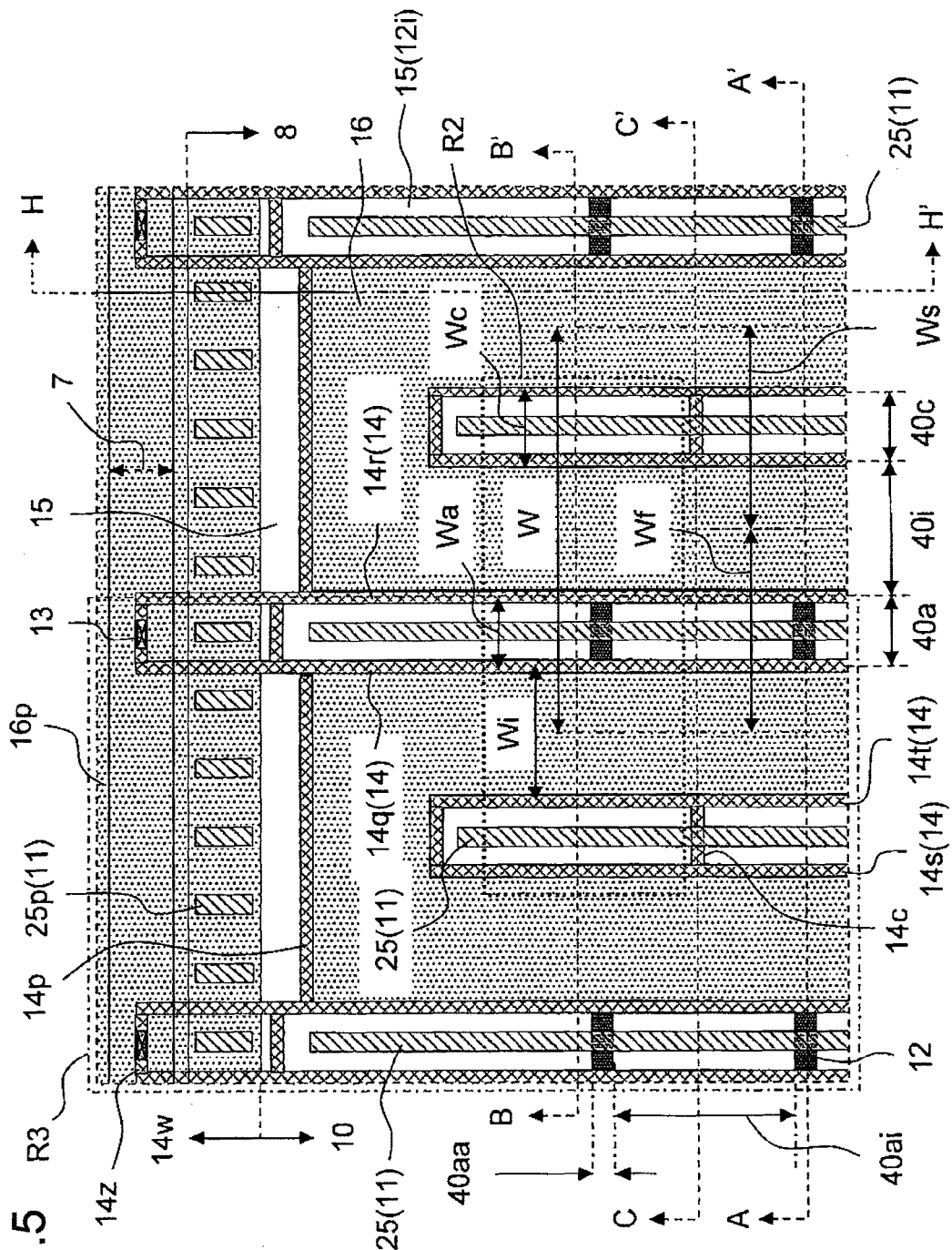
FIG. 5 is an enlarged plan view illustrating a cell area upper-end cut-out area R4 shown in FIG. 4.

With regard to the linear unit cell areas as a peripheral element forming the cell area, it is reasonable that the linear inactive cell areas of a half width arranged on both sides of the linear active cell areas provided in the center are treated as a set in an example or the like of FIG. 5, although when the linear inactive cell areas are described individually concretely, it is inconvenient since the linear inactive cell areas are separated on both sides and accordingly in this case a concretely integrated part is described as the linear inactive cell area.

[Detailed Description Of Embodiments]

Embodiments are described in more detail. In the drawings, the same or similar parts are designated by the same or similar marks or reference numerals and description thereof is not repeated in principle.

Further, in the accompanying drawings, when it is conversely complicated to make hatching or when difference from space is clear, hatching is sometimes omitted even if part to be hatched is a section. In connection with this, when it is apparent from description, an outline of a background is sometimes omitted even if part to be outlined is a hole closed in a plane. Furthermore, even when part is not a section, the part is sometimes hatched in order to clearly express that the part is not space.

As a prior-art patent application that discloses the IE type trench gate IGBT, there is JP-A-2011-109341 (filed in May 16, 2011 in Japan), for example.

1. Description of Outline of Primary Embodiment of the Invention (FIGS. 1 to 3 mainly):

In this section, a concrete example is described to complement the above definition and the like and an outline of a representative concrete example of the invention is described as well as the whole preliminary description is made.

In the embodiment, an asymmetric device is concretely described by way of example, although it is needless of say that the description can be applied even to a symmetric device substantially as it is.

Figure 2:
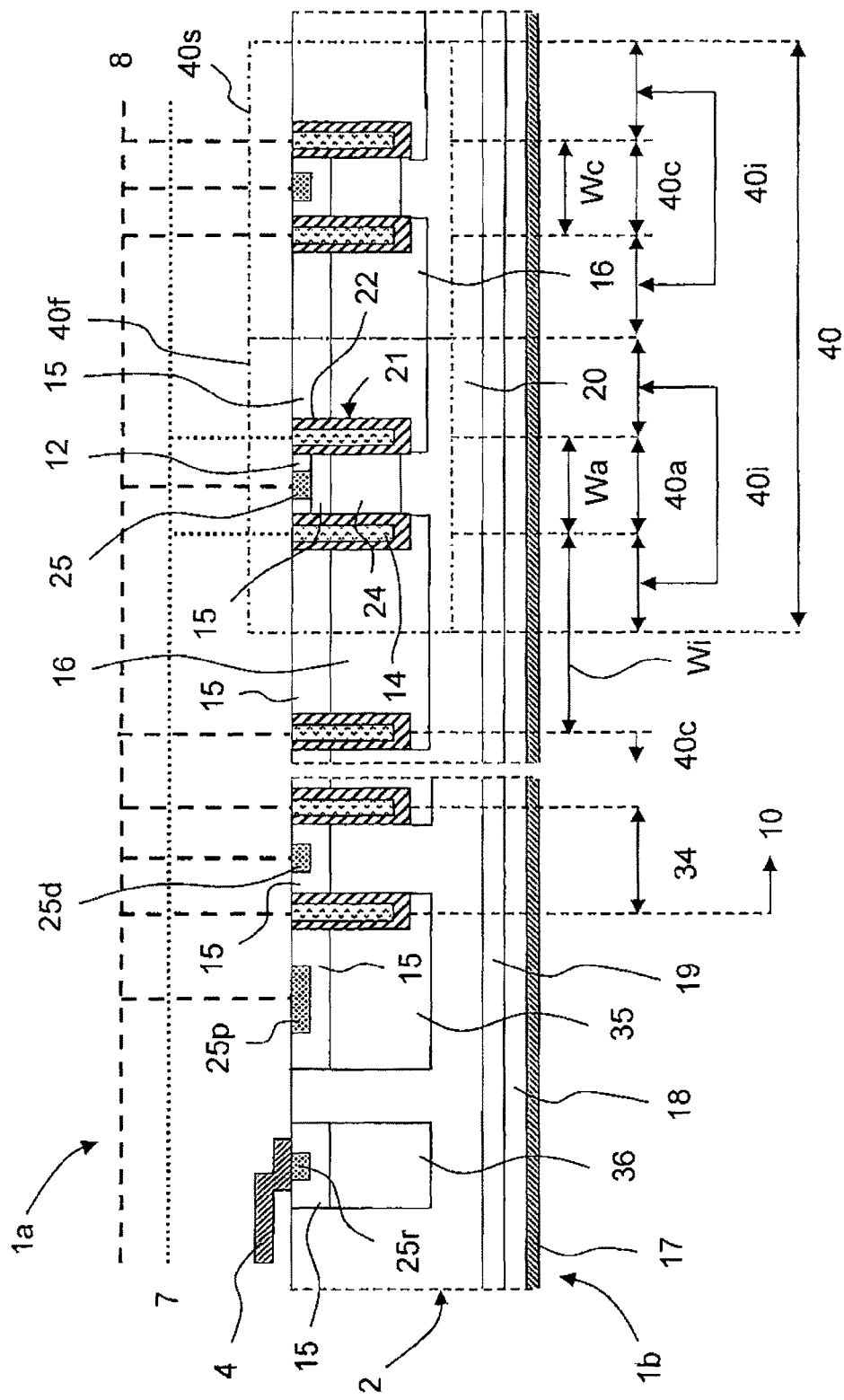
FIG. 2 is a sectional view of a device taken along line X-X' in a cell area end cut-out area R1 of FIG. 1.
Figure 3:
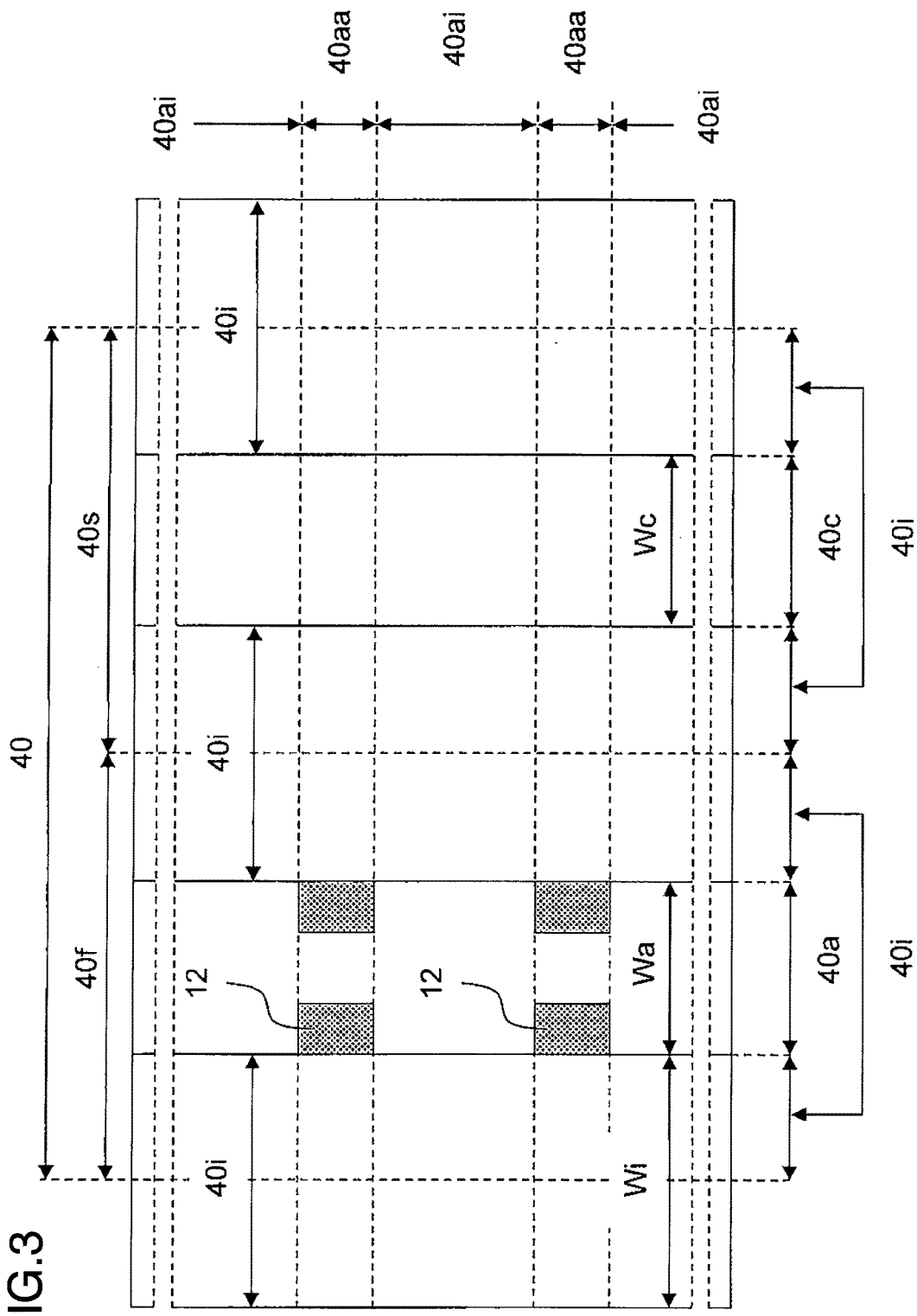
FIG. 3 is an enlarged top view illustrating a linear unit cell area and its periphery R5 shown in FIG. 1 according to the embodiment of the present invention.

FIG. 1 is a top view schematically illustrating a layout of cell areas and the periphery thereof of an IE type trench gate IGBT device chip for the purpose of description of an outline of an embodiment according to the present invention. FIG. 2 is a sectional view of a device part taken along line X-X' in a cell area end cut-out area R1 of FIG. 1. FIG. 3 is an enlarged top view illustrating a linear unit cell area and its periphery R5 shown in FIG. 1 according to the embodiment of the present invention. An outline of the primary embodiment of the present invention is described with reference to these drawings.

(1) Description of Planar Structure of Cell Area and its Periphery (FIG. 1 mainly):

First of all, the top view of an inner area of a device chip 2 (an inside part such as guard ring and the like which are an outermost part of an end structure, that is, a primary part of the chip 2) of an IE type trench gate IGBT which is a main object of the present invention is shown in FIG. 1. As shown in FIG. 1, the primary part of the inner area of the chip 2 (semiconductor substrate) is occupied by a cell formation area 10. A P-type cell peripheral junction area 35 in the shape of a ring is disposed at an outer peripheral part of the cell formation area 10 so as to surround the cell formation area 10. A single or plural ring-shaped P-type floating field rings 36 (that is, field limiting rings) are disposed outside of the cell peripheral junction area 35 with space therebetween and form an end structure to the cell formation area 10 together with the cell peripheral junction area 35, field plates 4 (refer to FIG. 4), a guard ring 3 (refer to FIG. 4) and the like.

A lot of linear unit cell areas 40 are disposed in the cell formation area 10 in this example and one or more pairs (one or plural lines for one side) of dummy cell areas 34 (linear dummy cell areas) are disposed in these end areas.

(2) Description of Narrow Active Cell Type Unit Cell and Alternate Arrangement Method (FIG. 2 mainly)

Next, a section taken along line X-X' of a cell area end cut-out area R1 of FIG. 1 is shown in FIG. 2. As shown in FIG. 2, $P^+$-type collector area 18 is disposed in a semiconductor area (in this example, silicon monocrystalline area) on the back surface 1b of the chip 2 (main back surface or second main surface of the semiconductor substrate) and a metal collector electrode 17 is disposed on the surface thereof. An N-type field stop area 19 is disposed between an $N^-$-type drift area 20 (drift area of first conductive type) forming the primary part of the semiconductor substrate 2 and the $P^+$-type collector area 18.

On the other hand, a lot of trenches 21 are disposed in the semiconductor area on the surface side 1a (main surface on the obverse side or first main surface of semiconductor substrate) of the $N^-$-type drift area 20 and trench gate electrodes 14 are embedded in the trenches 21 through gate insulation layers 22. The trench gate electrodes 14 are connected to a metal gate electrode 5 (concretely metal gate wiring 7) or an emitter electrode 8 in accordance with the function thereof.

Further, the trenches 21 have the function of sectioning the area, so that, for example, the dummy cell areas 34 are sectioned by the pairs of trenches 21 from both sides and the cell formation area 10 and the cell peripheral junction area 35 are sectioned by one of the trenches 21. The cell peripheral junction area 35 is connected to the metal emitter electrode 8 through a $P^+$-type body contact area 25p. Further, in the embodiment, unless otherwise specified particularly, it is supposed that the thickness of the gate insulation layers 22 at any place of the trenches is the substantially same (however, it is not excluded that the thickness of a certain part thereof is different from other part if necessary). In this manner, emitter contact is made in the cell peripheral junction area 35 and the dummy cell areas 34, so that a resistible voltage or allowable maximum voltage can be prevented from being reduced even if the width of the dummy cell areas 34 and the like is changed in a processing manner.

The P-type floating field ring 36 is disposed in the semiconductor area on the side of the surface 1a of the $N^-$-type drift area 20 on the outer side of the cell peripheral junction area 35 and the field plates 4 are disposed on the surface 1a and connected to the floating field ring 36 through a $P^+$-type body contact area 25r.

Next, the cell formation area 10 is further described. The dummy cell area 34 has the same structure and dimensions as a linear active cell area 40a basically except that an $N^+$-type emitter area 12 is not provided and a $P^+$-type body contact area 25d disposed in the surface of a P-type body area 15 is connected to the metal emitter electrode 8.

Most of the inner area of the cell formation area 10 has the repetition structure having the linear unit cell areas 40 disposed in translational symmetry as unit lattices or unit cells (symmetry is not required in the strict sense of the word. The same description is applied below). The linear unit cell areas 40 as unit cells each include linear inactive cell areas 40i, linear active cell area 40a disposed on one side, linear hole collector cell area 40c disposed on the other side and linear inactive cell areas 40i of half width disposed on both sides. However, concretely, it can be seen that the linear active cell areas 40a and the linear hole collector cell areas 40c are disposed alternately between the linear inactive cell areas 40i of the full width (refer to FIG. 6). Furthermore, it can be also seen that first linear unit cell areas 40f and second linear unit cell areas 40s are arranged alternately.

The P-type body areas 15 (body areas of second conductivity type) are disposed in the surface area of the semiconductor on the side of the main surface 1a (first main surface) of the semiconductor substrate of the linear active cell area 40a and the $N^+$-type emitter area 12 (emitter area of first conductive type) and the $P^+$-type body contact areas 25 are disposed in the surface thereof. The $P^+$-type body contact areas 25 are connected to the metal emitter electrode 8. In the linear active cell area 40a, N-type hole barrier area 24 is disposed in the $N^-$-type drift area 20 under the P-type body area 15. The trench gate electrodes 14 on both sides of the linear active cell area 40a are electrically connected to the metal gate electrode 5.

In contrast, the structure of the linear hole contact cell area 40c is the same as that of the linear active cell area 40a containing the dimension and the like except that the $N^+$-type emitter area 12 is not provided and the trench gate electrodes 14 disposed on both sides are connected to the emitter electrode 8.

On the other hand, the P-type body areas 15 are disposed in the surface area of the semiconductor on the side of the main surface 1a (first main surface) of the semiconductor substrate of the linear inactive cell area 40i similarly and P-type floating areas 16 (floating areas of second conductive type) are disposed in the $N^-$-type drift area 20 under the P-type body areas 15 so as to cover the lower ends of the trenches 21 disposed on both sides by disposing the P-type floating areas 16 deeper than the lower ends of the trenches 21. The provision of such P-type floating areas 16 can expand the width Wi of the linear inactive cell area without sudden reduction of the resistible voltage or allowable maximum voltage. Consequently, the hole storage effect can be enhanced effectively. In the IE type trench gate IGBT, any contact from the emitter electrode 8 to the P-type floating areas 16 is not formed and a direct hole exclusion route from the P-type floating areas 16 to the emitter electrode 8 is cut off to thereby increase the hole concentration in the $N^-$-type drift area 20 (N-type base area) under the linear active cell area 40a, so that the concentration of electrons injected from MOSFET in the IGBT to N-type base area is improved to reduce the on-resistance.

In this example, the width Wa of the linear active cell area 40a and the width Wc of the linear hole collector cell area 40c are narrower than the width Wi of the linear inactive cell area 40i and this is named a "narrow active cell type unit cell" in the specification. The following description is mainly made to the device having the narrow active cell type unit cell concretely, although the present invention is not limited thereto and it is needless to say that the present invention can be applied even to the device having a "non-narrow active cell type unit cell".

In the example of FIG. 2, the linear active cell areas 40a (or linear hole collector cell areas 40c) and the linear inactive cell areas 40i are alternately arranged to form the linear unit cell areas 40 and this structure is named an "alternate arrangement method" in the specification. In the following description, unless otherwise specified particularly, the present invention is described while the alternate arrangement method is set forth as a premise, although it is needless to say that a "non-alternate arrangement method" may be used.

Figure 6:
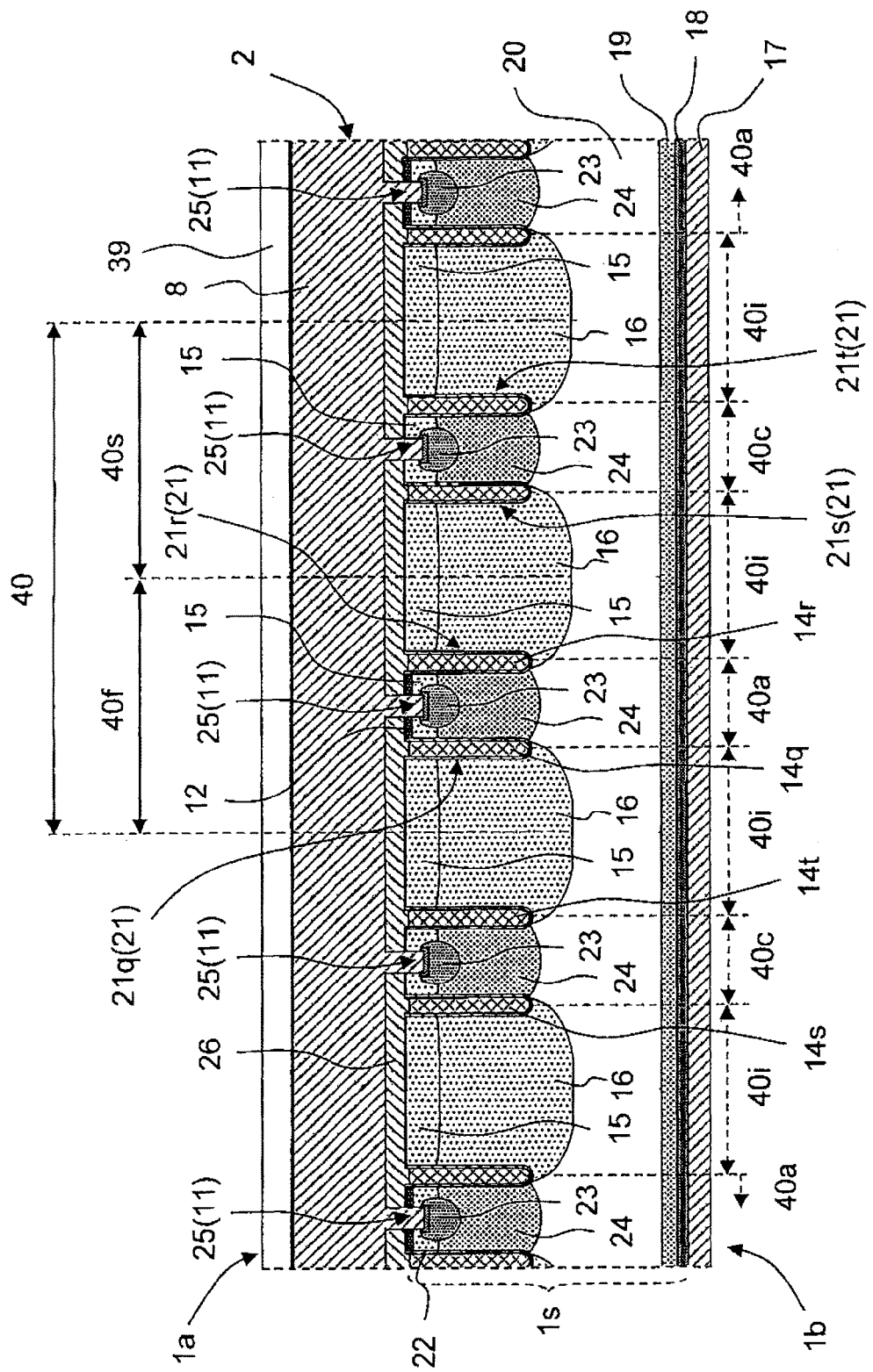
FIG. 6 is a sectional view of the device taken along line A-A' in FIG. 5.

In FIG. 2, the outlines (primary part and peripheral part) of the embodiment in FIGS. 6 and the like of the present invention have been described, although the following description is made while dividing them into constituent elements such as cell parts (section and planar structure) and cell peripheral parts. However, it is needless to say that the following description outlines even various modification examples.

(3) Description of Active Cell Two-Dimensional Thinning-Out Structure (FIG. 3 mainly):

FIG. 5 illustrates an example of detailed planar structure of the primary part of the linear unit cell areas and the peripheral thinning-out area R5 thereof of FIG. 1. As shown in FIG. 5, active sections 40aa having fixed length are disposed at regular intervals in the longitudinal direction of the linear active cell areas 40a, for example, and inactive sections 40ai in which the $N^+$-type emitter areas 12 are not provided are formed between the active sections 40aa. That is, parts of the linear active cell area 40a in the longitudinal direction thereof form the active sections 40aa locally and dispersedly. Distribution made at regular intervals with the fixed length means periodical distribution, although substantially periodical distribution corresponds to locally dispersed distribution but the locally dispersed distribution means distribution wider than it and does not necessarily mean periodical or quasi-periodical distribution.

As described above, it is effective to limit the part that is operated as FET actually in the longitudinal direction of cell when the saturation characteristic is controlled. However, this is not essential as described in section 8.

2. Description of Device Structure of IE type Trench Gate IGBT in Embodiment of the Invention (FIGS. 4 to 8 mainly):

In this section, an example (corresponding to FIGS. 1 to 3 of section 1) of the concrete layout of the top surface of the chip and the unit cell structure (active cell two-dimensional thinning-out structure having hole collector cell) according to the embodiment is described in consideration of description of the section 1. The cell structure described in this section is the narrow active cell type unit cell of the alternate arrangement method.

Usually, when the IGBT device 2 having the resistible voltage or allowable maximum voltage of 600 volts is taken as an example, an average chip size is 3 to 6 millimeters square. Here, for convenience of description, description is made by taking a chip 4 millimeters long and 5.2 millimeters broad as an example. In this example, the resistible voltage or allowable maximum voltage of device is described to be about 600 volts, for example.

Figure 4:
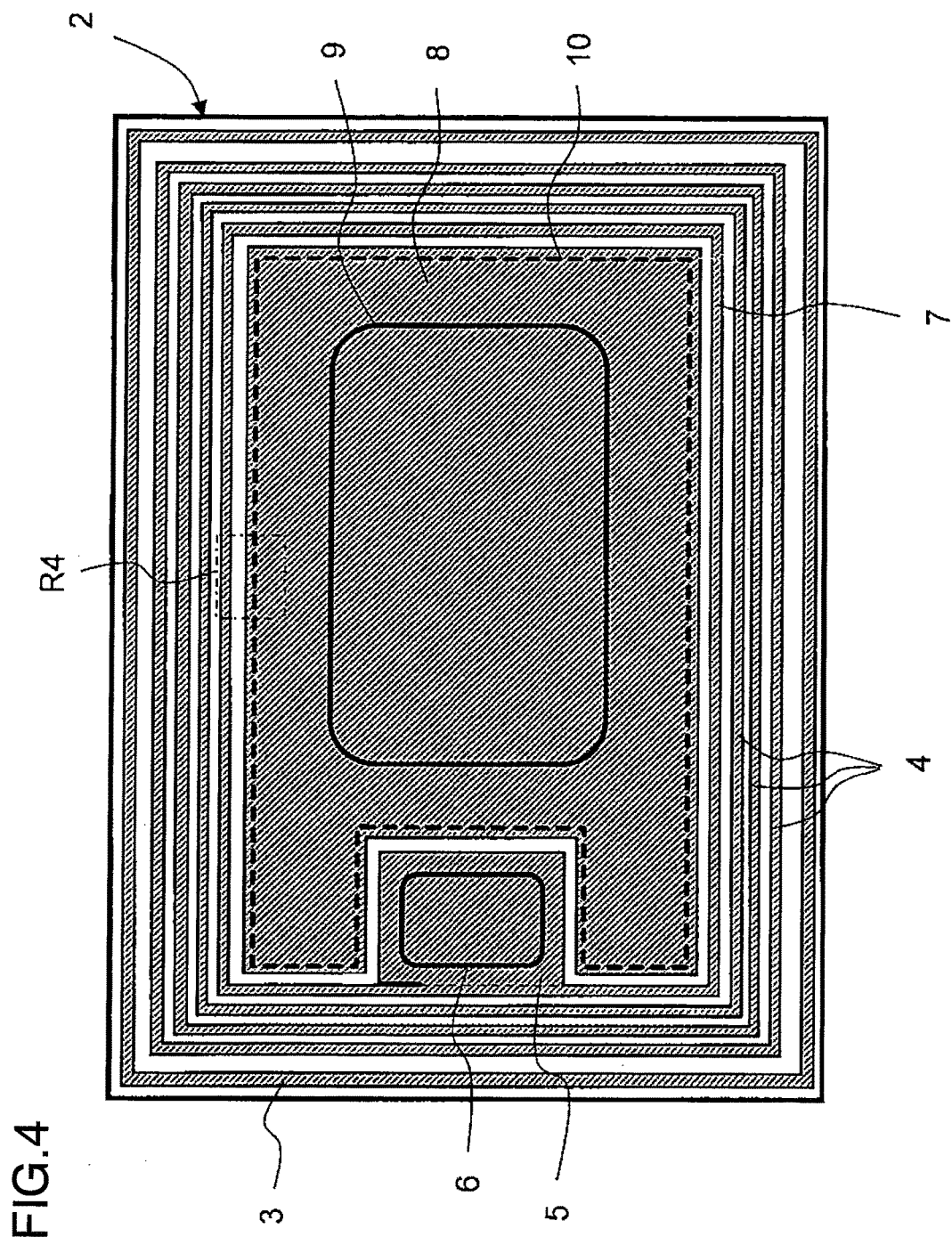
FIG. 4 is a top view illustrating the whole of the IE type trench gate IGBT device chip according to the embodiment of the present invention (corresponding substantially to FIG. 1 but nearer to more concrete shape)
Figure 7:
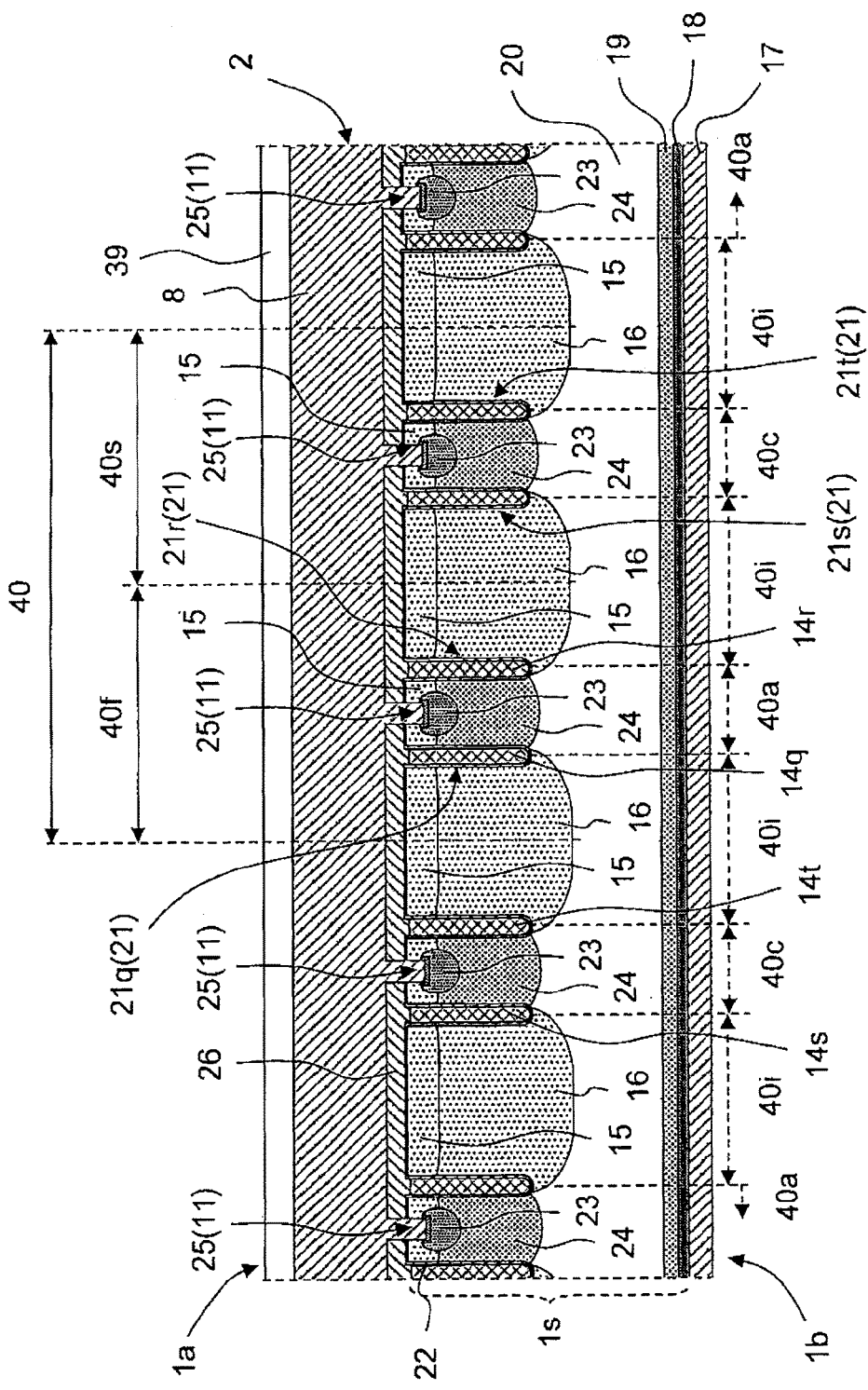
FIG. 7 is a sectional view of the device taken along line B-B' in FIG. 5.
Figure 8:
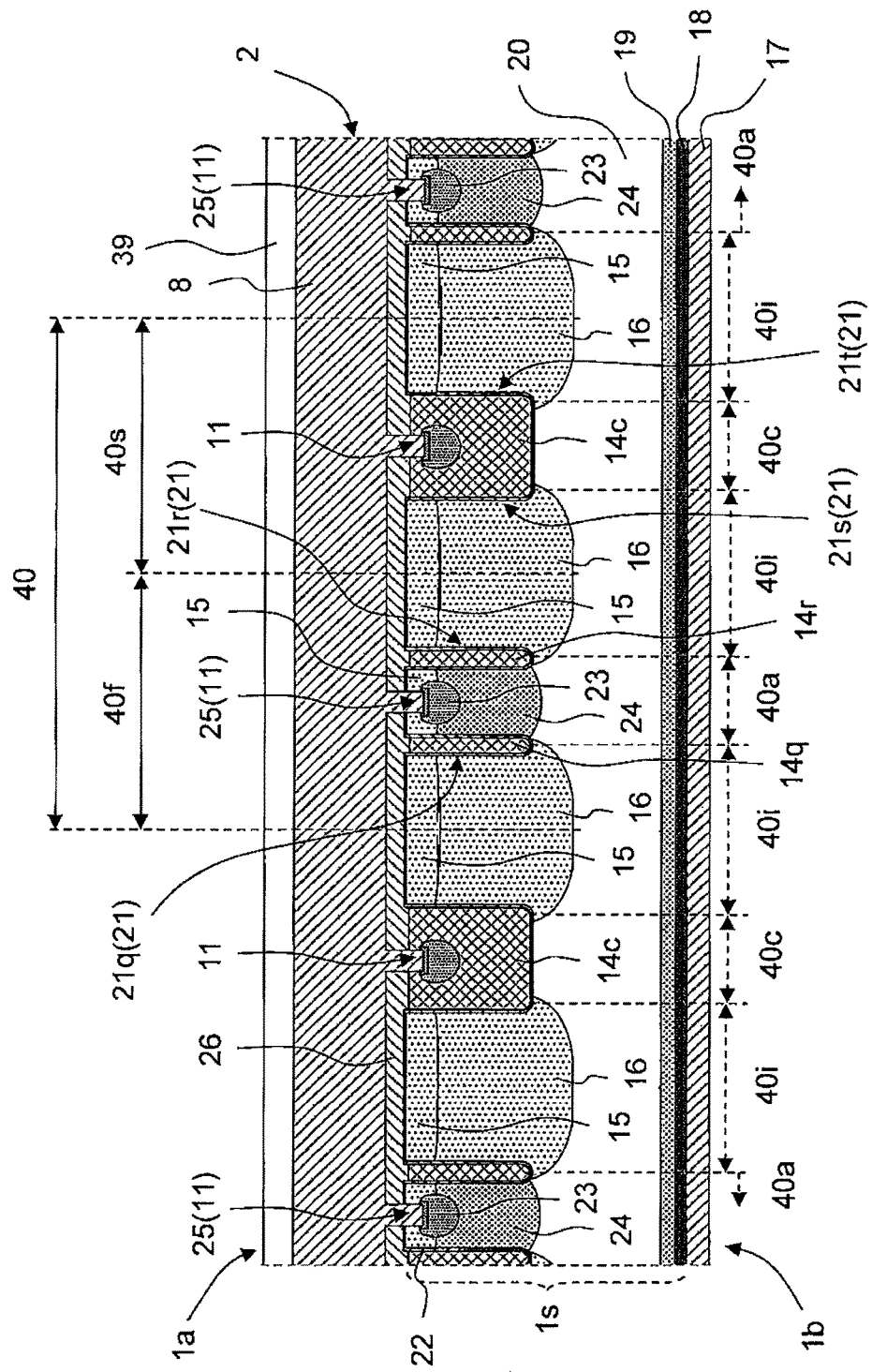
FIG. 8 is a sectional view of the device taken along line C-C' in FIG. 5.

FIG. 4 is a top view illustrating the whole of the IE type trench gate IGBT device chip according to the embodiment of the present invention (corresponding substantially to FIG. 1 but nearer to more concrete shape). FIG. 5 is an enlarged plan view illustrating the cell area upper-end cut-out area R4 of FIG. 4. FIG. 6 is a sectional view of the device taken long line A-A' of FIG. 5. FIG. 7 is a sectional view of the device taken along line B-B' of FIG. 5. FIG. 8 is a sectional view of the device taken along line C-C' of FIG. 5. The device structure of the IE type trench gate IGBT according to the embodiment of the present invention is described with reference to these drawings.

As shown in FIG. 4, the ring-shaped guard ring 3 made of, for example, aluminum-system wiring layer is disposed at the outer peripheral part of the top surface 1a of the IGBT device chip 2 and several (single or plural) ring-shaped field plates 4 (made of the same aluminum-system wiring layer as above, for example) connected to the ring-shaped floating field ring are disposed inside the guard ring 3. The cell formation area 10 is disposed in the inner part of the field plates 4 (floating field rings 36) constituting the primary part of the inner area of the top surface 1a of the chip 2 and the cell formation area 10 is covered with the metal emitter electrode 8 formed of the same aluminum-system wiring layer as above, for example, until the vicinity of the outer part thereof. A metal emitter pad 9 for connecting bonding wire is formed in the center of the metal emitter electrode 8 and a metal gate wiring 7 made of the same aluminum-system wiring layer as above, for example, is disposed between the metal emitter electrode 8 and the field plates 4. The metal gate wiring 7 is connected to the metal gate electrode 5 made of the same aluminum-system wiring layer as above, for example, and the center part of the metal gate electrode 5 forms a gate pad 6 for connecting bonding wire.

Next, FIG. 5 is an enlarged plan view of the cell area upper-end cut-out area R4 of FIG. 4. As shown in FIG. 5, the linear unit cell areas 40 are periodically arranged in the cell formation area 10 in the horizontal direction and the linear unit cell areas 40 each include the first linear unit cell area 40f and the second linear unit cell area 40s. In this example, the width Wf of the first linear unit cell areas 40f is substantially equal to the width Ws of the second linear unit cell areas 40s.

The first linear unit cell areas 40f each include the linear active cell area 40a disposed in the center thereof and a pair of linear inactive cell areas 40i of half width surrounding the linear active cell area 40a. First and second linear trench gate electrodes 14q (14) and 14r (14) connected electrically to the gate electrode are disposed between the linear active cell area 40a and the linear inactive cell areas 40i.

On the other hand, the second linear unit cell areas 40s each include the linear hole collector cell area 40c disposed in the center thereof and a pair of linear inactive cell areas 40i of half width surrounding the linear hole collector cell area 40c. A third linear trench gate electrode 14s (14) and a fourth linear trench gate electrode 14t (14) connected electrically to the emitter electrode are disposed between the linear hole collector cell area 40c and the linear inactive cell area 40i.

Contact grooves 11 are disposed in the linear active cell areas 40a and the linear hole collector cell areas 40c along the longitudinal direction thereof in the center thereof and the $P^+$-type body contact areas 25 are disposed in the surface area of the semiconductor substrate disposed thereunder.

Areas in which the $N^+$-type emitter areas 12 are formed, that is, active sections 40aa and areas 12i in which $N^+$-type impurity is not introduced (areas in which the $N^+$-type emitter areas are not formed, that is, P-type body areas 15), that is, inactive sections 40ai are alternately disposed in the linear active cell area 40a in its longitudinal direction periodically.

Connection trench gate electrodes (emitter connection parts) 14c for connecting third linear trench gate electrode 14s (14) and fourth linear trench gate electrodes 14t (14) mutually are disposed in the linear hole collector cell areas 40c periodically in its longitudinal direction and are mutually connected by part crossing the contact grooves 11 (P$^+$-type body contact areas 25). That is, the emitter connection parts 14c and the contact grooves 11 are substantially intersected with each other at right angles in a plane. The third linear trench gate areas 14s (14) and the fourth linear trench gate electrodes 14t (14) are electrically connected to the metal emitter electrode 8 by mutual connection of the connection trench gate electrode (emitter connection part) 14c and the P$^+$-type body contact area 25 (or metal emitter electrode 8). In this example, the width of the linear hole collector cell area 40c is substantially equal to that of the linear active cell area 40a, although this is not essential as exemplified later. However, there is a merit that hole distribution is uniform by making both the widths to be substantially equal to each other.

P-type floating areas 16 are disposed in the surface area of the semiconductor substrate in the linear inactive cell areas 40i. In this example, the depth of the P-type floating areas 16 is deeper than the lower ends of the trenches disposed on both sides thereof, so that the lower ends are covered by the P-type floating areas 16. Such structure is not essential, although by doing so, there is a merit that it is easy to maintain the resistible voltage or allowable maximum voltage even if the width of the linear inactive cell area 40i is made larger than that of the linear active cell area 40a. In this example, the width of the linear active cell area 40a is made narrower than that of the linear inactive cell area 40i, although this is not essential and the IE effect can be enhanced by doing so.

Part in which the P-type floating areas 16 are disposed (for example, cell peripheral junction area 35) is disposed in the outer peripheral part of the cell formation area 10 so that the part surrounds the cell formation area 10, for example, and the P-type floating areas 16 are electrically connected to the metal emitter electrode 8 through the P$^+$-type body contact areas 25p (contact grooves 11).

The metal gate wiring 7, for example, is disposed in the cell peripheral junction area 35 and the first and second linear trench gate electrodes 14q (14) and 14r (14) are extended from the cell formation area 10 toward the metal gate wiring 7 (that is, gate pulling-out part 14w) and connected to the metal gate wiring 7 in the part of end connection trench gate electrodes 14z through trench gate electrode connection parts 13. Further, the intermediate part between the linear inactive cell area 40i and the outer peripheral part of the cell formation area 10 are sectioned by end trench gate electrode 14p.

Next, FIG. 6 shows a section taken along line A-A' of FIG. 5. As shown in FIG. 6, the primary part of the semiconductor substrate 1s is occupied by the N$^-$-type drift area 20, and the N-type field stop area 19, the P$^+$-type collector area 18 and the metal collector electrode 17 are disposed on the back surface 1b of the semiconductor substrate 1s of the semiconductor chip 2 in order of description from the side nearer to the N$^-$-type drift area 20.

On the other hand, the P-type body areas 15 (body areas of second conductive type) are disposed in substantially all surface area of the semiconductor (substantially all surface area of the cell formation area 10) on the side of the main surface 1a of the semiconductor substrate 1s.

First and second trenches 21q (21) and 21r (21) are disposed in the surface area of the semiconductor on the side of the main surface 1a of the semiconductor substrate 1s in the boundary parts between the linear active cell areas 40a and the linear inactive cell areas 40i and the first and second linear trench gate electrodes 14q and 14r are disposed in the first and second trenches 21q and 21r through the gate insulation layers 22, respectively.

On the other hand, third and fourth trenches 21s and 21t are disposed in the surface area of the semiconductor on the side of the main surface 1a of the semiconductor substrate 1s in the boundary parts between the linear hole collector cell areas 40c and the linear inactive cell areas 40i and the third and fourth linear trench gate electrodes 14s and 14t are disposed in the third and fourth trenches 21s and 21t through the gate insulation layers 22, respectively.

The N$^+$-type emitter areas 12 are disposed in the surface area of the semiconductor on the side of the main surface 1a of the semiconductor substrate 1s in the linear active cell areas 40a and the P$^+$-type body contact areas 25 are disposed in the lower end of the contact grooves 11. P$^+$-type latch-up prevention areas 23 are disposed under the P$^+$-type body contact areas 25 and the N-type hole barrier areas 24 are disposed under the P-type body areas 15 (body areas of second conductive type) and the P$^+$-type latch-up prevention areas 23. The impurity doped structure in the linear hole collector cells 40c is the same as that of the linear active cell areas 40a except that the N$^+$-type emitter areas 12 are not provided in this example.

The P-type floating areas 16 disposed deeper than the trenches 21 (21q, 21r, 21s and 21t) are disposed under the P-type body areas 15 in the surface area of the semiconductor on the side of the main surface 1a of the semiconductor substrate 1s in the linear inactive cell areas 40i.

As described above, in this example, the N-type hole barrier areas 24, the P$^+$-type latch-up prevention areas 23 and the like are disposed even in the linear hole collector cell areas 40c similarly to the linear active cell areas 40a, although these are not essential. However, by providing these, the balance of flow of holes can be maintained as a whole.

Inter-layer insulation layers 26 of silicon oxide insulation layer or the like are formed in the substantially all surface area on the side of the main surface 1a of the semiconductor substrate 1s, for example, and the metal emitter electrode 8 made of aluminum-system metal layer, for example, as its primary constituent element is disposed in the inter-layer insulation layer 26. The metal emitter electrode 8 is connected to the N$^+$-type emitter areas 12 and the P$^+$-type body contact area 25 through the contact grooves 11 (or contact holes).

A final passivation layer 39 of, for example, polyimide-system organic insulation layer is further formed on the metal emitter electrode 8.

Next, FIG. 7 illustrates a section taken along line B-B' of FIG. 5. As shown in FIG. 7, the N$^+$-type emitter area 12 is not provided even in the linear active cell area 40a in this section and accordingly the linear active cell areas 40a and the linear hole collector cell areas 40c are the same in the drawing. The structure of other parts is the same as parts described in FIG. 6. It is a matter of course that the fact that the first and second linear trench gate electrodes 14q and 14r are electrically connected to the metal gate electrode 5 and the third and fourth linear trench gate electrodes 14s and 14t are electrically connected to the metal emitter electrode 8 similarly to FIG. 6 is different.

Next, FIG. 8 illustrates a section taken along line C-C' of FIG. 5. As shown in FIG. 8, the structure except the linear hole collector cell areas 40c is the same as described in FIG. 7, although the part of the linear hole collector cell areas 40c is substantially occupied by only the connection trench gate electrodes 14c (emitter connection parts).

Here, in order to illustrate the device structure more concretely, an example of the primary dimensions of respective parts of the device is shown (refer to FIGS. 4 to 8). That is, the width Wa of the linear active cell area is about 1.3 micrometers, the width Wi of the linear inactive cell area is about 3.3 micrometers (the width Wa of the linear active cell area is desirably narrower than the width Wi of the linear inactive cell area and the value of Wi/Wa desirably falls within the range of 2 to 3, for example), the width of contact is about 0.3 micrometers, the width of trench is about 0.7 micrometers (particularly it is desirably equal to or smaller than 0.8 micrometers), the depth of trench is about 3 micrometers, the depth of the $N^+$-type emitter area 12 is about 250 nanometers, the depth of the P-type body area 15 (channel area) is about 0.8 micrometers, the depth of the $P^+$-type latch-up prevention area 23 is about 1.4 micrometers, the depth of the P-type floating area 16 is about 4.5 micrometers, the thickness of the N-type field stop area 19 is about 1.5 micrometers, the thickness of the $P^+$-type collector area is about 0.5 micrometers and the thickness of the semiconductor substrate 2 is about 70 micrometers (here, a resistible voltage or allowable maximum voltage is about 600 volts, for example). Further, the thickness of the semiconductor substrate 2 depends on the resistible voltage or allowable maximum voltage greatly. Accordingly, the thickness of the semiconductor substrate 2 is about 120 micrometers for resistible voltage 1200 volts and about 40 micrometers for 400 volts, for example.

Even in the following example and the example of section 1, the dimensions of corresponding parts are substantially identical with the dimensions shown in above and accordingly description thereof is not repeated.

3. Description of Fabrication Method corresponding to Device Structure in Embodiment 1 of the Invention (FIGS. 9 to 26 mainly):

In this section, an example of the fabrication method of the device structure described in the section 2 is described. The following description is made centering on the cell formation area 10, although the peripheral parts and the like are described with reference to FIGS. 1, 2, 4 and the like if necessary.

Further, the following description is concretely made to the linear active cell areas 40a and the linear inactive cell areas 40i at its peripheral part, although the linear hole collector cell areas 40c and the others (containing modification examples) are not different particularly except that the $N^+$-type emitter areas 12 are not formed and accordingly individual description is omitted.

Figure 9:
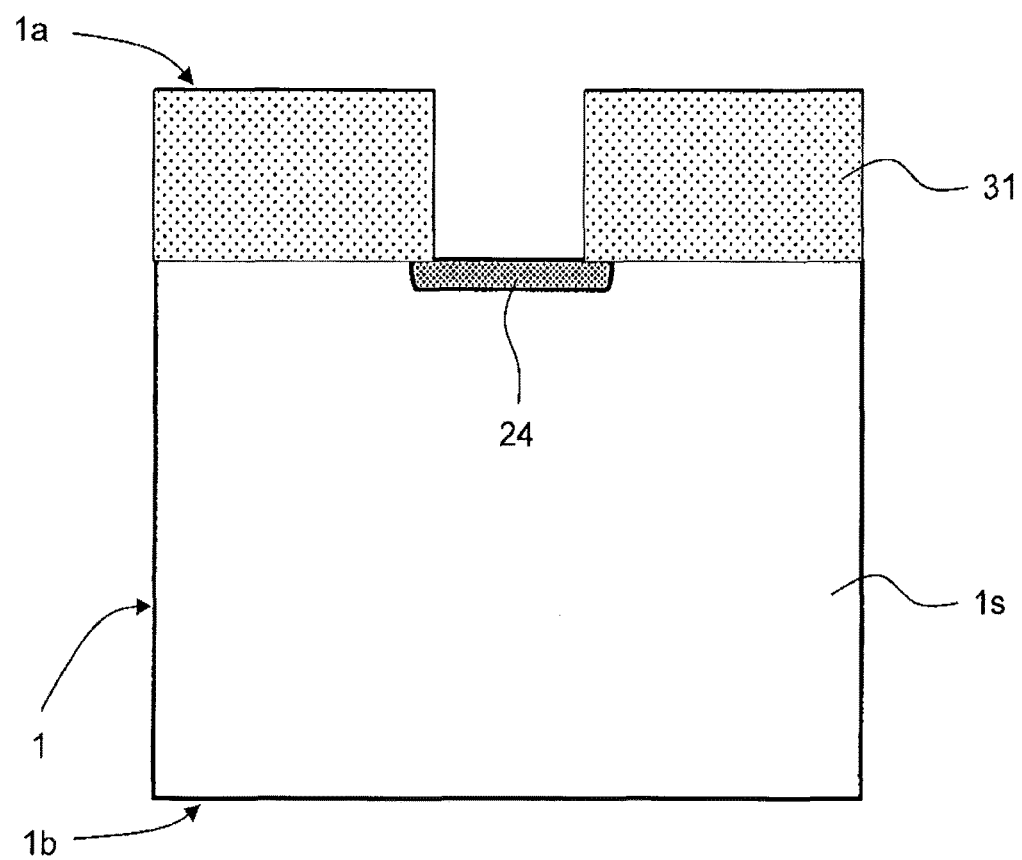
FIG. 9 is a sectional view of the device corresponding to a first linear unit cell area of FIG. 6 in a fabrication process (hole barrier area introduction process) for the purpose of description of a fabrication method of the device structure according to an embodiment 1 of the present invention.
Figure 10:
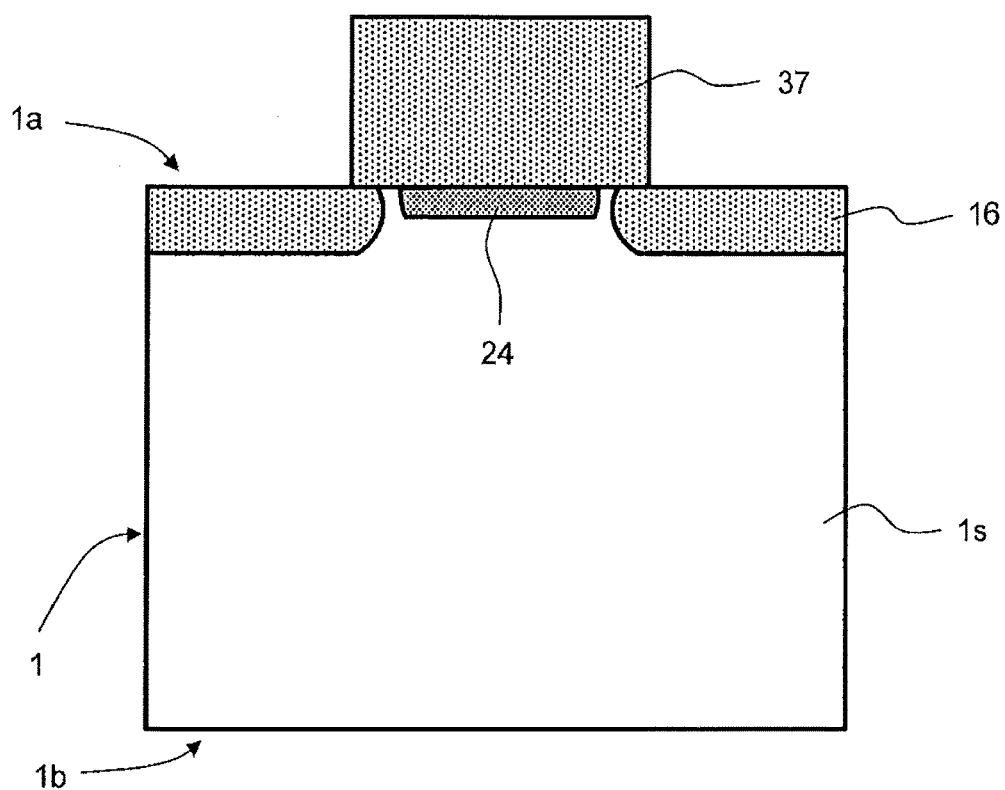
FIG. 10 is a sectional view of the device corresponding to the first linear unit cell area of FIG. 6 in a fabrication process (P-type floating area introduction process) for the purpose of description of the fabrication method of the device structure according to the embodiment 1 of the present invention.
Figure 11:
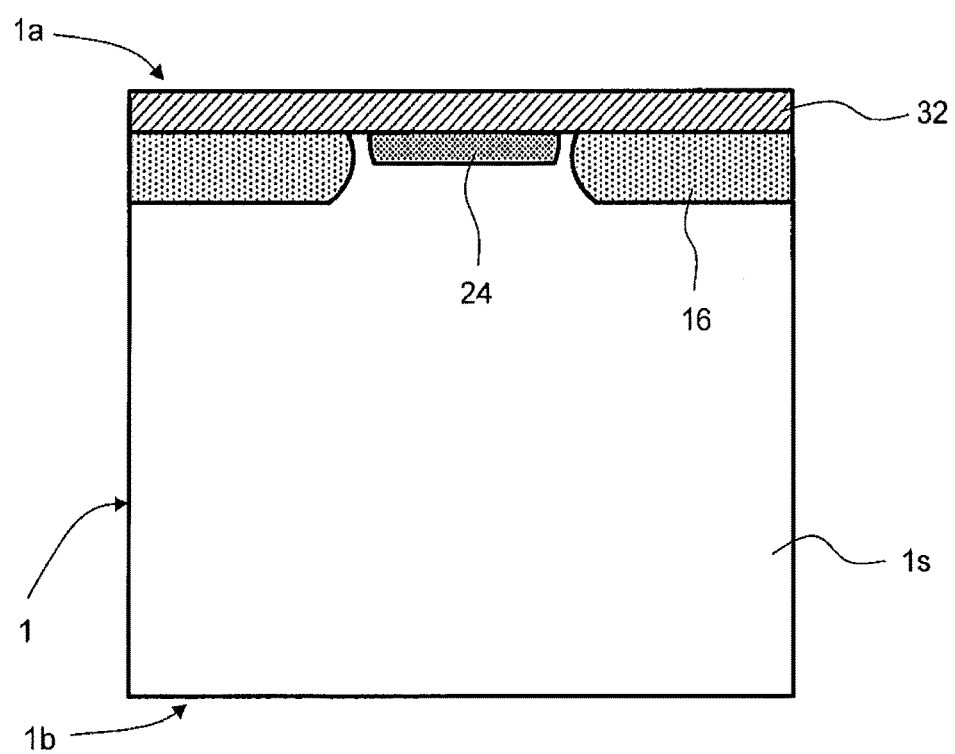
FIG. 11 is a sectional view of the device corresponding to the first linear unit cell area of FIG. 6 in a fabrication process (trench processing hard mask layer forming process) for the purpose of description of the fabrication method of the device structure according to the embodiment 1 of the present invention.
Figure 12:
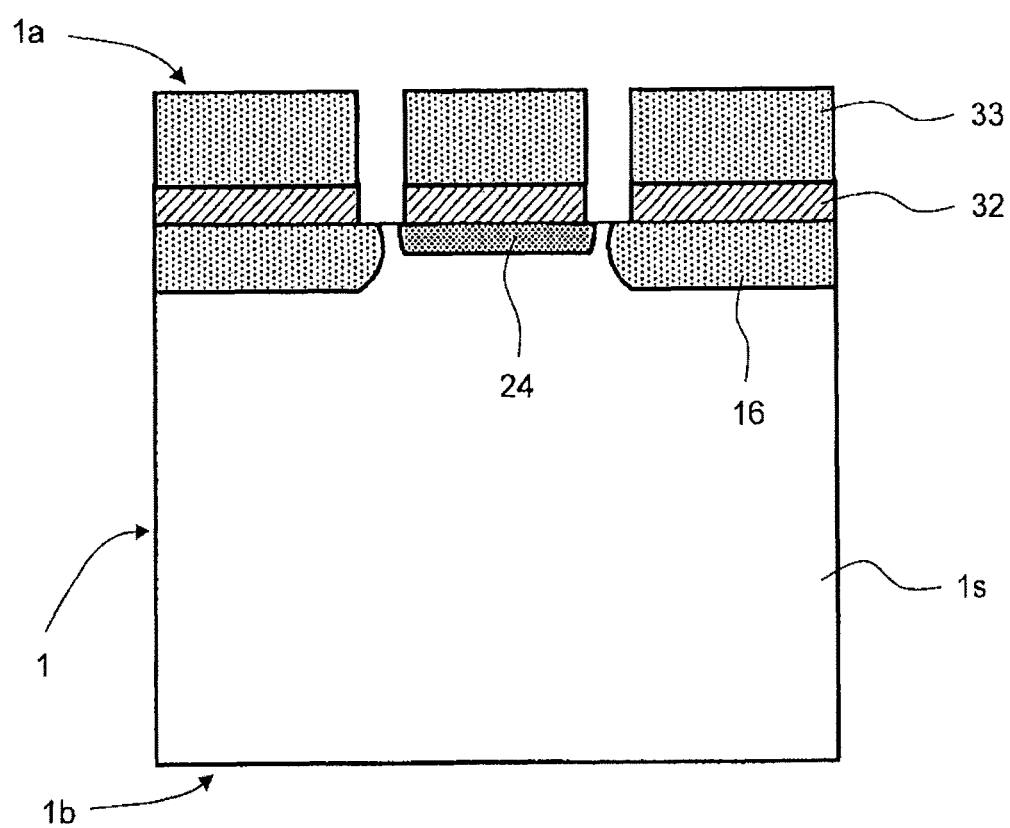
FIG. 12 is a sectional view of the device corresponding to the first linear unit cell area of FIG. 6 in a fabrication process (trench hard mask processing process) for the purpose of description of the fabrication method of the device structure according to the embodiment 1 of the present invention.
Figure 13:
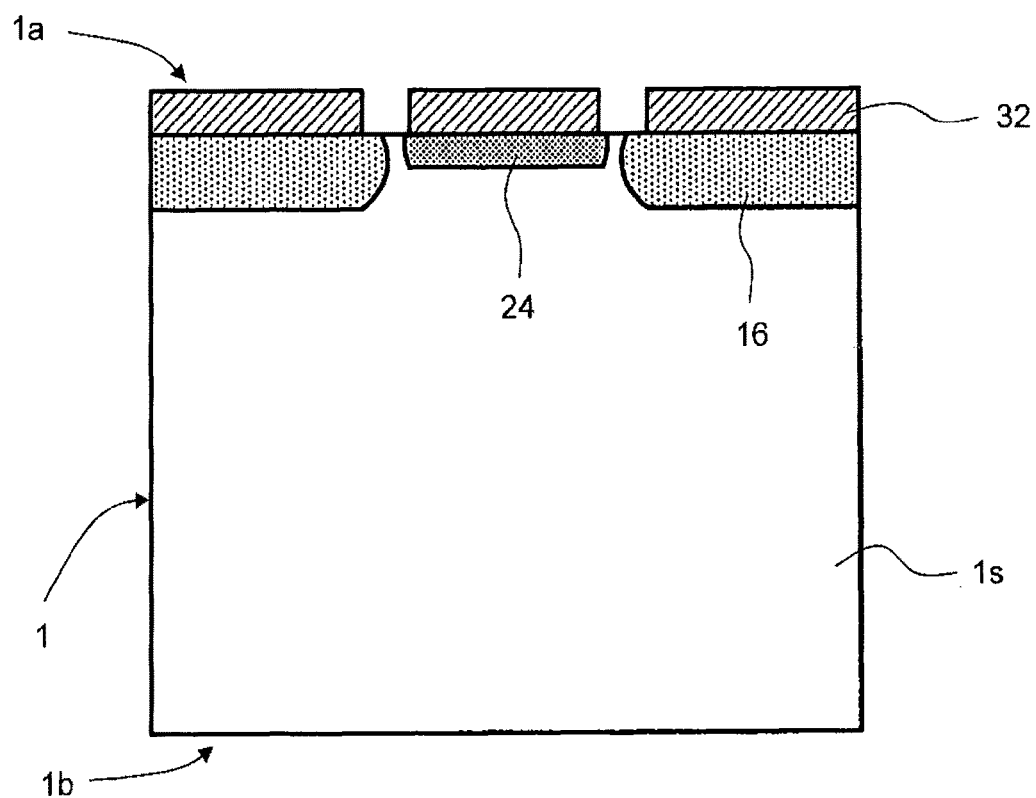
FIG. 13 is a sectional view of the device corresponding to the first linear unit cell area of FIG. 6 in a fabrication process (trench hard mask processing resist removing process) for the purpose of description of the fabrication method of the device structure according to the embodiment 1 of the present invention.
Figure 14:
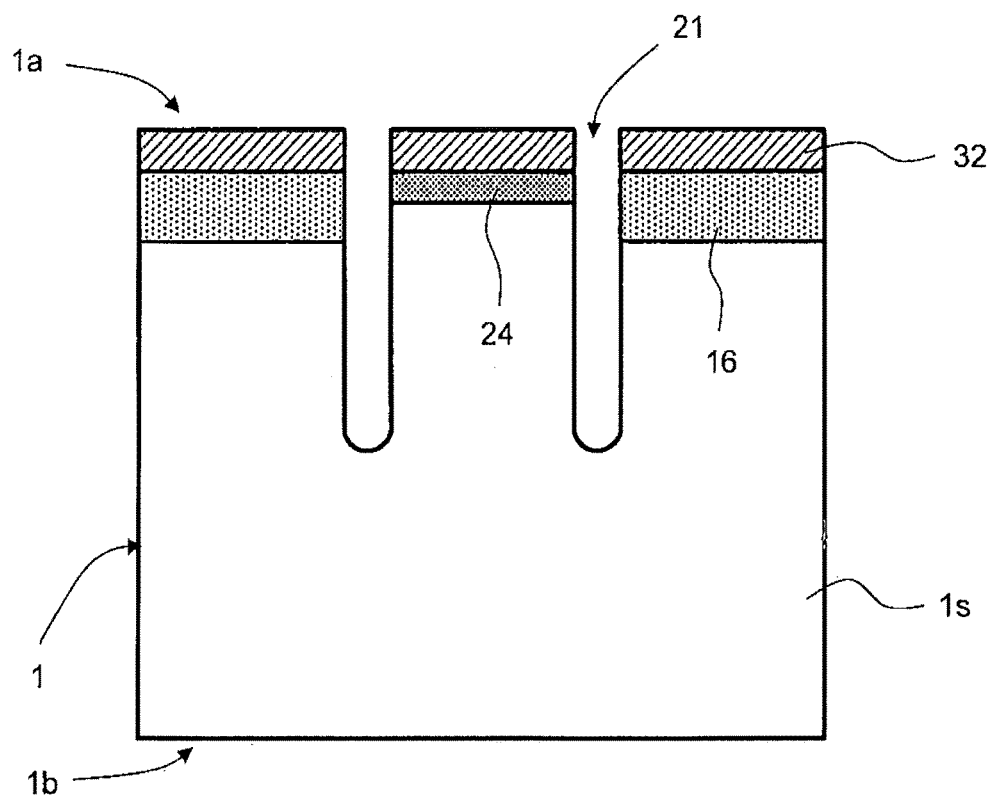
FIG. 14 is a sectional view of the device corresponding to the first linear unit cell area of FIG. 6 in a fabrication process (trench processing process) for the purpose of description of the fabrication method of the device structure according to the embodiment 1 of the present invention.
Figure 15:
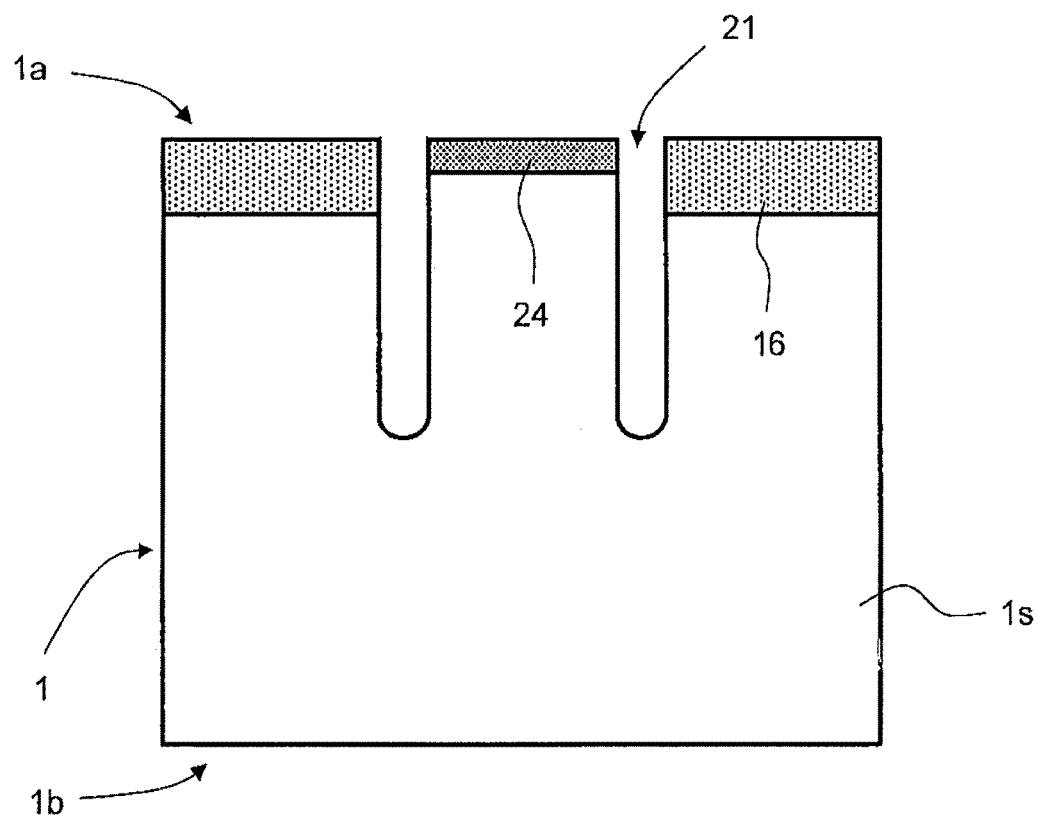
FIG. 15 is a sectional view of the device corresponding to the first linear unit cell area of FIG. 6 in a fabrication process (trench processing hard mask removing process) for the purpose of description of the fabrication method of the device structure according to the embodiment 1 of the present invention.
Figure 16:
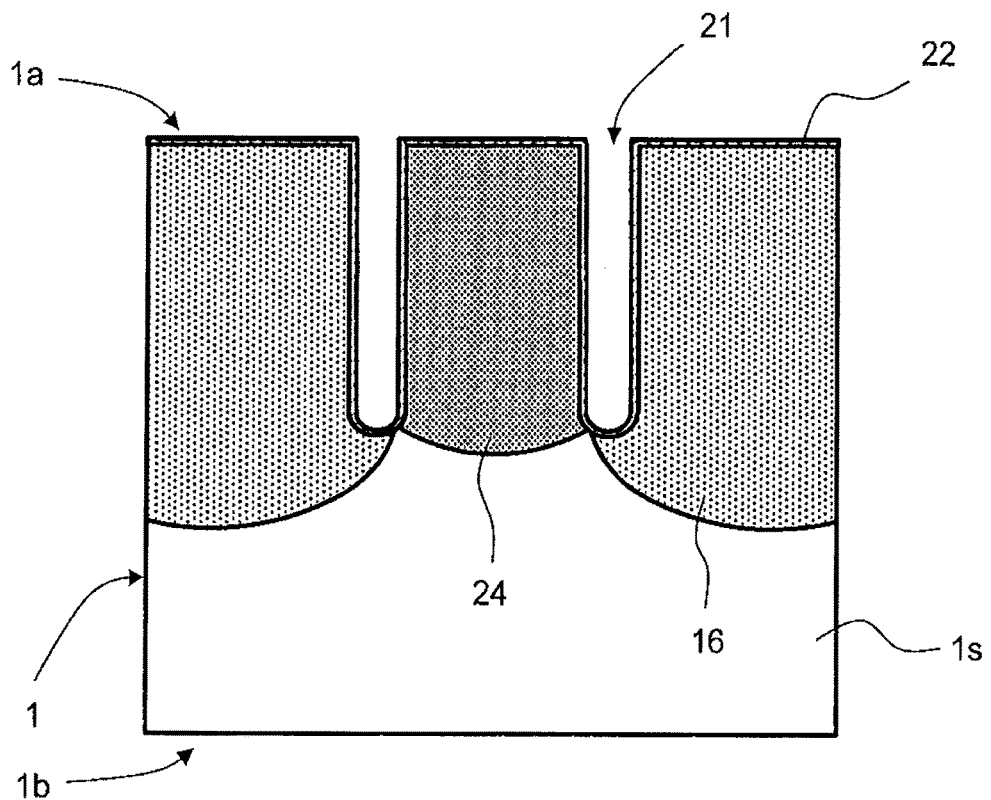
FIG. 16 is a sectional view of the device corresponding to the first linear unit cell area of FIG. 6 in a fabrication process (extension diffusion and gate oxidation process) for the purpose of description of the fabrication method of the device structure according to the embodiment 1 of the present invention.
Figure 17:
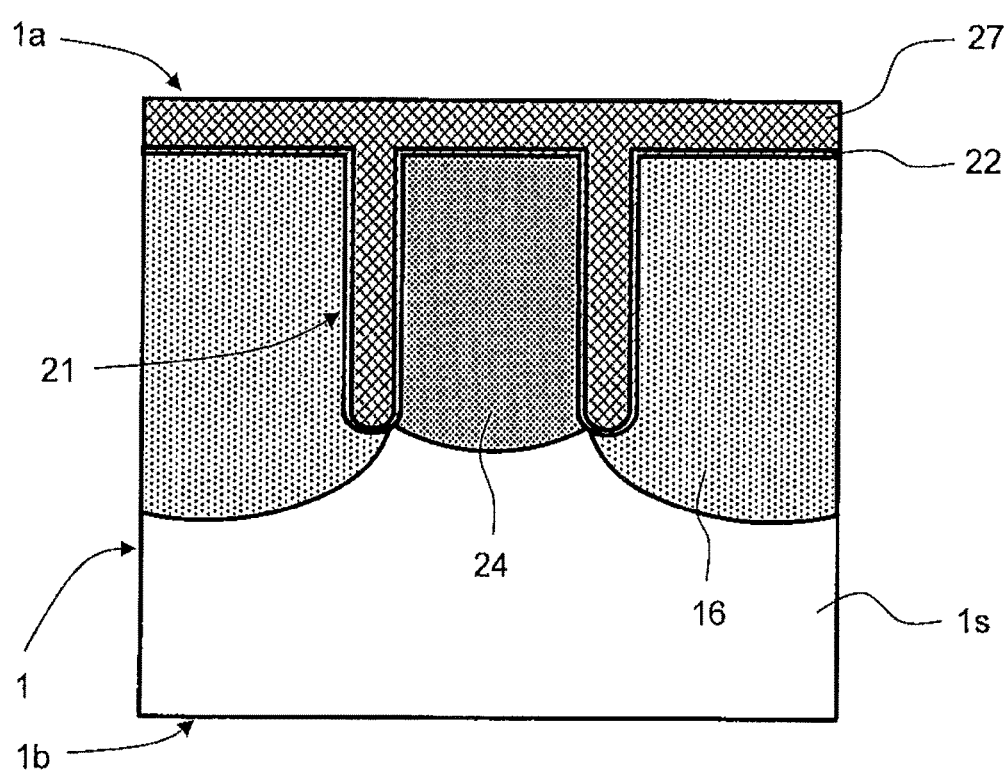
FIG. 17 is a sectional view of the device corresponding to the first linear unit cell area of FIG. 6 in a fabrication process (gate polysilicon layer forming process) for the purpose of description of the fabrication method of the device structure according to the embodiment 1 of the present invention.
Figure 18:
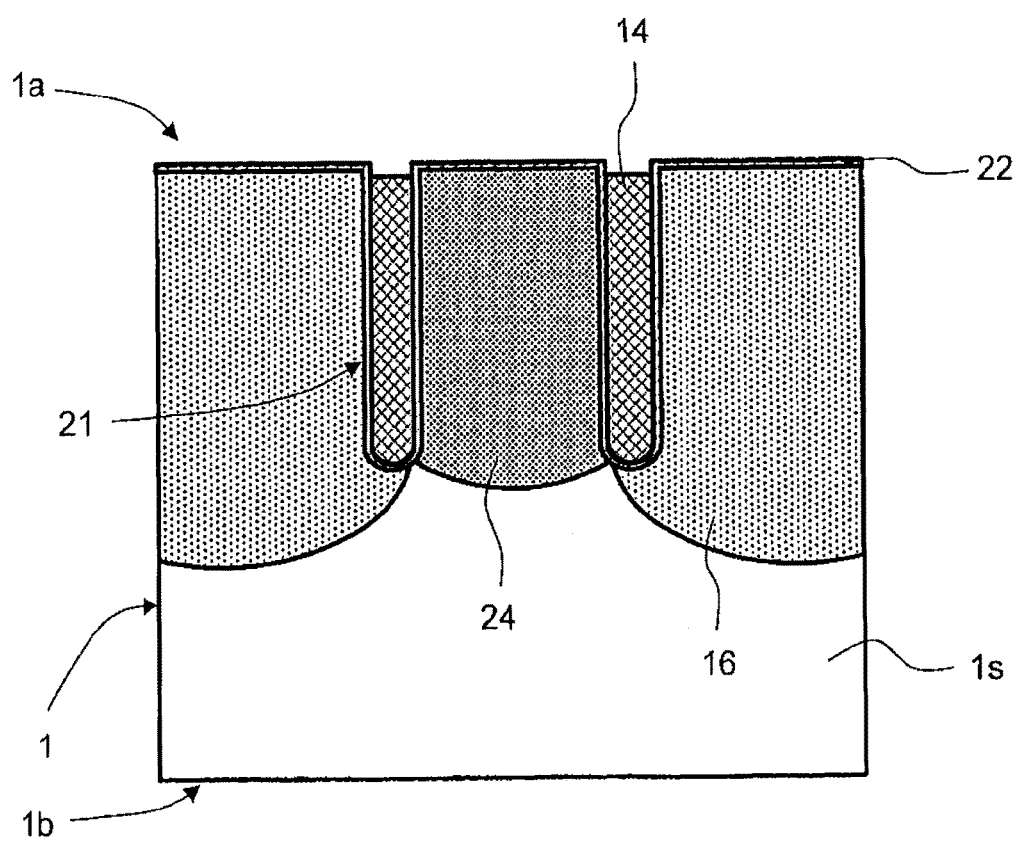
FIG. 18 is a sectional view of the device corresponding to the first linear unit cell area of FIG. 6 in a fabrication process (gate polysilicon etching-back process) for the purpose of description of the fabrication method of the device structure according to the embodiment 1 of the present invention.
Figure 19:
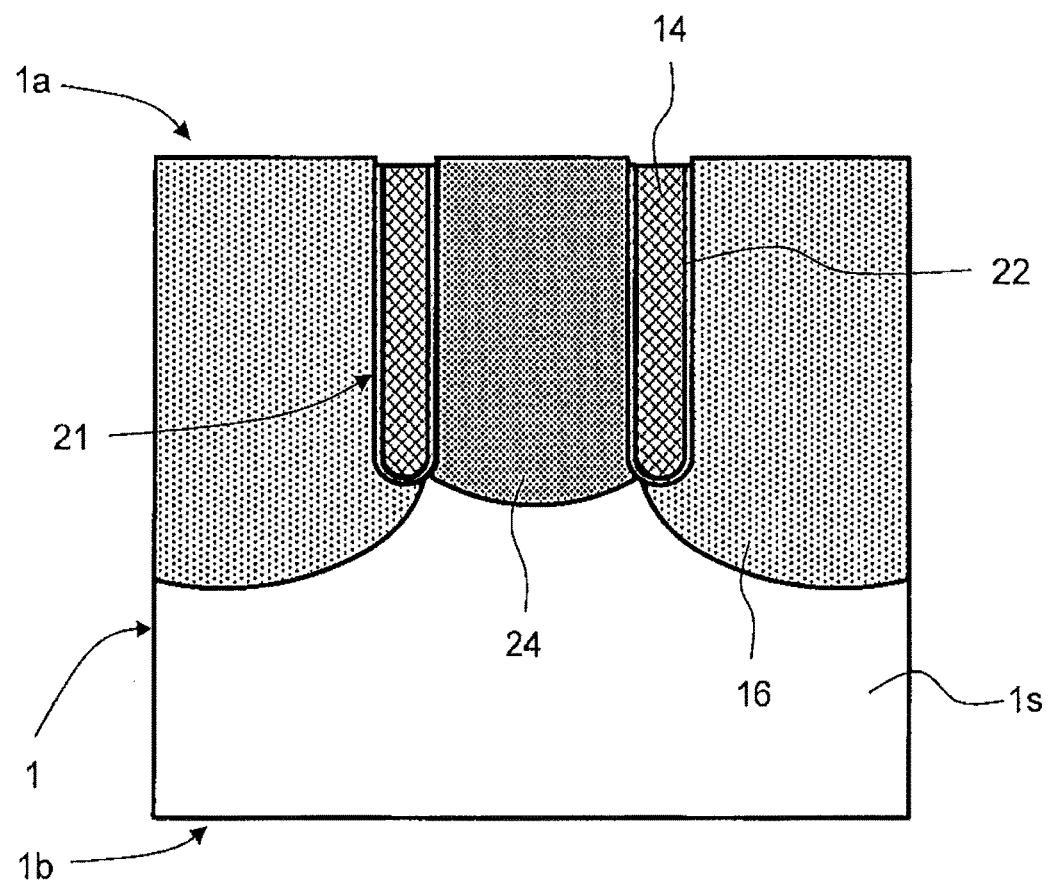
FIG. 19 is a sectional view of the device corresponding to the first linear unit cell area of FIG. 6 in a fabrication process (gate oxidation layer etching-back process) for the purpose of description of the fabrication method of the device structure according to the embodiment 1 of the present invention.
Figure 20:
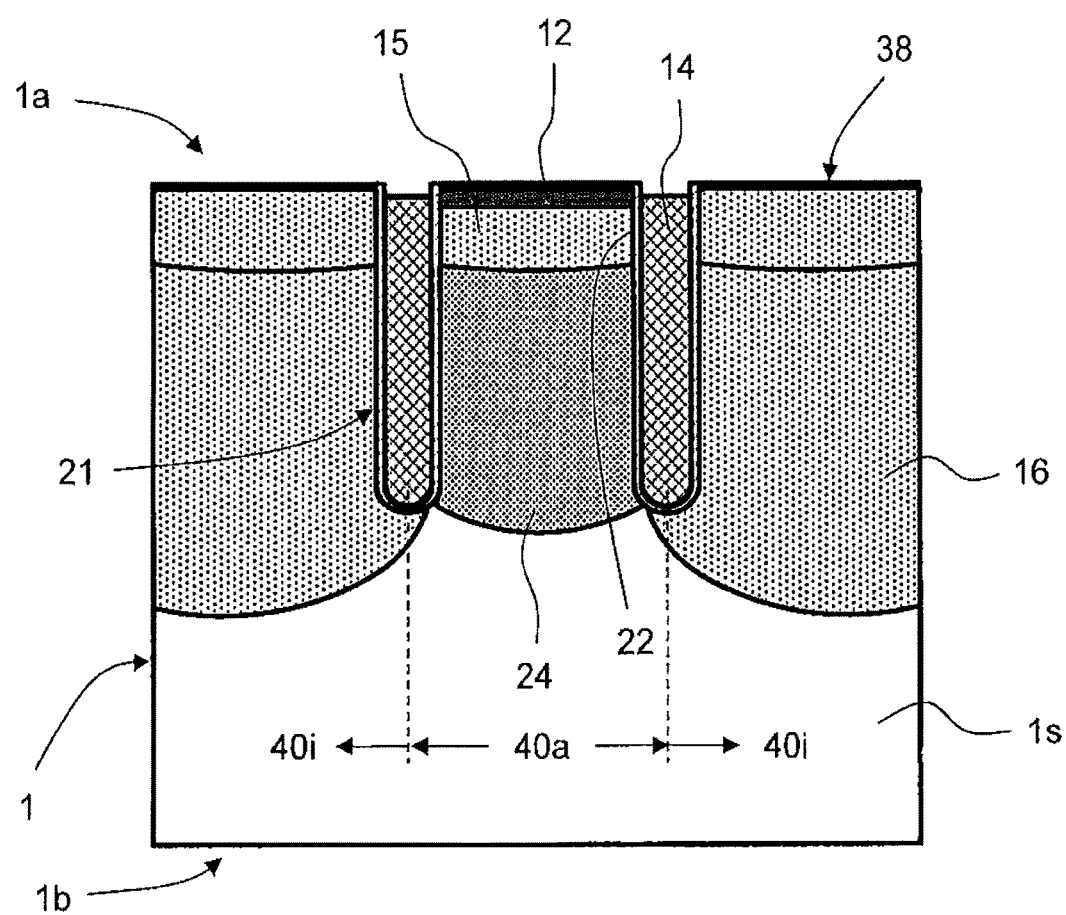
FIG. 20 is a sectional view of the device corresponding to the first linear unit cell area of FIG. 6 in a fabrication process (P-type body area and $P^+$-type emitter area introduction process) for the purpose of description of the fabrication method of the device structure according to the embodiment 1 of the present invention.
Figure 21:
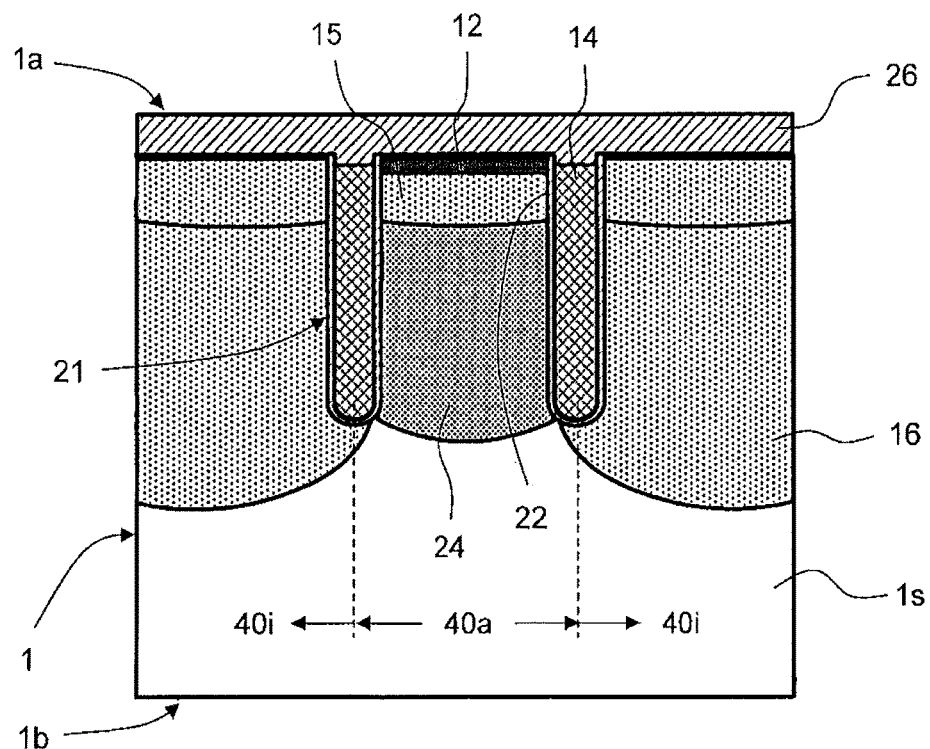
FIG. 21 is a sectional view of the device corresponding to the first linear unit cell area of FIG. 6 in a fabrication process (inter-layer insulation layer forming process) for the purpose of description of the fabrication method of the device structure according to the embodiment 1 of the present invention.
Figure 22:
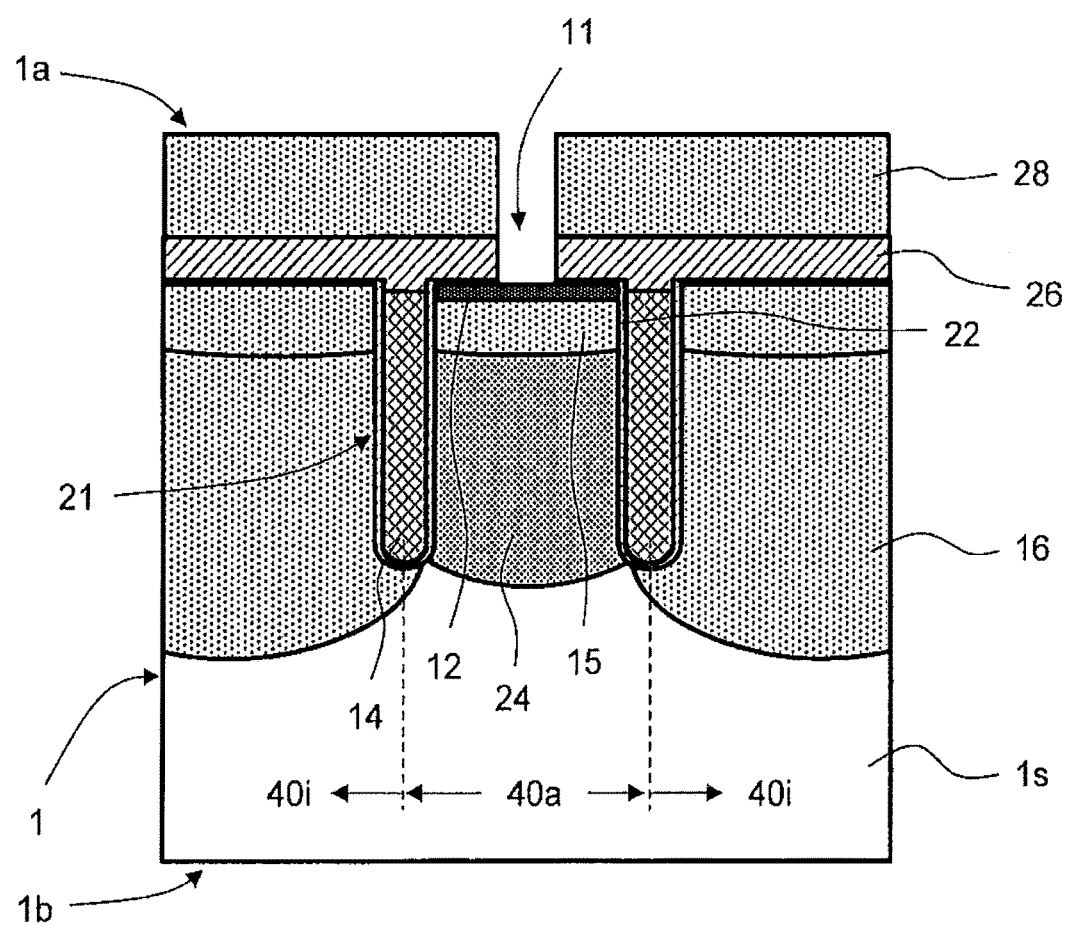
FIG. 22 is a sectional view of the device corresponding to the first linear unit cell area of FIG. 6 in a fabrication process (contact hole forming process) for the purpose of description of the fabrication method of the device structure according to the embodiment 1 of the present invention.
Figure 23:
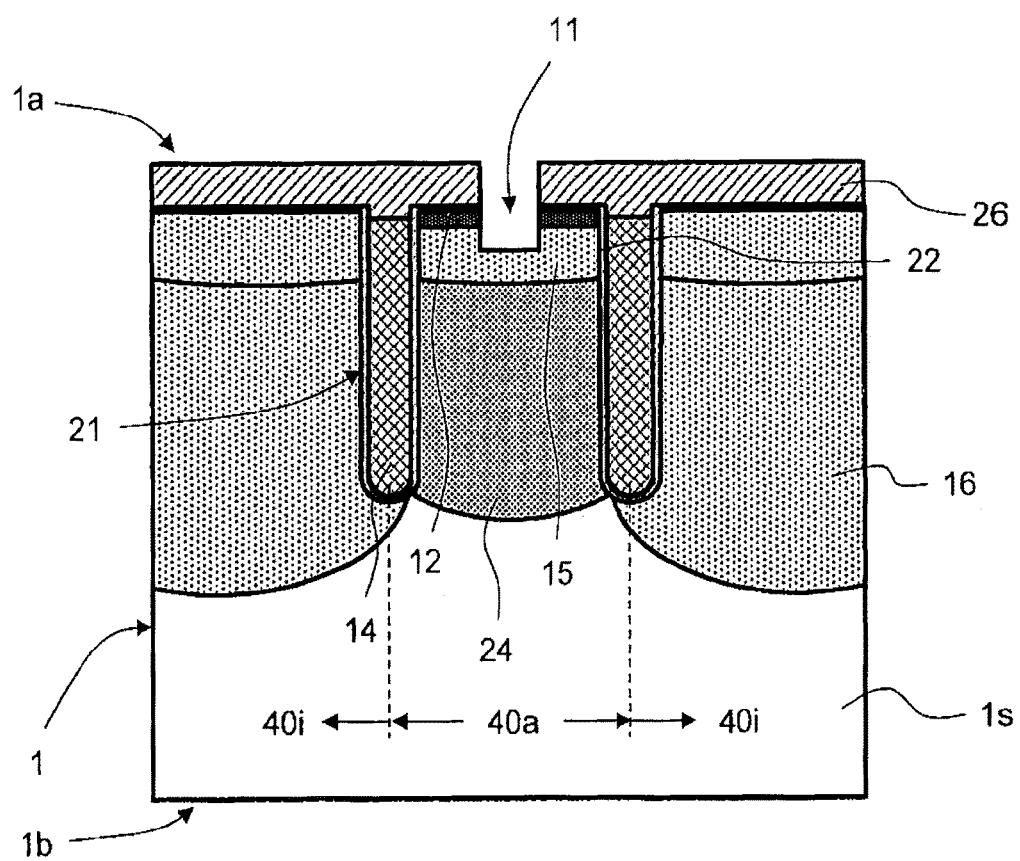
FIG. 23 is a sectional view of the device corresponding to the first linear unit cell area of FIG. 6 in a fabrication process (substrate etching process) for the purpose of description of the fabrication method of the device structure according to the embodiment 1 of the present invention.
Figure 24:
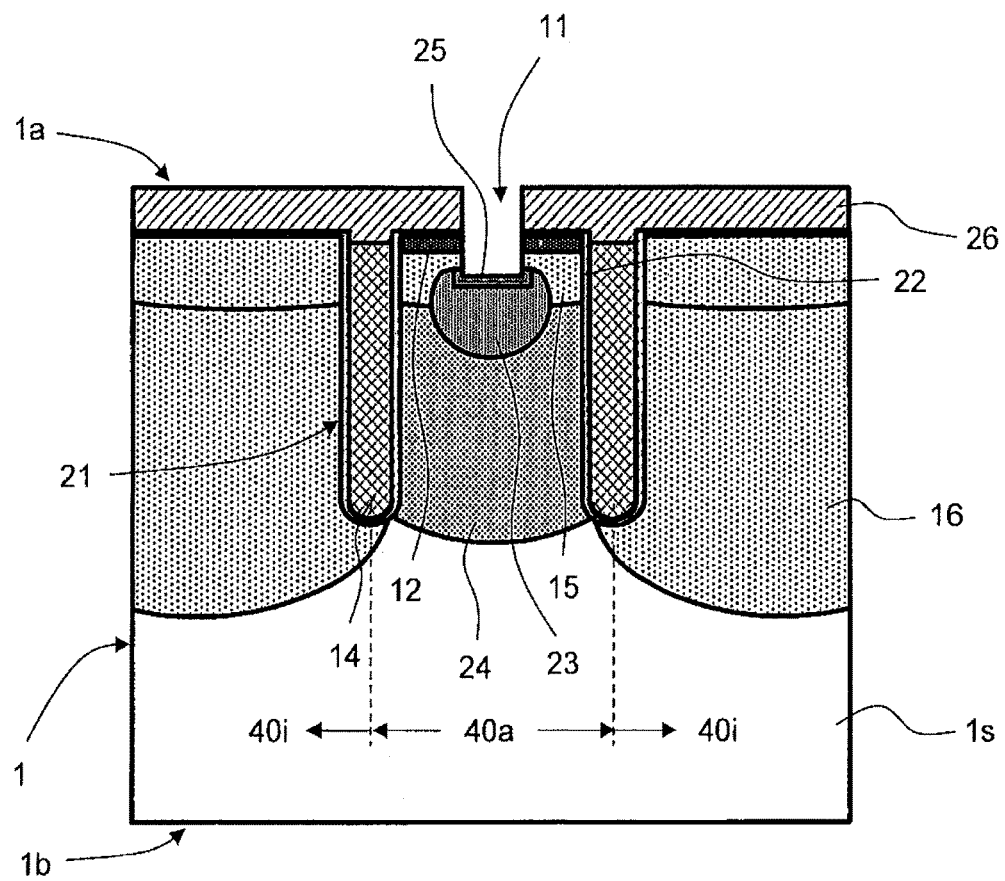
FIG. 24 is a sectional view of the device corresponding to the first linear unit cell area of FIG. 6 in a fabrication process ($P^+$-type body contact area and $P^+$-type latch-up prevention area introduction process) for the purpose of description of the fabrication method of the device structure according to the embodiment 1 of the present invention.
Figure 25:
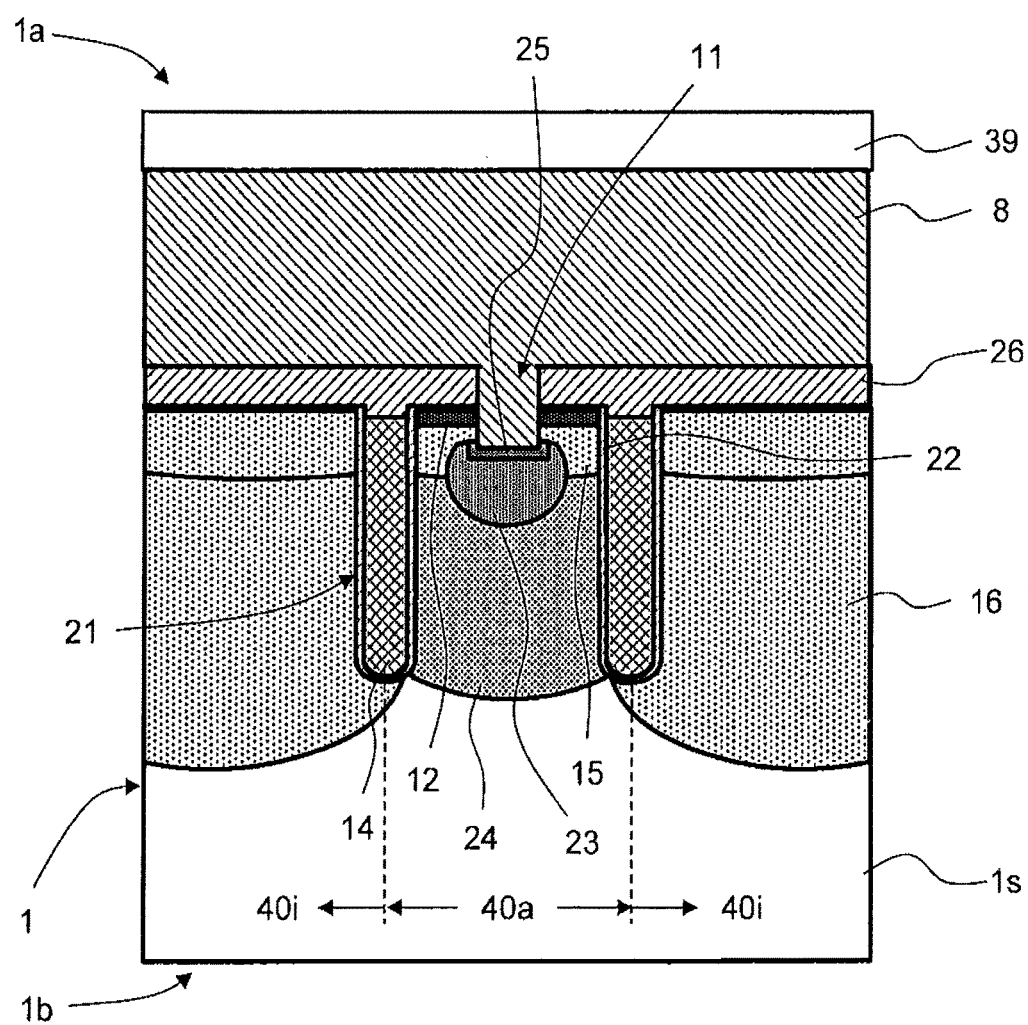
FIG. 25 is a sectional view of the device corresponding to the first linear unit cell area of FIG. 6 in a fabrication process (surface metal layer forming and final passivation layer forming process) for the purpose of description of the fabrication method of the device structure according to the embodiment 1 of the present invention.
Figure 26:
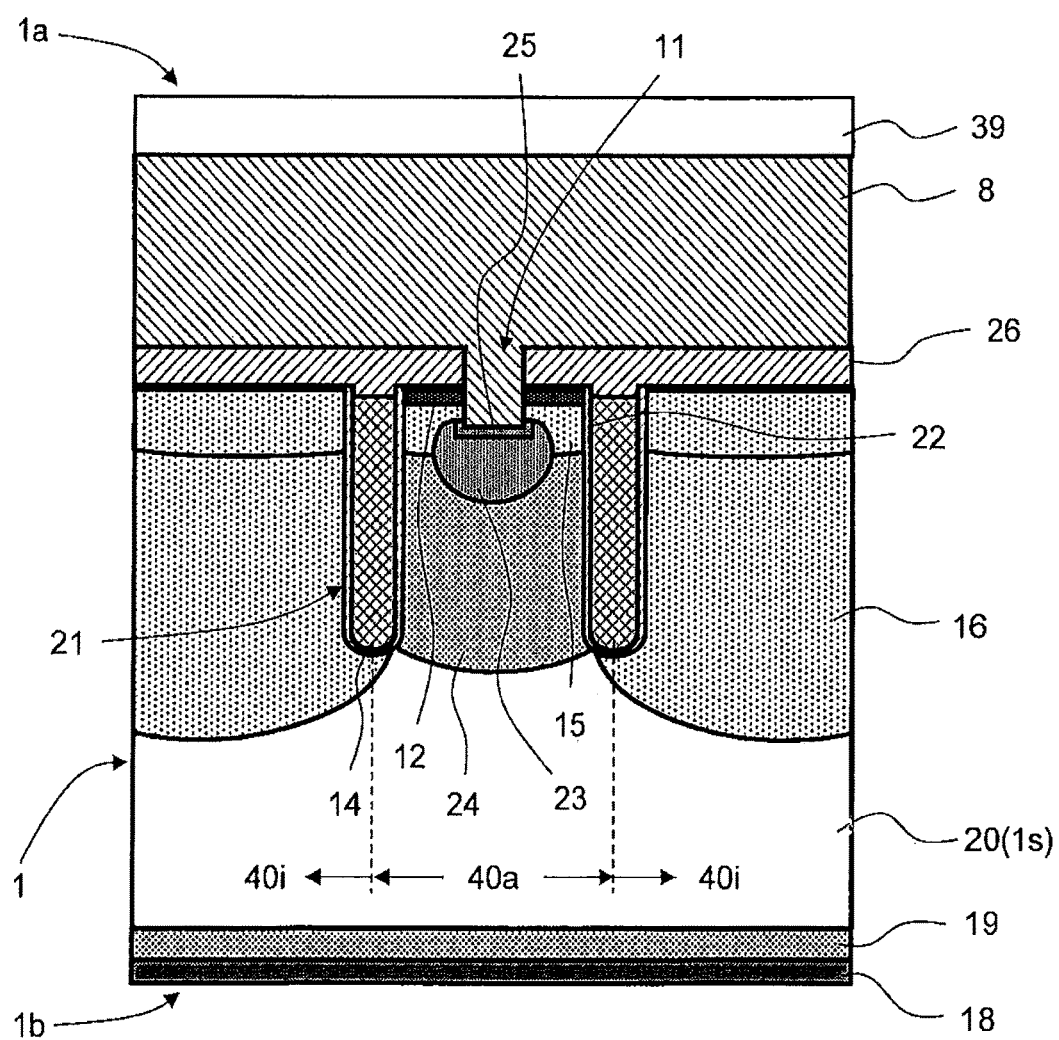
FIG. 26 is a sectional view of the device corresponding to the first linear unit cell area of FIG. 6 in a fabrication process (back surface grinding and back surface impurity introduction process) for the purpose of description of the fabrication method of the device structure according to the embodiment 1 of the present invention.

FIG. 9 is a sectional view of the device in the fabrication process (hole barrier area introduction process) corresponding to the first linear unit cell area of FIG. 6 for the purpose of description of the fabrication method of the device structure according to the embodiment 1 of the present invention. FIG. 10 is a sectional view of the device in the fabrication process (P-type floating area introduction process) corresponding to the first linear unit cell area of FIG. 6 for the purpose of description of the fabrication method of the device structure according to the embodiment 1 of the present invention. FIG. 11 is a sectional view of the device in the fabrication process (trench processing hard mask layer forming process) corresponding to the first linear unit cell area of FIG. 6 for the purpose of description of the fabrication method of the device structure according to the embodiment 1 of the present invention. FIG. 12 is a sectional view of the device in the fabrication process (trench hard mask processing process) corresponding to the first linear unit cell area of FIG. 6 for the purpose of description of the fabrication method of the device structure according to the embodiment 1 of the present invention. FIG. 13 is a sectional view of the device in the fabrication process (trench hard mask processing resist removing process) corresponding to the first linear unit cell area of FIG. 6 for the purpose of description of the fabrication method of the device structure according to the embodiment 1 of the present invention. FIG. 14 is a sectional view of the device in the fabrication process (trench processing process) corresponding to the first linear unit cell area of FIG. 6 for the purpose of description of the fabrication method of the device structure according to the embodiment 1 of the present invention. FIG. 15 is a sectional view of the device in the fabrication process (trench processing hard mask removing process) corresponding to the first linear unit cell area of FIG. 6 for the purpose of description of the fabrication method of the device structure according to the embodiment 1 of the present invention. FIG. 16 is a sectional view of the device in the fabrication process (extension diffusion and gate oxidation process) corresponding to the first linear unit cell area of FIG. 6 for the purpose of description of the fabrication method of the device structure according to the embodiment 1 of the present invention. FIG. 17 is a sectional view of the device in the fabrication process (gate polysilicon layer forming process) corresponding to the first linear unit cell area of FIG. 6 for the purpose of description of the fabrication method of the device structure according to the embodiment 1 of the present invention. FIG. 18 is a sectional view of the device in the fabrication process (gate polysilicon etching-back process) corresponding to the first linear unit cell area of FIG. 6 for the purpose of description of the fabrication method of the device structure according to the embodiment 1 of the present invention. FIG. 19 is a sectional view of the device in the fabrication process (gate oxide layer etching-back process) corresponding to the first linear unit cell area of FIG. 6 for the purpose of description of the fabrication method of the device structure according to the embodiment 1 of the present invention. FIG. 20 is a sectional view of the device in the fabrication process (P-type body area and $N^+$-type emitter area introduction process) corresponding to the first linear unit cell area of FIG. 6 for the purpose of description of the fabrication method of the device structure according to the embodiment 1 of the present invention. FIG. 21 is a sectional view of the device in the fabrication process (inter-layer insulation layer forming process) corresponding to the first linear unit cell area of FIG. 6 for the purpose of description of the fabrication method of the device structure according to the embodiment 1 of the present invention. FIG. 22 is a sectional view of the device in the fabrication process (contact hole forming process) corresponding to the first linear unit cell area of FIG. 6 for the purpose of description of the fabrication method of the device structure according to the embodiment 1 of the present invention. FIG. 23 is a sectional view of the device in the fabrication process (substrate etching process) corresponding to the first linear unit cell area of FIG. 6 for the purpose of description of the fabrication method of the device structure according to the embodiment 1 of the present invention. FIG. 24 is a sectional view of the device in the fabrication process ($P^+$-type body contact area and $P^+$-type latch-up prevention area introduction process) corresponding to the first linear unit cell area of FIG. 6 for the purpose of description of the fabrication method of the device structure according to the embodiment 1 of the present invention. FIG. 25 is a sectional view of the device in the fabrication process (surface metal layer forming and final passivation layer forming process) corresponding to the first linear unit cell area of FIG. 6 for the purpose of description of the fabrication method of the device structure according to the embodiment 1 of the present invention. FIG. 26 is a sectional view of the device in the fabrication process (back surface grinding and back surface impurity introduction process) corresponding to the first linear unit cell area of FIG. 6 for the purpose of description of the fabrication method of the device structure according to the embodiment 1 of the present invention. The fabrication method of the device structure according to the embodiment 1 of the present invention is described with reference to the above drawings.

First of all, a wafer having 200φ (diameter may be 150φ, 100φ, 300φ, 450φ or the like) of N$^-$-type silicon monocrystal (for example, the concentration of phosphorus is about $2 \times 10^{14}$/cm$^3$) is prepared. Here, a wafer using the FZ (Floating Zone) method, for example, is most preferable, although a wafer using the CZ (Czochralski) method may be used.

Next, as shown in FIG. 9, an N-type hole barrier area introduction resist layer 31 is formed by application or the like on substantially all surface area on the side of the surface 1a (first main surface) of a semiconductor wafer 1 and is subjected to patterning using the ordinary lithography. N-type impurity is introduced or injected into a semiconductor substrate 1s (N$^-$-type monocrystalline silicon substrate) on the side of the surface 1a (first main surface) of the semiconductor wafer 1 by the ion implantation, for example, while the N-type hole barrier area introduction resist layer 31 subjected to the patterning is used as a mask to thereby form the N-type hole barrier area 24. As preferable ion implantation conditions at this time, for example, phosphorus for the kind of ion, about $6 \times 10^{12}$/cm$^2$ for the dose amount and about 80 KeV for the implantation energy can be exemplified. Thereafter, unnecessary resist layer 31 is removed by ashing or the like.

Next, as shown in FIG. 10, a P-type floating area introduction resist layer 37 is formed on substantially all surface area on the side of the surface 1a of the semiconductor wafer 1 by application or the like and is subjected to patterning using the ordinary lithography. P-type impurity is introduced into the semiconductor substrate 1s on the side of surface 1a (first main surface) of the semiconductor wafer 1 by the ion implantation, for example, while the P-type floating area introduction resist layer 37 subjected to patterning is used as a mask to thereby form the P-type floating area 16. As preferable ion implantation conditions at this time, for example, boron for the kind of ion, about $3.5 \times 10^{13}$/cm$^2$ for the dose amount and about 75 KeV for the implantation energy can be exemplified. Thereafter, unnecessary resist layer 37 is removed by ashing or the like. Further, the cell peripheral junction area 35 and the floating field ring 36 of FIG. 2 are also introduced simultaneously with introduction of the P-type floating area 16.

Next, as shown in FIG. 11, a trench formation hard mask layer 32 (thickness is about 450 nm, for example) of silicon oxide insulation layer, for example, is formed on substantially all surface area on the side of the surface 1a of the semiconductor wafer 1 by the CVD (Chemical Vapor Deposition), for example.

Next, as shown in FIG. 12, a trench hard mask layer processing resist layer 33 is formed on substantially all surface area on the side of the surface 1a of the semiconductor wafer 1 by application and is subjected to patterning using the ordinary lithography. The trench hard mask layer processing resist layer 33 subjected to patterning is used as a mask to subject the trench formation hard mask layer 32 to patterning by means of dry etching, for example.

Thereafter, as shown in FIG. 13, unnecessary resist layer 33 is removed by ashing or the like.

Next, as shown in FIG. 14, the trench formation hard mask layer 32 subjected to patterning is used to form the trenches 21 by the anisotropy dry etching, for example. As preferable gas of the anisotropy dry etching, for example, Cl$_2$/O$_2$ gas can be exemplified.

Thereafter, as shown in FIG. 15, unnecessary trench formation hard mask layer 32 is removed by the wet etching using hydrofluoric acid silicon oxide layer etching liquid, for example.

Next, as shown in FIG. 16, the P-type floating areas 16 and the N-type hole barrier area 24 are subjected to extension diffusion (for example, 1200° C. for about 30 minutes). Then, gate insulation layer 22 (for example, about 120 nm in thickness) is formed on substantially all surface area on the side of the surface 1a of the semiconductor wafer 1 and in the trenches 21 by thermal oxidation, for example.

Next, as shown in FIG. 17, doped polysilicon layer 27 having phosphorus doped therein is formed on substantially all surface area on the gate insulation layer 22 on the side of the surface 1a of the semiconductor wafer 1 and in the inner surface of the trenches 21 by the CVD, for example (for example, about 600 nm in thickness) so as to fill the trenches 21 with the polysilicon layer 27.

Next, as shown in FIG. 18, the polysilicon layer 27 is etched back by the dry etching (for example, SF$_6$ is used as gas), for example, to form the trench gate electrodes 14 in the trenches 21.

Next, as shown in FIG. 19, the gate insulation layer 22 formed on the P-type floating area 16 except the inside of the trenches 21 is removed by the wet etching using hydrofluoric acid silicon oxide layer etching liquid, for example.

Next, as shown in FIG. 20, a relatively thin silicon oxide layer 38 (for example, to the same degree as the gate insulation layer) for ion implantation performed subsequently is formed on substantially all surface area on the side of the surface 1a of the semiconductor wafer 1 by thermal oxidation or CVD, for example. Then, P-type body area introduction resist layer is formed on the surface 1a of the semiconductor wafer 1 by the ordinary lithography. The P-type body area introduction resist layer is used as a mask to introduce P-type impurity into substantially all surface area of the cell formation area 10 and other necessary parts by the ion implantation, for example, so that the P-type body areas 15 are formed. As preferable ion implantation conditions at this time, for example, boron for the kind of ion, about $3 \times 10^{13}$/cm$^2$ for the dose amount and about 75 KeV for the implantation energy can be exemplified. Thereafter, unnecessary P-type body area introduction resist layer is removed by ashing or the like.

Further, N$^+$-type emitter area introduction resist layer is formed on the surface 1a of the semiconductor wafer 1 by the ordinary lithography. The N$^+$-type emitter area introduction resist layer is used as a mask to introduce N-type impurity into substantially all surface area on the side of the upper surface of the P-type body area 15 of the linear active cell area 40a by the ion implantation, for example, so that the N$^+$-type emitter area 12 is formed. As preferable ion implantation conditions at this time, for example, arsenic for the kind of ion, about $5 \times 10^{15}$/cm$^2$ for the dose amount and about 80 KeV for the implantation energy can be exemplified. Thereafter, unnecessary N$^+$-type emitter area introduction resist layer is removed by ashing or the like.

Next, as shown in FIG. 21, PSG (Phosphsicicate Glass) layer, for example, is formed as the inter-layer insulation layer 26 on substantially all surface area on the side of the surface 1a of the semiconductor wafer 1 by the CVD, for example (thickness is about 600 nm, for example). As preferable material of the inter-layer insulation layer 26, BPSG (Boronphosphsilicate Glass) layer, NSG (Non-doped Silicate Glass) layer, SOG (Spin-On-Glass) layer or compound layer of the above material can be exemplified.

Next, as shown in FIG. 22, a contact groove formation resist layer 28 is formed on the surface 1a of the semiconductor wafer 1 on the inter-layer insulation layer 26 by the ordinary lithography. Then, contact groove 11 (or contact hole) is formed, for example, by the anisotropy dry etching (gas is Ar/CHF$_3$/CF$_4$, for example).

Thereafter, as shown in FIG. 23, unnecessary resist layer 28 is removed by ashing or the like. Then, the contact groove 11 (or contact hole) is extended into the semiconductor substrate by the anisotropy dry etching, for example. As preferable gas at this time, for example, Cl$_2$/O$_2$ gas can be exemplified.

Next, as shown in FIG. 24, P-type impurity is ion-injected through the contact groove 11, for example, to form the P$^+$-type body contact area 25. As preferable ion implantation conditions at this time, for example, BF$_2$ for the kind of ion, about $5 \times 10^{15}$/cm$^2$ for the dose amount and about 80 KeV for the implantation energy can be exemplified.

Similarly, P-type impurity is ion-injected through the contact groove 11, for example, to form the P$^+$-type latch-up prevention area 23. As preferable ion implantation conditions at this time, for example, boron for the kind of ion, about $5 \times 10^{15}$/cm$^2$ for the dose amount and about 80 KeV for the implantation energy can be exemplified.

Next, as shown in FIG. 25, an aluminum electrode layer 8 (forming the metal emitter electrode 8), for example, is formed by the spattering. Concretely, the following procedure is performed, for example. First, TiW layer (for example, about 200 nm in thickness) is formed on substantially all surface area on the side of the surface 1a of the semiconductor wafer 1 as barrier metal layer by the spattering, for example (most of titanium in the TiW layer is moved to silicon interface by thermal processing performed later to form silicide, so that contribution is made to improvement of the contact characteristic, although these processes are complicated and accordingly not shown in drawings).

Next, silicide anneal is performed in the atmosphere of nitrogen at about 600° C. for ten minutes, for example. Then, aluminum metal layer (for example, about 5 micrometers in thickness) having aluminum as its primary component (for example, silicon is added by several percents and the remaining is aluminum) is formed on substantially all surface area on the barrier metal layer by the spattering, for example, so as to bury the contact groove 11. Subsequently, the metal emitter electrode 8 composed of aluminum metal layer and barrier metal layer is subjected to patterning by the ordinary lithography (for example, Cl$_2$/BCl$_3$ is used as gas for dry etching). Further, organic layer (for example, about 2.5 micrometers in thickness) having polyimide as its primary component is applied on substantially all surface area on the side of the device surface 1a of the wafer 1 as final passivation layer 39, and the emitter pad 9 and the gate pad 6 of FIG. 6 are opened by the ordinary lithography.

Next, the back surface 1b of the wafer 1 is subjected to back grinding processing (if necessary, chemical etching is also performed for removal of damage on the back surface), so that the thickness of the wafer equal to originally, for example, about 800 micrometers (preferable range is about 1000 to 450 micrometers) is thinned to about 200 to 300 micrometers, for example, if necessary. When a resistible voltage or allowable maximum voltage is about 600 volts, the final thickness is about 70 micrometers.

Next, as shown in FIG. 26, N-type impurity is introduced in substantially all surface area on the side of the back surface 1b of the semiconductor wafer 1 by the ion implantation, for example, to form the N-type field stop area 19. As preferable ion implantation conditions at this time, for example, phosphorus for the kind of ion, about $7 \times 10^{12}$/cm$^2$ for the dose amount and about 350 KeV for the implantation energy can be exemplified. Thereafter, if necessary, the back surface 1b of the wafer 1 is subjected to laser anneal for activation of impurity. Next, N-type impurity is introduced in substantially all surface area on the side of the back surface 1b of the semiconductor wafer 1 by the ion implantation, for example, to form the P$^+$-type collector area 18. As preferable ion implantation conditions at this time, for example, boron for the kind of ion, about $1 \times 10^{13}$/cm$^2$ for the dose amount and about 40 KeV for the implantation energy can be exemplified. Thereafter, if necessary, the back surface 1b of the wafer 1 is subjected to laser anneal for activation of impurity.

Next, the metal collector electrode 17 is formed on substantially all surface area on the side of the back surface 1b of the semiconductor wafer 1 by the spattering, for example (refer to FIG. 2 and description thereof for concrete details). Thereafter, the semiconductor wafer 1 is divided into chip areas by dicing and if necessary the chips are packaged to be completed as devices.

4. Description of Modification Example concerning Gate Electrode Connection Structure of IE type Trench Gate IGBT in the Embodiment of the Invention (FIGS. 27 to 29 mainly):

In this section, a modification example concerning the connection trench gate electrode 14c (emitter electrode part) for connecting the trench gate electrodes 14 (14s and 14t) on both sides of the linear hole collector cell area 40c (for example, FIG. 5) to the metal emitter electrode 8 in the device structure described in the section 2 is described. Accordingly, the parts described in the sections 1 to 3 are basically the same and accordingly only different parts are described below in principle.

Figure 27:
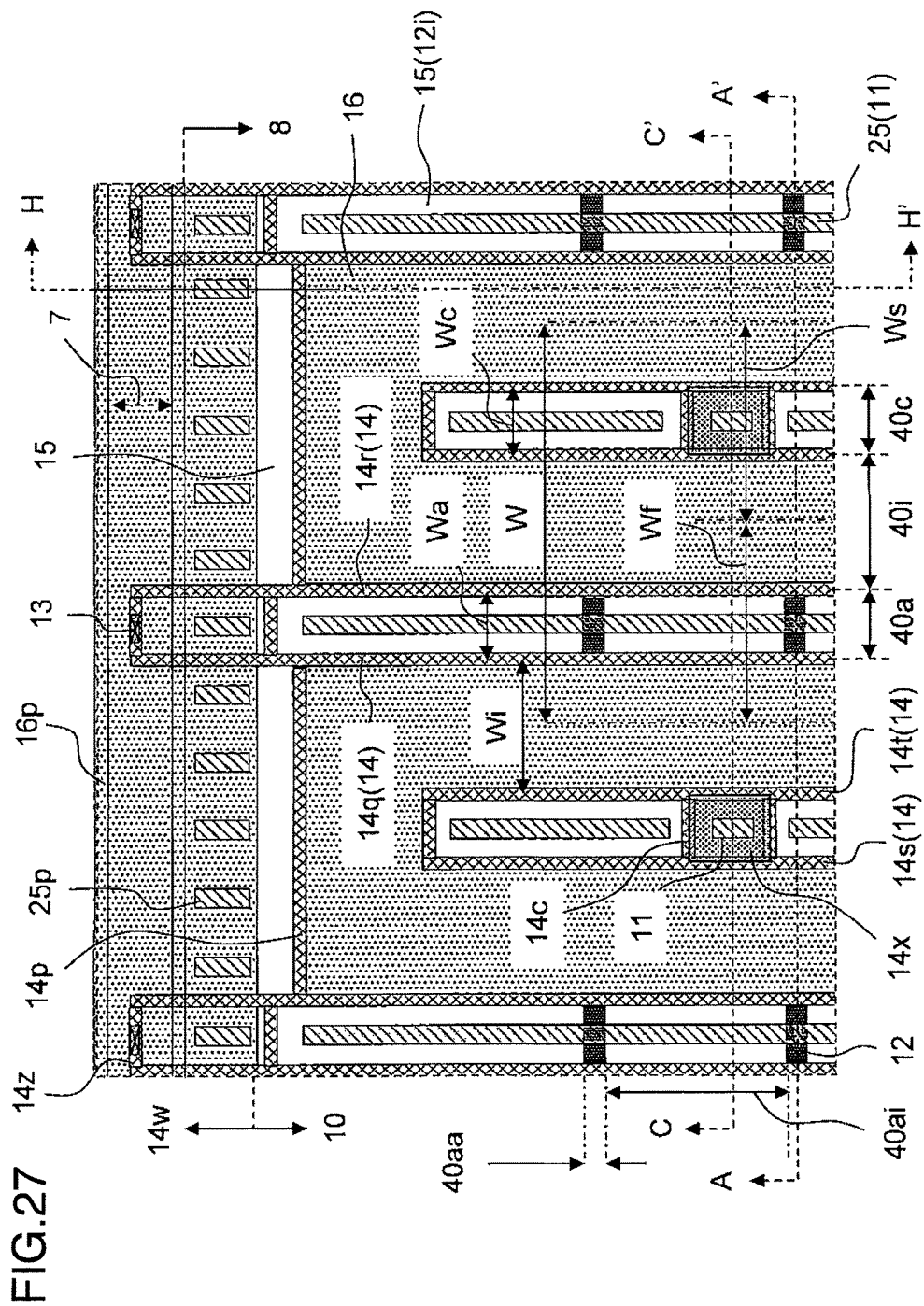
FIG. 27 is an enlarged plan view corresponding to FIG. 5 illustrating the cell area upper-end cut-out area R4 of FIG. 4 for the purpose of description of a modification example concerning a gate electrode connection structure of the IE type trench gate IGBT according to the embodiment of the present invention.
Figure 28:
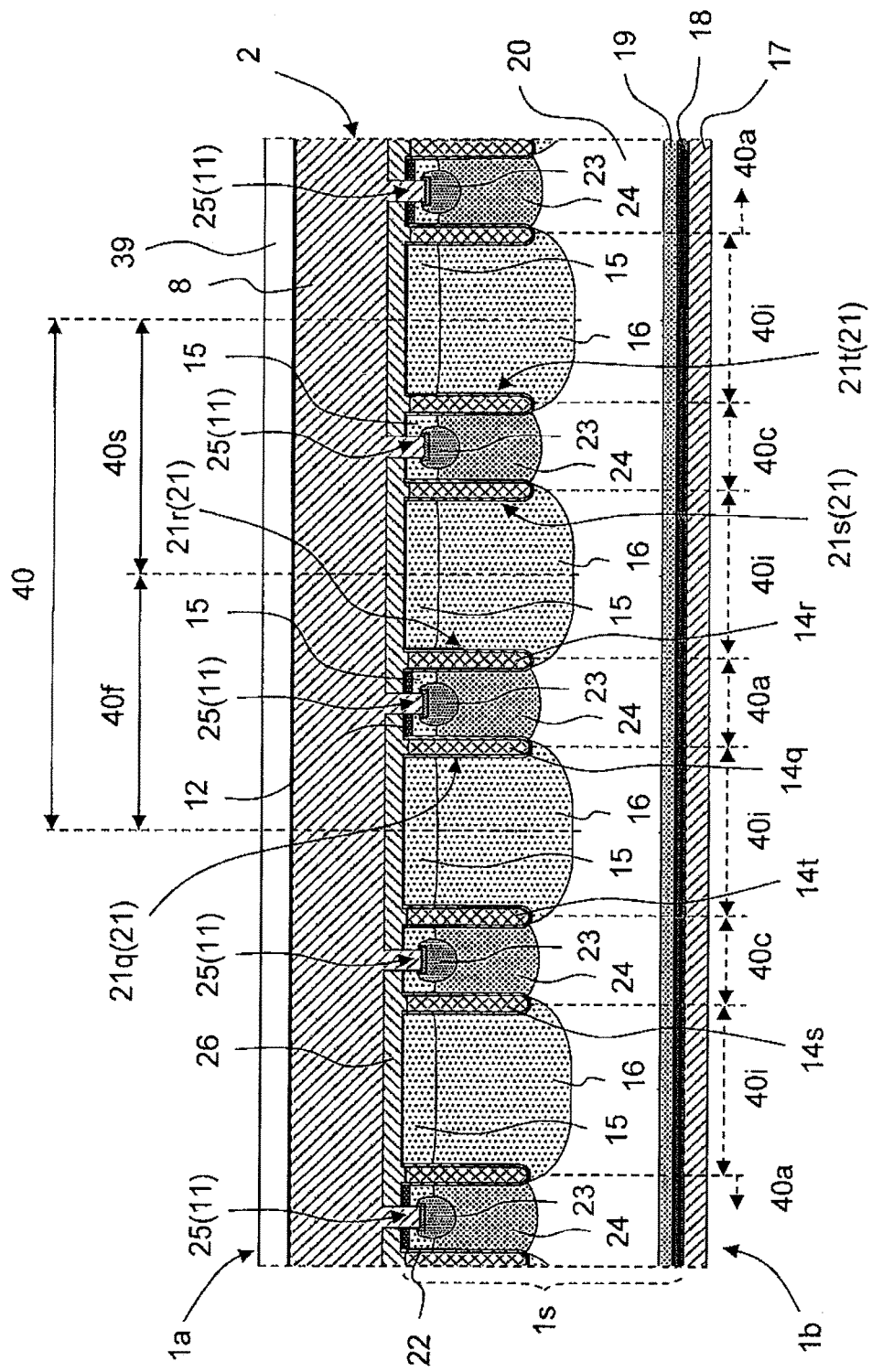
FIG. 28 is a sectional view of the device taken along line A-A' in FIG. 27.
Figure 29:
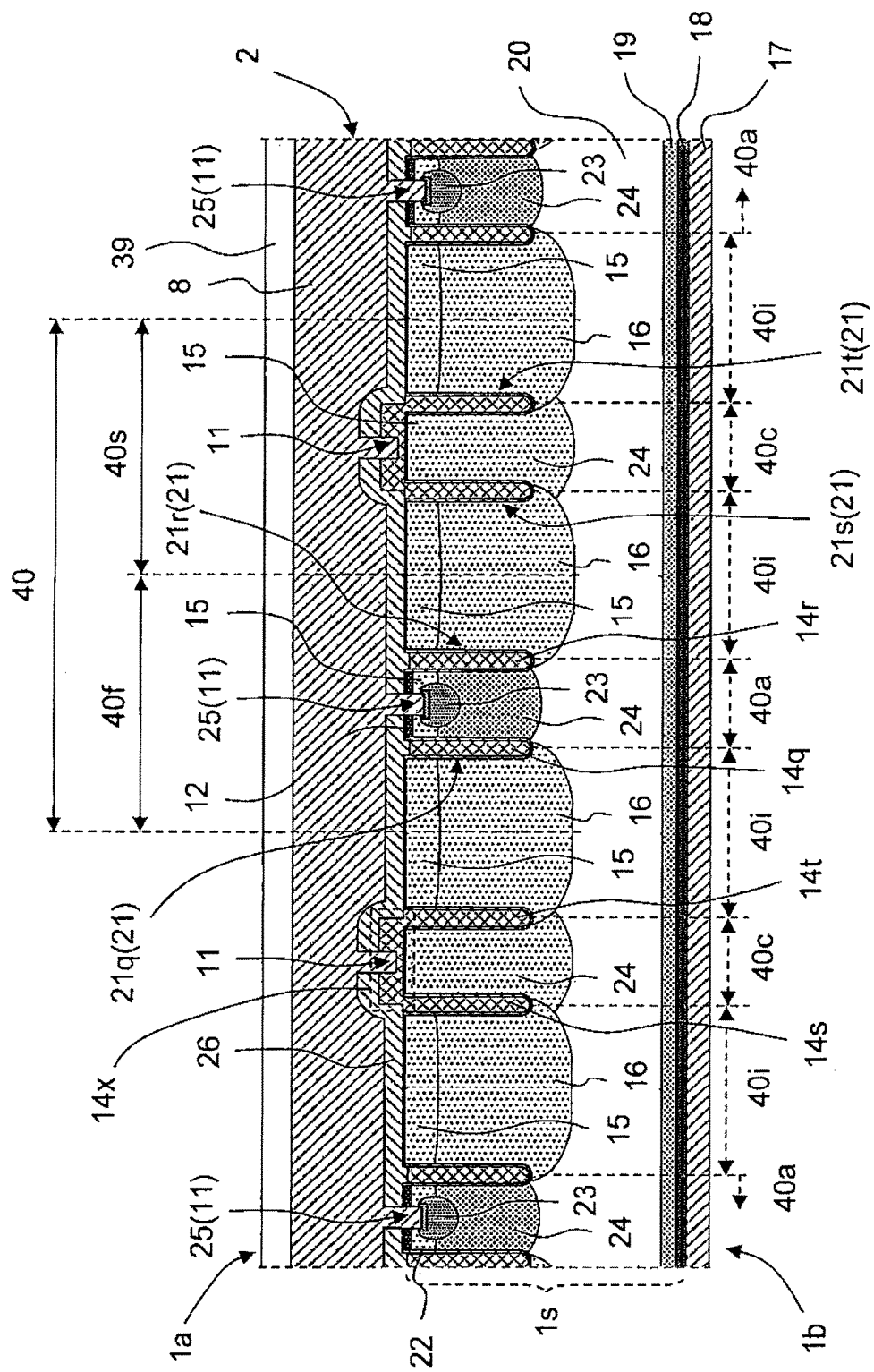
FIG. 29 is a sectional view of the device taken along line C-C' in FIG. 27.

FIG. 27 is an enlarged plan view illustrating the cell area upper-end cut-out area R4 of FIG. 4 corresponding to FIG. 5 for the purpose of description of a modification example concerning the gate electrode connection structure of the IE type trench gate IGBT according to the embodiment of the present invention. FIG. 28 is a sectional view of device taken along line A-A' of FIG. 27. FIG. 29 is a sectional view of device taken along line C-C' of FIG. 27. The modification example concerning the gate electrode connection structure of the IE type trench gate IGBT according to the embodiment of the present invention is described with reference to these drawings.

As shown in FIG. 27, this example is different from FIG. 5 and the metal emitter electrode 8 is not connected in the connection trench gate electrode 14c. In other words, polysilicon layer of the same layer as the third and fourth linear trench gate electrodes 14s and 14t is extended on the semiconductor surface area on the side of the surface 1a of the semiconductor substrate 1s to provide connection gate pulling-out pad 14x (emitter connection part) through the gate oxide layer 22, so that the connection gate pulling-out pad 14x is connected to the metal emitter electrode 8. Consequently, the contact groove 11 of the mutual connection part is contained in the emitter connection part 14x in a plane. Such structure can further improve the reliability of connection.

Further, the connection gate pulling-out pads 14x are periodically disposed at regular intervals in the longitudinal direction of the linear hole collector cell area 40c.

Accordingly, the section taken along line A-A' of FIG. 27 is the quite same as the section of FIG. 6 as shown in FIG. 28. On the other hand, the section taken along line C-C' of FIG. 27 is slightly different from the section of FIG. 8 as shown in FIG. 29. That is, as shown in FIG. 29, the section of FIG. 29 is substantially identical with that of FIG. 6 except the part corresponding to the linear hole collector cell area 40c, although the part corresponding to the linear hole collector cell area 40c is considerably different. In other words, the $P^+$-type body contact area 25 and the $P^+$-type latch-up prevention area 23 are not provided and the contact groove 11 is provided and connected to the connection gate pulling-out pad 14 (emitter connection part), although the contact groove 11 is not connected to the semiconductor substrate in this part. It is a matter of course that there is no $N^+$-type emitter area 12 similarly to FIG. 6.

5. Description of Modification Example concerning Cell Structure of IE type Trench Gate IGBT in the Embodiment of the Invention (FIGS. 30 to 32 mainly):

An example described in this section is a modification example of structure of the linear active cell area 40a and the linear hole collector cell area 40c in the sections 1, 2 and 4. Accordingly, this modification example is not basically different from the contents described so far, containing the fabrication method and accordingly only different part is described below in principle.

Figure 30:
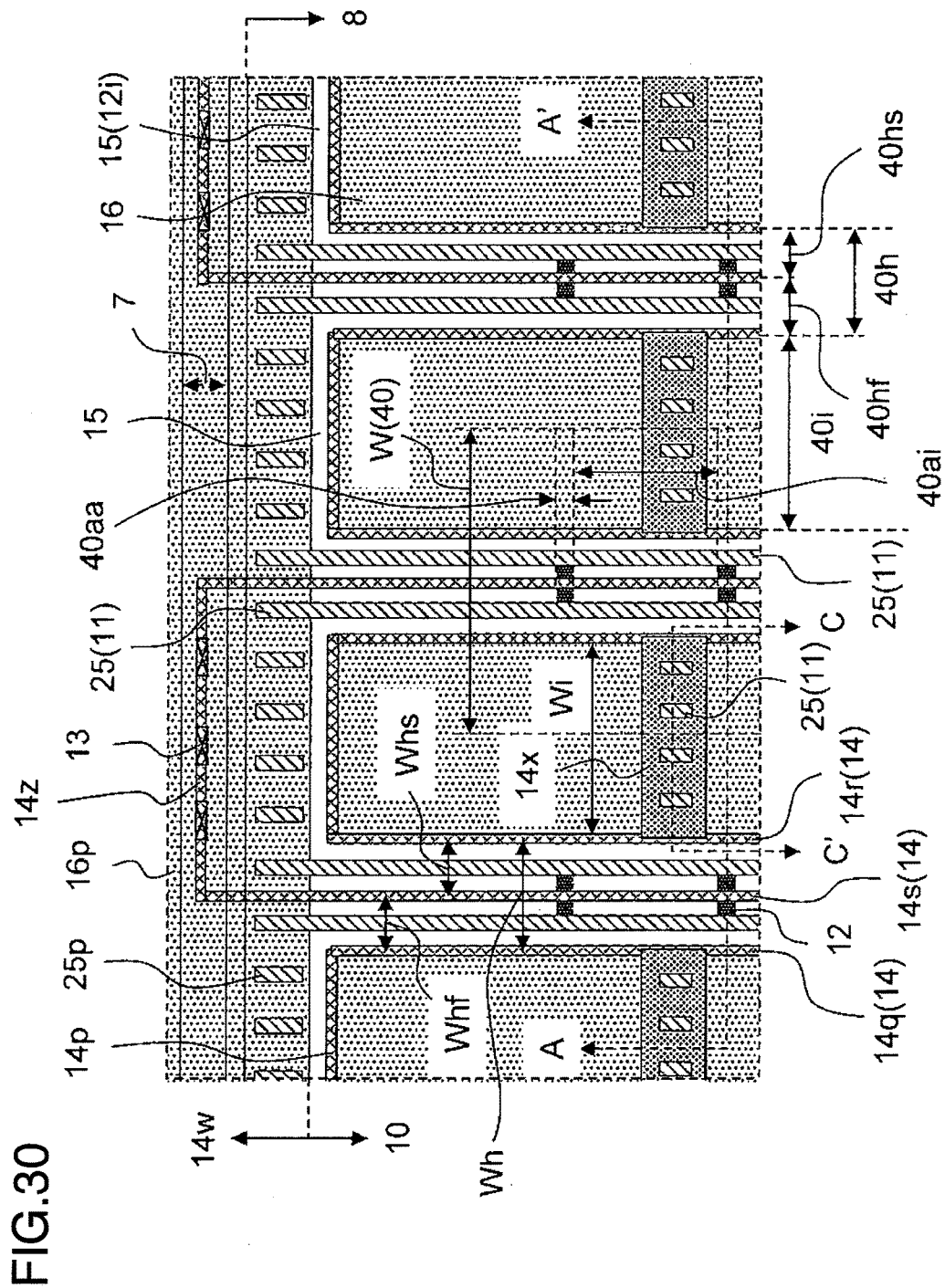
FIG. 30 is an enlarged plan view illustrating the cell area upper-end cut-out area R4 of FIG. 4 for the purpose of description of a modification example concerning a cell structure of the IE type trench gate IGBT according to the embodiment of the present invention.
Figure 31:
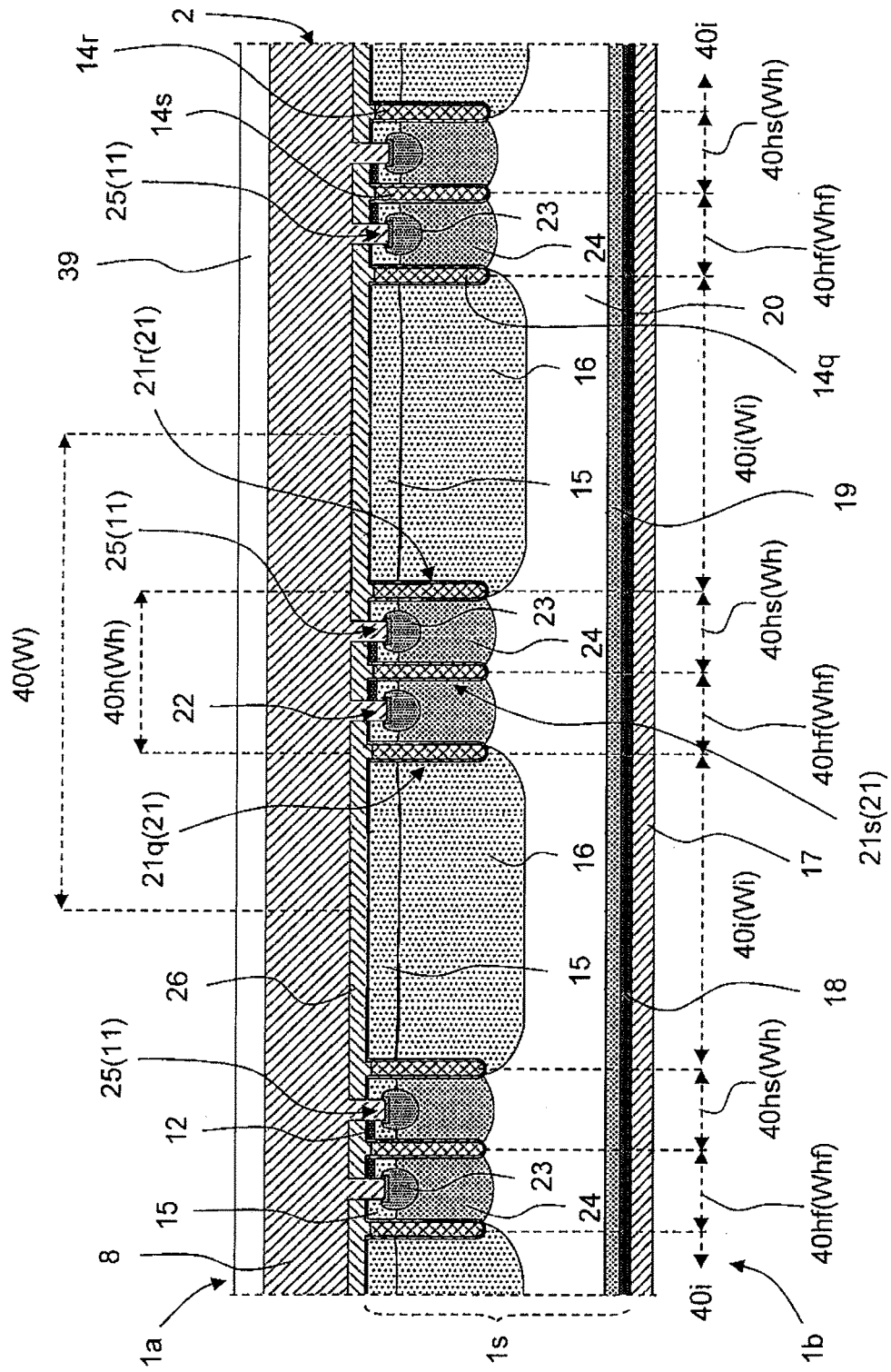
FIG. 31 is a sectional view of the device taken along line A-A' in FIG. 30.
Figure 32:
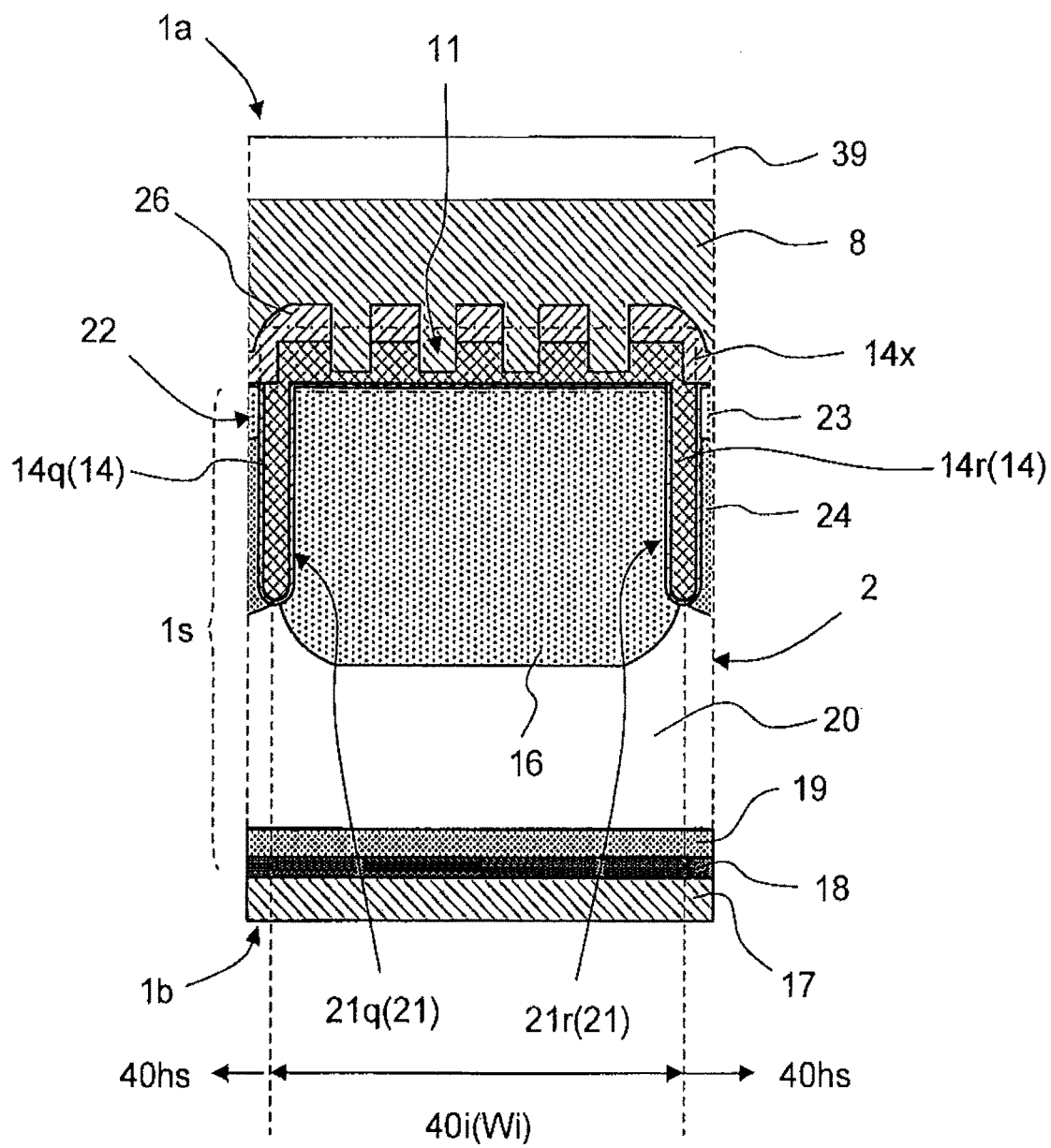
FIG. 32 is a sectional view of the device taken along line C-C' in FIG. 30.

FIG. 30 is an enlarged plan view of the cell area upper-end cut-out area R4 of FIG. 4 for the purpose of description of the modification example concerning the cell structure of the IE type trench gate IGBT in the embodiment of the present invention. FIG. 31 is a sectional view of the device taken along line A-A' of FIG. 30. FIG. 32 is a sectional view of the device taken along line C-C' of FIG. 30. The modification example concerning the cell structure of the IE type trench gate IGBT in the embodiment of the present invention is described with reference to these drawings.

As shown in FIG. 30, the linear unit cell area 40 in this example includes a linear hybrid cell area 40h and the linear inactive cell areas 40i of half width disposed on both sides thereof. In this example, the width Wh of the linear hybrid cell area 40h is narrower than the width Wi (full width) of the linear inactive cell areas 40i.

The linear hybrid cell area 40h includes first and second linear hybrid sub-cell areas 40hf and 40hs which are symmetrical with respect to a plane mutually. The first linear hybrid sub-cell area 40hf is an integrated hybrid cell of a right half cell of the linear active cell area 40a and a left half cell of the linear hole collector cell area 40c of FIG. 27 (or FIG. 5). On the other hand, the second linear hybrid sub-cell area 40hs is an integrated hybrid cell of a left half cell of the linear active cell area 40a and a right half cell of the linear hole collector cell area 40c of FIG. 27 (or FIG. 5). That is, the linear hybrid cell area 40h can be formed by combining the first and second linear hybrid sub-cell areas 40hf and 40hs so that the third linear trench gate electrode 14s connected electrically to the metal gate electrode 5 is disposed in the center. Accordingly, in this example, the width Whf of the first linear hybrid sub-cell area 40hf is substantially identical with the width Whs of the second linear hybrid sub-cell area 40hs.

Further, differently from FIG. 27, the trench gate electrodes 14 to be electrically connected to the metal emitter electrode 8, that is, first and second linear trench gate electrodes 14q and 14r are divided on both sides to dispose the linear inactive cell area 40i therebetween. Accordingly, the mutual connection is realized by providing the connection gate pulling-out pad 14x (emitter connection part) obtained by extending the polysilicon layer of the same layer as the first and second linear trench gate electrodes 14q and 14r on the surface 1a of the semiconductor substrate through the gate insulation layer 22 similarly to FIG. 27 in addition to the end trench gate electrode 14p. Consequently, the contact grooves 11 for electrically connecting the metal emitter electrode 8 to the first and second linear trench gate electrodes 14q and 14r are contained in the emitter connection part 14x in a plane similarly to FIG. 27.

Next, FIG. 31 illustrates a section taken along line A-A' of FIG. 30. As shown in FIG. 31, the primary part of the semiconductor substrate 1s is occupied by $N^-$-type drift area 20 and the N-type field stop area 19, the $P^+$-type collector area 18 and the metal collector electrode 17 are disposed on the back surface 1b of the semiconductor substrate 1s of the semiconductor chip 2 in order of description from the side nearer to the $N^-$-type drift area 20.

On the other hand, the P-type body areas 15 (body areas of second conductive type) are disposed in substantially all surface area of the semiconductor (substantially all surface area of the cell formation area 10) on the side of the main surface 1a of the semiconductor substrate 1s.

The first and second trenches 21q (21) and 21r (21) are disposed in the surface area of the semiconductor on the side of the main surface 1a of the semiconductor substrate 1s in the boundary parts between the linear hybrid cell areas 40h and the linear inactive cell areas 40i and the first and second linear trench gate electrodes 14q and 14r are disposed in the first and second trenches 21q and 21r through the gate insulation layers 22, respectively.

On the other hand, third trenches 21s are disposed in the surface area of the semiconductor on the side of the main surface 1a of the semiconductor substrate 1s in the boundary parts between the first and second linear hybrid sub-cell areas 40hf and 40hs and the third linear trench gate electrodes 14s are disposed in the third trenches 21s through the gate insulation layers 22.

The $N^+$-emitter areas 12 are disposed on the side of only the third linear trench gate electrodes 14s in the surface area of semiconductor on the side of the main surface 1a of the semiconductor substrate 1s in the first and second linear hybrid sub-cell areas 40hf and 40hs and the $P^+$-type body contact areas 25 are disposed in the lower end of the contact grooves 11. The $P^+$-type latch-up prevention areas 23 are disposed under the $P^+$-type body contact areas 25 and the N-type hole barrier areas 24 are disposed under the P-type body areas 15 (body areas of second conductive type) and the $P^+$-type latch-up prevention areas 23.

The P-type floating areas 16 are disposed deeper than the trenches 21 (21q, 21r, 21s and 21t), for example, under the P-type body areas 15 in the surface area of the semiconductor on the side of the main surface 1a of the semiconductor substrate 1s in the linear inactive cell areas 40i.

The inter-layer insulation layers 26 of, for example, silicon oxide insulation layers are formed in substantially all surface area on the side of the main surface 1a of the semiconductor substrate 1s. The metal emitter electrode 8 having aluminum metal layer, for example, as primary constituent element is disposed on the inter-layer insulation layers 26 and is connected to the $N^+$-type emitter areas 12 and the P+-type body contact areas 25 through the contact grooves 11 (or contact holes).

The final passivation layer 39 of, for example, polyimide organic insulation layer is further formed on the metal emitter electrode 8.

Next, FIG. 32 illustrates a section taken along line C-C' of FIG. 30. As shown in FIG. 32, the section is basically the same as the part corresponding to the linear inactive cell area 40i of FIG. 31 but is different in that the connection gate pulling-out pads 14x (emitter connection parts) coupled with the first and second linear trench gate electrodes 14q and 14r through the gate insulation layers 22 are disposed on the main surface 1a of the semiconductor substrate 1s. The connection gate pulling-out pads 14x (emitter connection parts) are connected to the metal emitter electrode 8 through the contact grooves 11 (or contact holes) similarly to FIG. 29. Further, the P-type body area 15 is not disposed on the P-type floating area 16 due to the same reason as the linear hole collector cell areas 40c of FIG. 29.

6. Description of Modification Example concerning Width of Hole Collector Cell of IE type Trench Gate IGBT in the Embodiment of the Invention (FIGS. 33 to 35 mainly):

The example described in this section is a modification example concerning the width Wa of the linear active cell area 40a and the width Wc of the linear hole collector cell area 40c of the example described in the section 2. Accordingly, since other parts are the same as the parts described in the sections 1 to 4, only different part is described below in principle.

Figure 33:
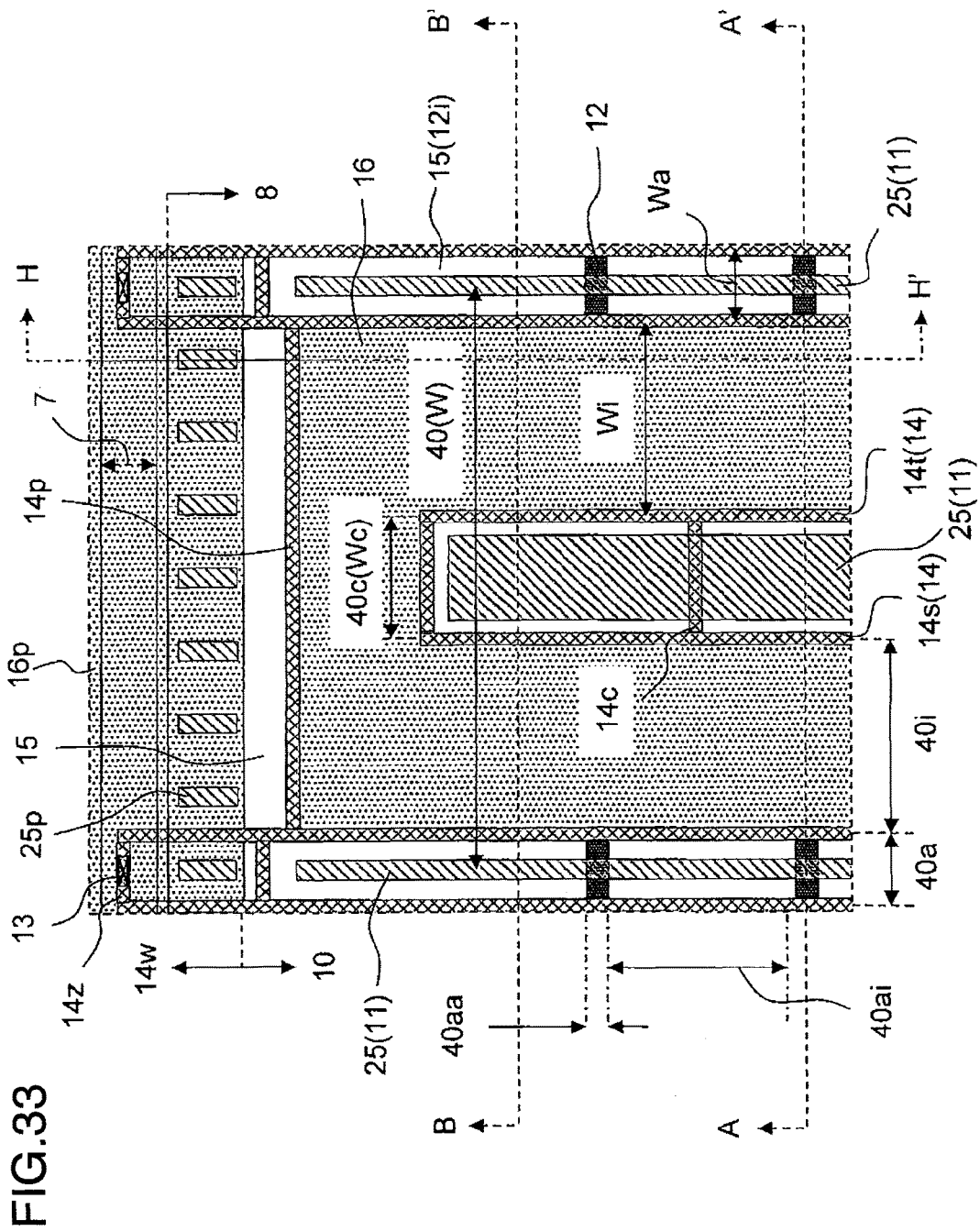
FIG. 33 is an enlarged plan view illustrating a part cut-out area 2 (R3) of FIG. 5 for the purpose of description of a modification example concerning the width of a hole collector cell of the IE type trench gate IGBT according to the embodiment of the present invention.
Figure 34:
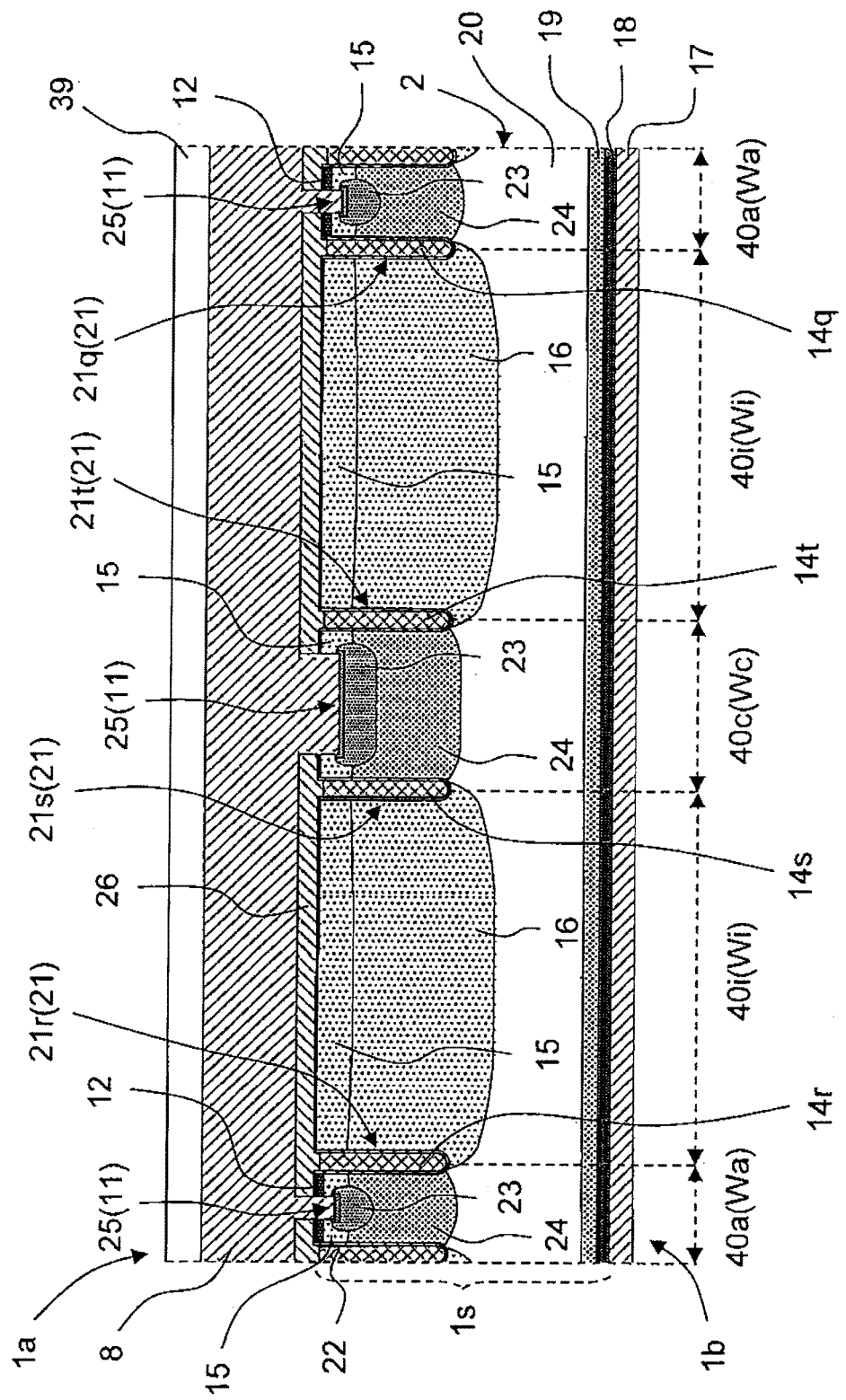
FIG. 34 is a sectional view of the device taken alone line A-A' in FIG. 33.
Figure 35:
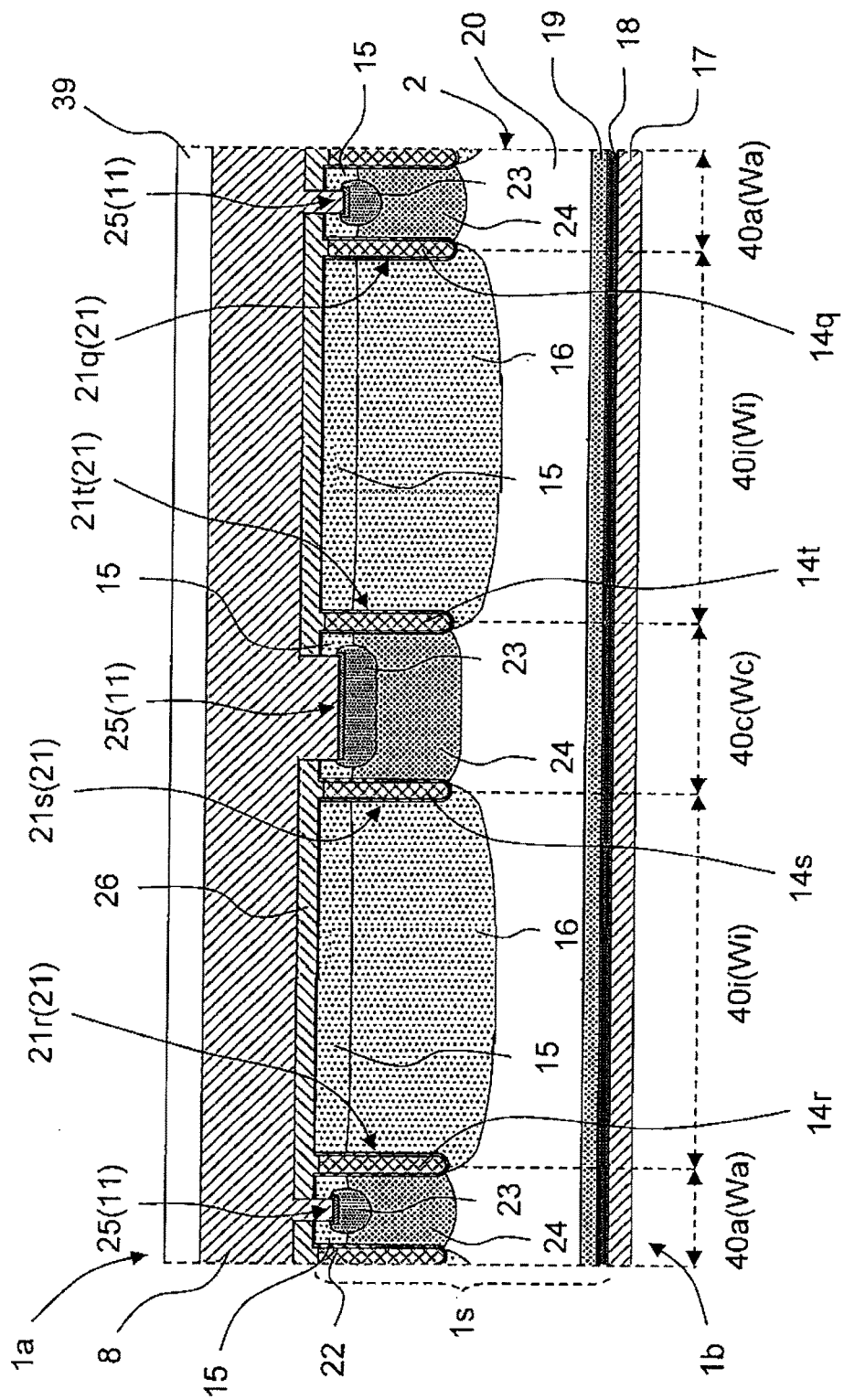
FIG. 35 is a sectional view of the device taken along line B-B' in FIG. 33.

FIG. 33 is an enlarged plan view of a part cut-out area 2 (R3) of FIG. 5 for the purpose of description of the modification example concerning the width of the hole collector cells of IE type trench gate IGBT in the embodiment of the present invention. FIG. 34 is a sectional view of the device taken along line A-A' of FIG. 33. FIG. 35 is a sectional view of the device taken along line B-B' of FIG. 33. The modification example concerning the hole collector cell width of the IE type trench gate IGBT according to the embodiment of the present invention is described with reference to the above drawings.

A part of the modification example corresponding to the part cut-out area 2 (R3) of FIG. 5 is shown in FIG. 33. As shown in FIG. 33, the width Wc of the linear hole collector cell area 40c is wider than the width Wa of the linear active cell area 40a differently from FIG. 5. In other words, the width Wa of the linear active cell area 40a is narrower than the width Wc of the linear hole collector cell area 40c. By doing so, holes are discharged smoothly to improve the switching characteristic.

Next, FIG. 34 illustrates a section taken along line A-A' of FIG. 33. As shown in FIG. 34, the section is the quite same as FIG. 6 except the width Wc of the linear hole collector cell area 40c (width Wi of the linear inactive cell area 40i relative thereto).

Next, FIG. 35 illustrates a section taken along line B-B' of FIG. 33. As shown in FIG. 35, the section is the quite same as FIG. 7 except the width Wc of the linear hole collector cell area 40c (width Wi of the linear inactive cell area 40i relative thereto).

7. Complementary Description of Cell Peripheral Structure in the Embodiment of the Invention (FIG. 36 mainly):

In this section, the section structure of the peripheral area of the cell formation area 10 of FIG. 5 is described in outline.

Figure 36:
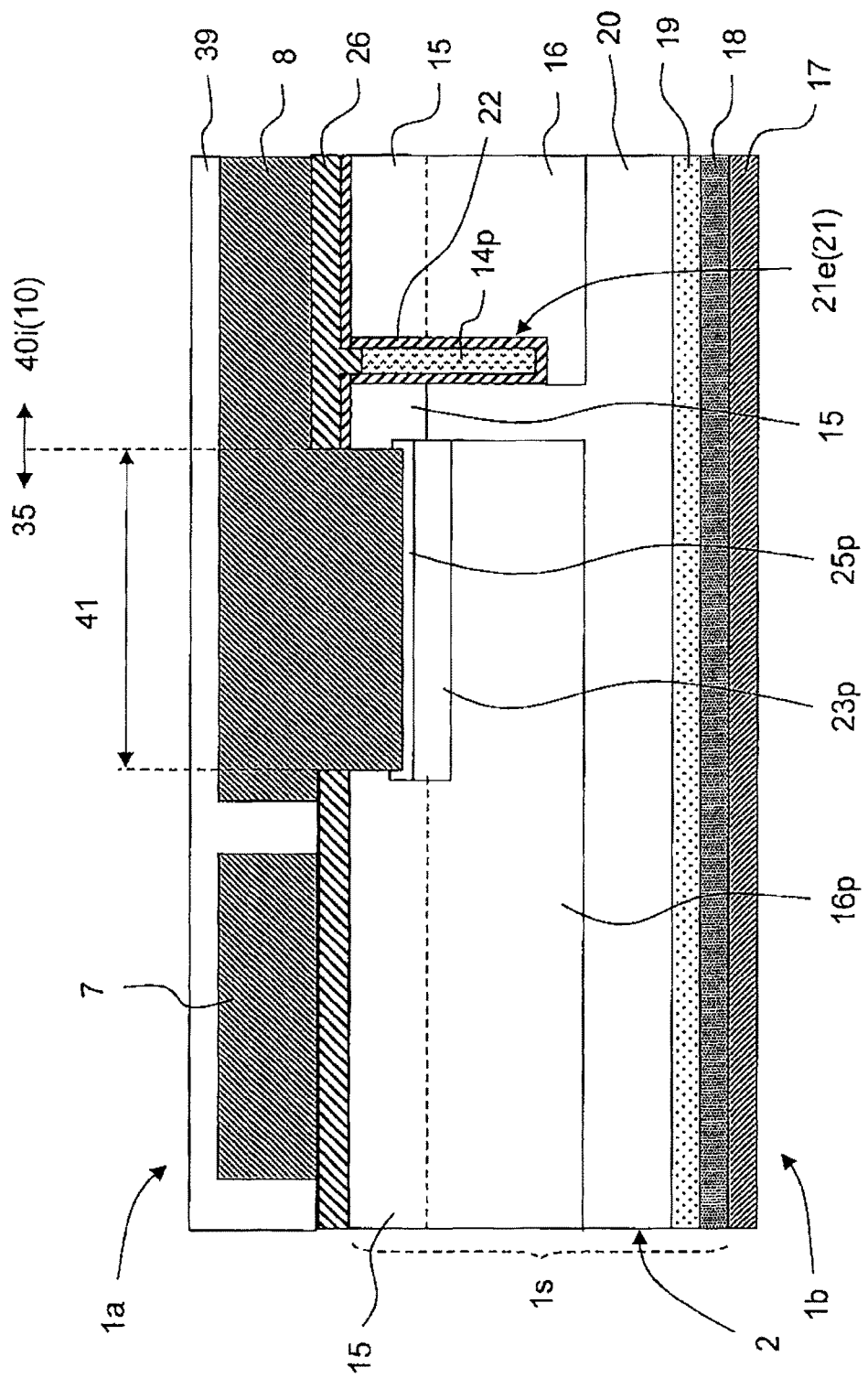
FIG. 36 is a sectional view of the device taken along line H-H' of FIG. 5 for the purpose of supplementary description of a cell peripheral structure according to embodiments of the present invention.

FIG. 36 is a sectional view of the device taken along line H-H' of FIG. 5 for the purpose of complementary description of the cell peripheral structure in the embodiment of the present invention. The complementary description of the cell peripheral structure in the embodiment of the present invention is described with reference to FIG. 36.

Next, the section taken along line H-H' of FIG. 5 is illustrated in FIG. 36 (the same even for FIGS. 27 and 33). As shown in FIG. 36, the P-type body areas 15 are disposed in the main surface 1a of the semiconductor substrate 2 in the linear inactive cell area 40i and the P-type cell peripheral junction area 35. The end trench gate electrode 14p connected to the gate potential is disposed in an end trench 21e near the boundary between the linear inactive cell area 40i and the P-type cell peripheral junction area 35 to form part of an end shock absorbing area. Further, the P-type floating area 16 is disposed under the P-type body area 15 disposed in the lower part of the linear inactive cell area 40i and is disposed deeper than the trench 21 similarly to other parts so as to cover the lower end part of the trench 21 in which the end trench gate electrode 14p is disposed.

Moreover, the contact grooves 11 (or contact holes) and the like are disposed even in the part of the P-type cell peripheral junction area 35 and the peripheral emitter contact part is also disposed therein. The P+-type body contact area 25p and the P+-type latch-up prevention area 23p are disposed in the surface area of the semiconductor substrate 2 on the lower side of the peripheral emitter contact part and the P-type area 16p is disposed under the P+-type body contact area 25p and the P+-type latch-up prevention area 23p similarly to other parts. The P-type area 16p is fabricated simultaneously to the P-type floating area 16, for example, although the P-type area 16p is electrically connected to the emitter potential differently from the P-type floating area 16. That is, the P-type area 16p is separated from the P-type floating area 16 by the end trench 21e and the like in the layout. On the other hand, the P-type area 16p is disposed deeper than the lower end of the trenches 21 (containing the end trench 21e) similarly to the P-type floating area 16. Further, the P-type area 16p is deeper than the P-type body area 15 similarly to the P-type floating area 16.

Since holes are apt to be concentrated in the P-type area (P-type area 16p or P-type body area 15) below the gate wiring 7, the contact part, that is, the peripheral contact part 41 between the metal emitter electrode 8 and the P-type area 16p (concretely connected through the P+-type body contact area 25p) is disposed between the gate wiring 7 and the cell formation area 10 (concretely the linear inactive cell area 40i). This prevents deterioration of latch-up resistance due to the fact that holes are moved to the cell formation area 10 to search for the exclusion route. In this case, it is desirable that another trench is not disposed between the gate wiring 7 and the peripheral contact part 41 in the depth equal to or deeper than the end trench 21e to separate the area disposed under the gate wiring 7 and the peripheral contact part 41 and disposed between the gate wiring 7 and the peripheral contact part 41 into an area near to the gate wiring 7 and an area near to the end trench 21e in a plane. This reason is that such another trench limits the thickness of the P-type area 16p that is a flow path of holes and deteriorates the latch-up resistance. Concretely, as shown in FIG. 36 (similarly to FIGS. 27 and 33), the end connection trench gate electrode 14z is removed at the part facing to the end trench 21e. That is, there is not provided a trench in which the end connection trench gate electrode 14z is disposed.

Further, the end trench 21e itself divides or narrows the P-type area which is the main flow path of holes to the cell formation area and accordingly it is effective to ensure the latch-up resistance.

8. Description of Modification Example of Cell in Longitudinal Direction in the Embodiment of the Invention (FIG. 37 mainly):

The layout of active cell described in this section is a modification example of active cell of FIGS. 3, 5, 27, 30 and 33 or part corresponding thereto.

Figure 37:
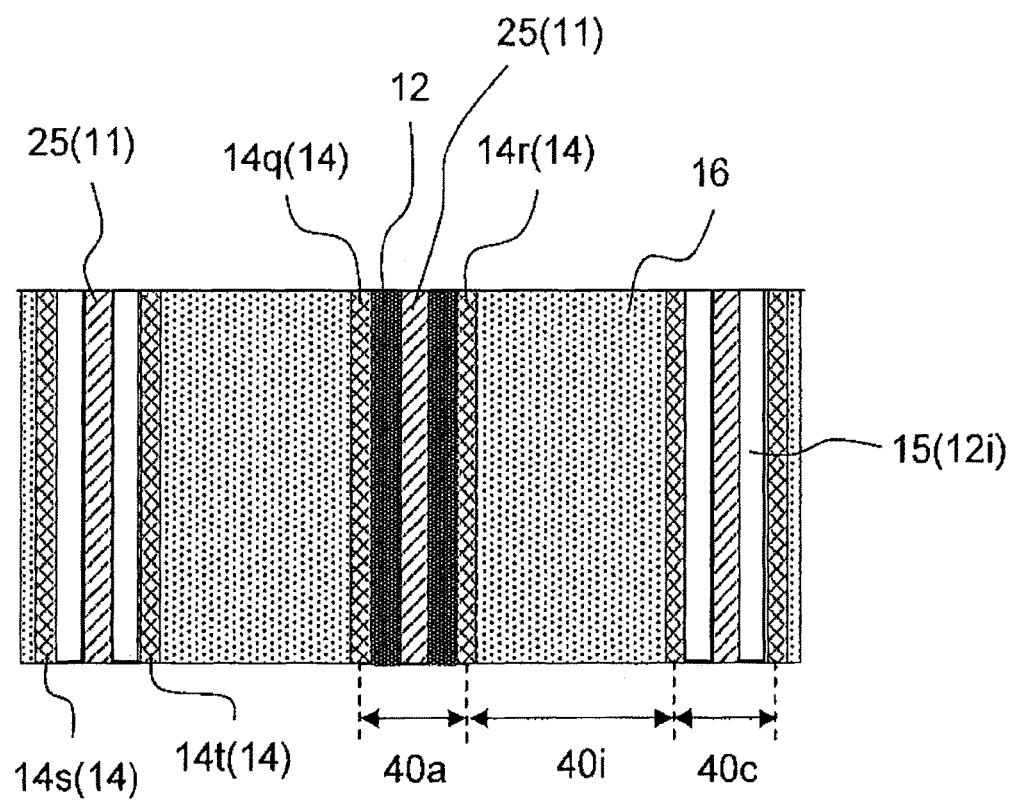
FIG. 37 is an enlarged plan view illustrating a part cut-out area 1 (R2) of FIG. 5 for the purpose of description of a modification example of a cell in the longitudinal direction according to the embodiments of the present invention.

FIG. 37 is an enlarged plan view of the part cut-out area 1 (R2) of FIG. 5 for the purpose of description of the modification example of cell in the longitudinal direction in the embodiment of the present invention. The modification example of cell in the longitudinal direction in the embodiment of the present invention is described with reference to FIG. 37.

Next, the enlarged top view of the cell area inside cut-out area 1 (R2) of FIG. 5 is shown in FIG. 37. As shown in FIG. 37, the cell formation area 10 includes the linear active cell area 40a and the linear inactive cell area 40i arranged alternately in the horizontal direction. The trench gate electrode 14 is disposed between the linear active cell area 40a and the linear inactive cell area 40i and the linear contact groove 11 (or contact hole) is disposed in the center of the linear active cell area 40a. The linear $N^+$-type emitter areas 12 are disposed in the linear active cell areas 40a on both sides of the contact groove 11. On the other hand, the P-type body areas 15 and the P-type floating areas 16 are disposed in substantially all surface area of the linear inactive cell area 40i vertically.

Figure 38:
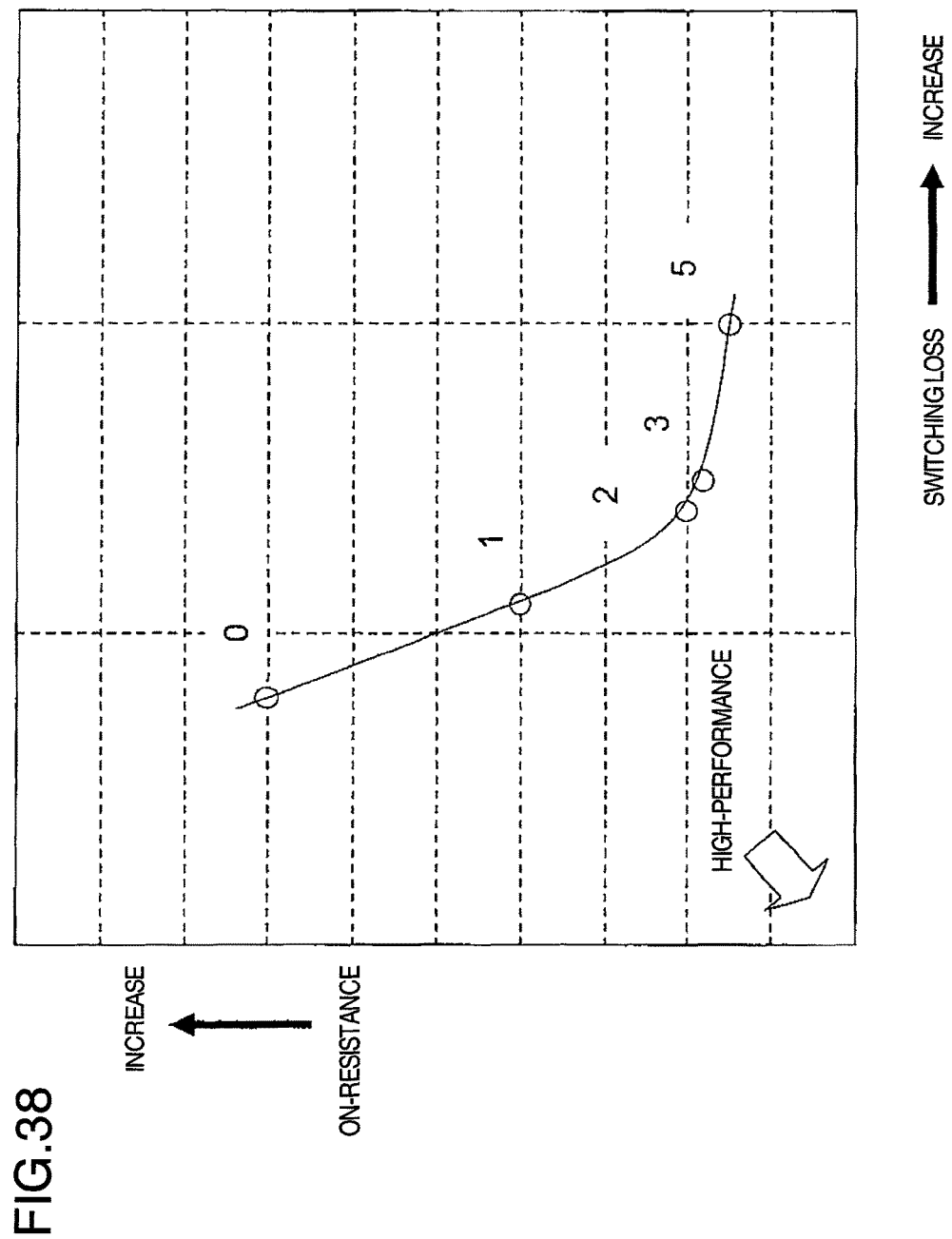
FIG. 38 is a data plotting diagram showing the relation of an active thinning-out ratio, an on-resistance and a switching loss in the IE type trench gate IGBT.

9. Consideration concerning the Whole of the Invention and Complementary Description concerning Embodiment (FIG. 38 mainly):

FIG. 38 is a data plotting diagram showing the relation of an active thinning-out ratio (numerical values displayed near each plot), an on-resistance and a switching loss in the IE type trench gate IGBT. Consideration concerning the whole of the present invention and complementary description concerning the embodiment are described with reference to FIG. 38.

(1) Complementary Description concerning Active Cell Thinning-out Ratio in Examples of Sections 2 and 4 (Refer to FIG. 5 and the like):

In the present invention, the active cell thinning-out ratio is defined as the width of various cell areas which do not form the hole outflow route (hole non-outflow cell parts) divided by the width of various cell areas forming the hole outflow route (hole outflow cell parts) in the primary part of the cell formation area 10. Accordingly, in the example of FIG. 5, the hole outflow cell parts are the linear active cell areas 40a and the linear hole collector cell areas 40c and the hole non-outflow cell parts are the linear inactive cell areas 40i. The width Wa of the linear active cell areas 40a is equal to the width We of the linear hole collector cell areas 40c and accordingly the active cell thinning-out ratio is given by Wi/Wa (active cell thinning-out ratio=Wi/Wa).

FIG. 38 shows change of the on-resistance and the switching loss (switching characteristic) at the time that the active cell thinning-out ratio is changed from 0 to 5 in the device structure (comparison example) in which the linear hole collector cell areas 40c in the example of the section 2 are all set to the linear active cell areas 40a. In the comparison example, all the trench gate electrodes are electrically connected to the metal gate electrode differently from the embodiment (containing various modification examples). As understood from FIG. 38, satisfactory characteristic can be obtained in the range that the active cell thinning-out ratio is 1.5 to 4 (more preferably 2 to 3). That is, in the range that the active cell thinning-out ratio is lower than about 1, the IE effect is weak and accordingly the on-resistance is increased. On the other hand, in the range that the active cell thinning-out ratio is higher than about 5, the IE effect is too strong and the switching loss is increased rapidly although the on-resistance is not changed much.

Accordingly, it is considered that the preferable range of the active cell thinning-out ratio is from 1.5 to 4 (more preferably 2 to 3). Hereinafter, this range is named "standard preferable range (standard most preferable range)". However, in this device structure, when shrinking is further continued, the gate capacitance is suddenly increased to deteriorate the switching characteristic.

Accordingly, in the example of the section 2 (example of the section 4 is also the same), first, the linear active cell areas 40a in the comparison example are replaced, for example, alternately by the linear hole collector cell areas 40c, that is, pseudo linear active cell areas in which the $N^+$-type emitter areas 12 (source of FET) are removed so that FET part is not operated as FET. Moreover, in the example of the section 2 (example of the section 4 is also the same), second, the trench gate electrodes on both sides of the linear hole collector cell area 40c are electrically connected to the metal emitter electrode, so that the gate capacitance is avoided from being increased and the active cell thinning-out ratio is maintained to be within the preferable range so that the IE effect can be exhibited sufficiently and the device can be made small. This reason is that the linear hole collector cell area 40c operates as the hole outflow path when IGBT is off but does not contribute to increase of the gate capacitance.

In the example of FIG. 5, the primary dimensions of the concrete cell are exemplified as follows. That is, the width of trench is about 0.7 micrometers, the width Wa of linear active cell area (width We of linear hole collector cell area) about 1.3 micrometers and the width Wi of linear inactive cell area about 3.3 micrometers, for example.

(2) Complementary Description concerning Active Cell Thinning-out Ratio in Example of Section 5 (refer to FIG. 30 and the like):

Similarly, in the example of FIG. 30, the hole outflow cell parts are the linear hybrid cell areas 40h and the hole non-outflow cell parts are the linear inactive cell areas 40i. Accordingly, the active cell thinning-out ratio is given by Wi/Wh (active cell thinning-out ratio=Wi/Wh).

In this example (FIG. 30 and the like), in order to further reduce the trench gate electrode connected electrically to the metal gate electrode and improve the switching characteristic while maintaining the active cell thinning-out ratio within the standard preferable range (standard most preferable range), the linear active cell areas 40a of FIG. 5 are combined with the linear hole collector cell areas 40c to form the linear hybrid cell areas 40h. In the linear hybrid cell areas 40h, one of three trench gate electrodes disposed in the center is connected to the gate and accordingly the gate capacitance is made smaller than that shown in the example of FIG. 5. Further, two other electrodes disposed on both sides are connected to the emitter.

In the example of FIG. 30, the primary dimensions of the concrete cell are exemplified as follows. That is, the width of trench is about 0.7 micrometers, the width Wh of linear hybrid cell area about 2.6 micrometers and the width Wi of linear inactive cell area about 6.5 micrometers, for example.

(3) Complementary Description concerning Active Cell Thinning-out Ratio in Example of Section 6 (refer to FIG. 33 and the like)

In the example of FIG. 33, the hole outflow cell parts are the linear active cell areas 40a and the linear hole collector cell areas 40c and the hole non-outflow cell parts are the linear inactive cell areas 40i. The width Wa of the linear active cell areas 40a is different from the width Wc of the linear hole collector cell areas 40c and accordingly the active cell thinning-out ratio is given by 2 Wi/(Wa+Wc) (active cell thinning-out ratio=2 Wi/(Wa+Wc)).

In the structure of FIG. 5, when the active cell thinning-out ratio is set to, for example, 5 within the standard preferable range (standard most preferable range) to further reduce the gate capacitance, it is anticipated from FIG. 38 that the switching loss is deteriorated rapidly.

In the example of FIG. 33 and the like, the width Wc of the linear hole collector cell areas 40c is made wider than the width Wa of the linear active cell areas 40a (here about 1.5 to 2 times, for example) to thereby suppress the excessive IE effect.

In the example of FIG. 33, the primary dimensions of the concrete cell are exemplified as follows. That is, the width of trench is about 0.7 micrometers, the width Wa of linear active cell area about 1.3 micrometers, the width Wc of linear inactive cell area about 2.2 micrometers and the width Wi of linear inactive cell area about 8.8 micrometers, for example.

10. Summary

The present invention made by the Inventor has been described concretely as above but the present invention is not limited thereto and it is needless to say that various modifications and changes can be made without departing from the sprit and the scope of claims of the present invention.

For example, in the embodiment, the example in which doped polysilicon and the like are used as gate polysilicon material has been described concretely, although the present invention is not limited thereto and non-doped polysilicon layer may be applied to dope necessary impurity by ion implantation after formation of layer.

Moreover, in the embodiment, the example in which non-epitaxial wafer is used to form the high-concentration impurity layer from the back side after back grinding has been described, although it is needless to say that the present invention is not limited thereto and can be applied even to a device to be fabricated using an epitaxial wafer.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A semiconductor device comprising:
   (a) a semiconductor substrate having first and second main surfaces;
   (b) a drift area disposed in the semiconductor substrate and having a first conductive type;
   (c) first and second cells arranged in a first direction on the first main surface, and extending along a second direction which is perpendicular to the first direction;
   (d) a metal gate electrode disposed over the first main surface; and
   (e) a metal emitter electrode disposed over the first main surface;
   the first cell including:
     first and second gate electrodes disposed in first and second trenches in the first main surface, respectively, and connected electrically to the metal gate electrode,
     wherein the first and second gate electrodes are arranged in the first direction and extend along the second direction;
     a first semiconductor region disposed between the first and second trenches over the drift area and having a second conductive type opposite to the first conductive type;
     second semiconductor regions having the second conductive type disposed at both sides of the first and second gate electrodes; and
     a third semiconductor region having the first conductive type disposed on the first semiconductor region;
   the second cell including:
     third and fourth gate electrodes disposed in third and fourth trenches in the first main surface, respectively, and connected electrically to the metal emitter electrode,
     wherein the third and fourth gate electrodes are arranged in the first direction and extend along the second direction;
     a fourth semiconductor region disposed between the third and fourth trenches over the drift area and having the second conductive type; and
     fifth semiconductor regions having the second conductive type disposed at both sides of the third and fourth gate electrodes;
   wherein a depth of the second semiconductor region adjacent to the first trench is deeper than a lower end of the first trench.

2. The semiconductor device according to claim 1, wherein a width between the first and second trenches is narrower than a width of the second and third trenches.

3. The semiconductor device according to claim 1, wherein the third semiconductor region is not disposed between the third and fourth trenches.

4. The semiconductor device according to claim 1, further comprising:
   an insulating film disposed between the fourth semiconductor region and the metal emitter electrode,
   wherein the fourth semiconductor region contacts the insulating film.

5. The semiconductor device according to claim 1, wherein a width between the first and second trenches is substantially equal to a width between the third and fourth trenches.

6. The semiconductor device according to claim 1, further comprising:
   a sixth semiconductor region having the first conductive type disposed between the first and second trenches and on the first semiconductor region,
   wherein the sixth semiconductor region is apart from the third semiconductor region in the second direction.

7. The semiconductor device according to claim 1, further comprising:
   first connection parts extending along the first direction and connecting the third gate electrodes to the fourth gate electrodes,
   wherein the first connection parts are connected to the metal emitter electrode.

* * * * *